United States Patent
Yu et al.

(10) Patent No.: US 12,501,671 B2
(45) Date of Patent: Dec. 16, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Li-Zhen Yu, New Taipei (TW); Lin-Yu Huang, Hsinchu (TW); Huan-Chieh Su, Changhua County (TW); Lo-Heng Chang, Hsinchu (TW); Meng-Huan Jao, Taichung (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 666 days.

(21) Appl. No.: 17/853,808

(22) Filed: Jun. 29, 2022

(65) Prior Publication Data
US 2024/0006482 A1    Jan. 4, 2024

(51) Int. Cl.
*H10D 30/01*    (2025.01)
*H01L 23/522*    (2006.01)
(Continued)

(52) U.S. Cl.
CPC ....... *H10D 62/121* (2025.01); *H01L 23/5226* (2013.01); *H01L 23/5283* (2013.01);
(Continued)

(58) Field of Classification Search
CPC ......... H01L 21/76898; H01L 21/76808; H01L 21/76897; H01L 23/5226; H01L 23/5283; H01L 2221/1031; H10D 62/121; H10D 62/115; H10D 62/822; H10D 62/116; H10D 62/151; H10D 62/364; H10D 30/014; H10D 30/043; H10D 30/6713; H10D 30/6735; H10D 30/6757; H10D 30/0198; H10D 30/797; H10D 30/0212–0213; H10D 30/794; H10D 84/0128; H10D 84/013; H10D 84/038; H10D 84/0149;
(Continued)

(56) References Cited

U.S. PATENT DOCUMENTS 9,209,247 B2    12/2015    Colinge et al.
9,236,267 B2    1/2016    De et al.
(Continued)

*Primary Examiner* — Steven B Gauthier
*Assistant Examiner* — Adam D Weiland
(74) *Attorney, Agent, or Firm* — Maschoff Brennan

(57) ABSTRACT

A device includes a channel layer, a gate structure, a first source/drain epitaxial structure, a second source/drain epitaxial structure, a front-side interconnection structure, and a backside via. The gate structure is across the channel layer. The first source/drain epitaxial structure and the second source/drain epitaxial structure are on opposite sides of the gate structure and are connected to the channel layer. The front-side interconnection structure is on a front-side of the first source/drain epitaxial structure. The backside via is connected to a backside of the first source/drain epitaxial structure. A backside surface of the first source/drain epitaxial structure is at a height between a height of a backside surface of the backside via and a height of a backside surface of the gate structure.

20 Claims, 45 Drawing Sheets

(51) Int. Cl.
*H01L 23/528* (2006.01)
*H10D 30/43* (2025.01)
*H10D 30/67* (2025.01)
*H10D 62/10* (2025.01)
*H10D 84/01* (2025.01)
*H10D 84/03* (2025.01)

(52) U.S. Cl.
CPC ........... *H10D 30/014* (2025.01); *H10D 30/43* (2025.01); *H10D 30/6713* (2025.01); *H10D 30/6735* (2025.01); *H10D 30/6757* (2025.01); *H10D 62/115* (2025.01); *H10D 84/0128* (2025.01); *H10D 84/013* (2025.01); *H10D 84/038* (2025.01)

(58) Field of Classification Search
CPC .. H10D 84/83; H10D 84/0137; H10D 84/017; H10D 84/0174; H10D 84/0186; H10D 64/017; H10D 64/251; H10D 64/663; H10D 64/668; H10D 64/669; B82Y 10/00
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2006/0166434 A1* | 7/2006 | Kinoshita | H01L 23/5286 257/773 |
| 2009/0134497 A1* | 5/2009 | Barth | H01L 23/481 257/E21.477 |
| 2013/0105968 A1* | 5/2013 | Lu | H01L 24/05 257/737 |
| 2016/0379936 A1* | 12/2016 | Spitzlsperger | H01L 23/562 257/139 |
| 2017/0062392 A1* | 3/2017 | Cheng | H01L 23/5386 |
| 2020/0006128 A1* | 1/2020 | Weng | H01L 21/76807 |
| 2021/0375722 A1* | 12/2021 | Kim | H10D 84/038 |
| 2022/0139911 A1* | 5/2022 | Wei | H01L 23/5226 257/365 |
| 2023/0369221 A1* | 11/2023 | Engel | H01L 23/481 |
| 2023/0411289 A1* | 12/2023 | Xie | H01L 21/76897 |

* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
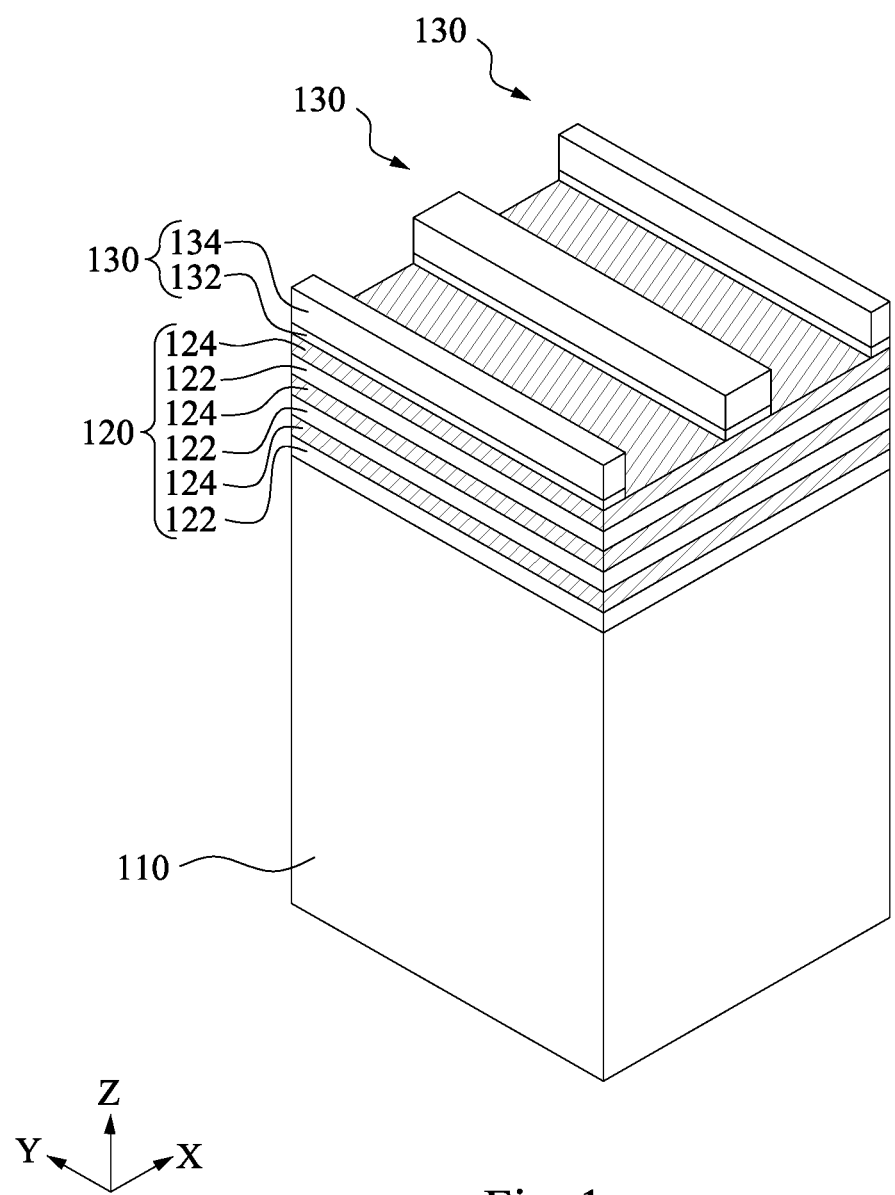
FIGS. 1-18C illustrate a method for manufacturing a semiconductor device (or an integrated circuit structure) at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices (or integrated circuit structures) and methods of forming the same. More particularly, some embodiments of the present disclosure are related to semiconductor devices including a deep source/drain epitaxial structure for improving short problem between backside source/drain via and a gate structure. Still some embodiments of the present disclosure are related to semiconductor devices having a selective-growth dielectric layer at a backside of the semiconductor device for creating large time-dependent dielectric breakdown (TDDB) window between the gate structure and a backside interconnection structure.

FIGS. 1-18C illustrate a method for manufacturing a semiconductor device (or an integrated circuit structure) at various stages in accordance with some embodiments of the present disclosure. In addition to the integrated circuit structure, FIGS. 1-12A, 13A, 14A, 15A, 16A, 17A, and 18A depict X-axis, Y-axis, and Z-axis directions. In some embodiments, the semiconductor device shown in FIGS. 1-18C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 1-12A, 13A, 14A, 15A, 16A, 17A, and 18A are perspective views of some embodiments of the semiconductor device at intermediate stages during fabrication. FIGS. 12B, 13B, 14B, 15B, 16B, 17B, and 18B are cross-sectional view of some embodiments of the semiconductor device during fabrication along a first cut (e.g., cut I-I), which is in the source/drain regions and along a lengthwise direction of channels. FIG. 18C is a cross-sectional view of some embodiments of the semiconductor device during fabrication along a second cut (e.g., cut II-II), which is along a lengthwise direction of gates.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A semiconductor stack 120 is formed on the substrate 110 through epitaxy, such that the semiconductor stack 120 forms crystalline layers. The semiconductor stack 120 includes semiconductor layers 122 and 124 stacked alternatively. There may be two, three, four, or more of the semiconductor layers 122 and 124. The semiconductor layers 122 can be SiGe layers. The semiconductor layers 124 may be pure silicon layers that are free from germanium. The semiconductor layers 124 may also be substantially pure silicon layers, for example, with a germanium percentage lower than about 1 percent. Furthermore, the semiconductor layers 124 may be intrinsic, which are not doped with p-type and n-type impurities. In some other embodiments, however, the semiconductor layers 124 can be silicon germanium or germanium for p-type semiconductor device, or can be III-V materials, such as InAs, InGaAs, InGaAsSb, GaAs, InPSb, or other suitable materials.

The semiconductor layers 124 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the semiconductor layers 124 to define a channel or channels of the semiconductor device is further discussed below.

As described above, the semiconductor layers 124 may serve as channel region(s) for a subsequently-formed semiconductor device and the thickness is chosen based on device performance considerations. The semiconductor layers 122 in channel regions(s) may eventually be removed and serve to define a vertical distance between adjacent channel region(s) for a subsequently-formed multi-gate device and the thickness is chosen based on device performance considerations. Accordingly, the semiconductor layers 122 may also be referred to as sacrificial layers, and semiconductor layers 124 may also be referred to as channel layers.

Patterned hard masks 130 are formed over the semiconductor stack 120. The patterned hard masks 120 cover portions of the semiconductor stack 120 while leave another portions of the semiconductor stack 120 uncovered. In some embodiments, each of the patterned hard masks 130 includes an oxide layer 132 (e.g., a pad oxide layer that may include $SiO_2$) and a nitride layer 134 (e.g., a pad nitride layer that may include $Si_3N_4$) formed over the oxide layer 132. The oxide layer 132 may act as an adhesion layer between the semiconductor stack 120 and the nitride layer 134 and may act as an etch stop layer for etching the nitride layer 134. In some examples, the oxide layer 132 includes thermally grown oxide, chemical vapor deposition (CVD)-deposited oxide, and/or atomic layer deposition (ALD)-deposited oxide. In some embodiments, the nitride layer 134 is deposited on the oxide layer 132 by CVD and/or other suitable techniques.

Figure 2:
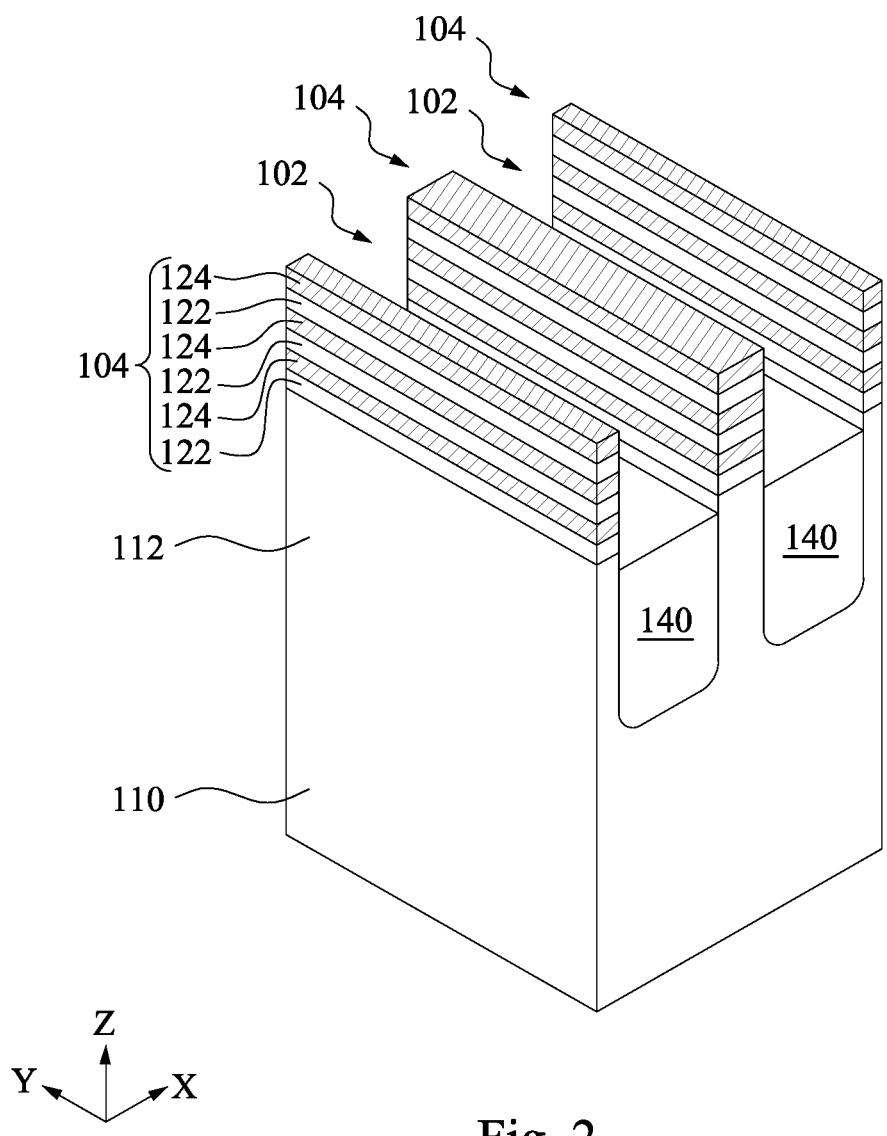

Reference is made to FIG. 2. The semiconductor stack 120 and the substrate 110 of FIG. 1 are patterned using the patterned hard masks 130 as etching masks to form trenches 102. Accordingly, a plurality of fin structures (or semiconductor strips) 104 are formed. The trenches 102 extend into the substrate 110 and have lengthwise directions substantially parallel to each other. The trenches 102 form base portions 112 in the substrate 110, where the base portions 112 protrude from the substrate 110, and the fin structures 104 are respectively formed above the base portions 112 of the substrate 110. The remaining portions of the semiconductor stack 120 are accordingly referred to as the fin structures 104 alternatively.

Isolation structures 140, which may be shallow trench isolation (STI) regions, are formed in the trenches 102. The formation may include filling the trenches 102 with a dielectric layer(s), for example, using flowable chemical vapor deposition (FCVD), and performing a chemical mechanical polish (CMP) to level the top surface of the dielectric material with the top surface of the topmost semiconductor layer 124. The isolation structures 140 are then recessed. The top surface of the resulting isolation structures 140 may be level with or slightly lower than the top surface of the base portions 112 of the substrate 110. The isolation structures 140 may be a dielectric material, such as silicon oxide, silicon nitride, silicon oxynitride, SiCN, $SiC_xO_yN_z$, or combinations thereof.

Figure 3:
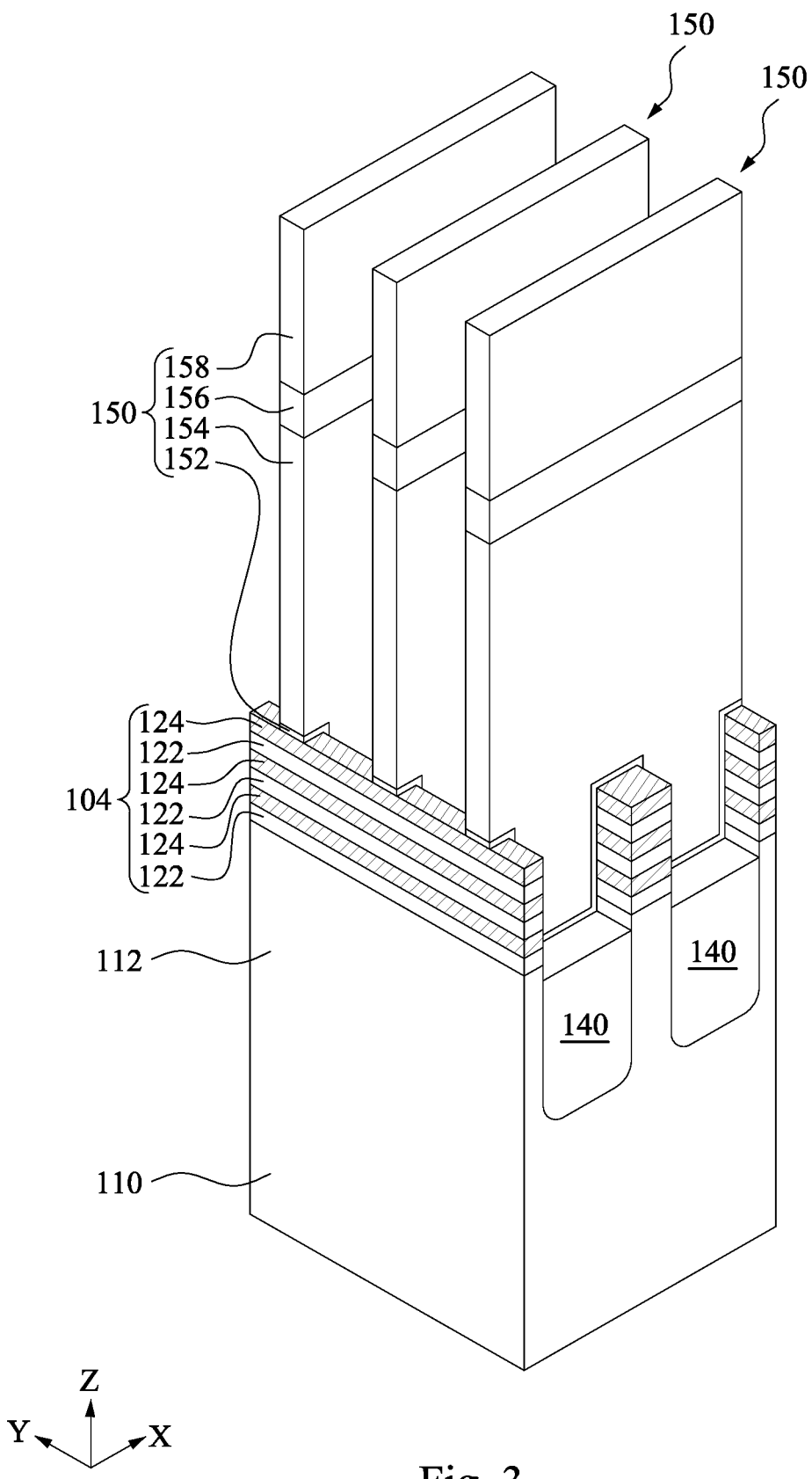

Reference is made to FIG. 3. Dummy gate structures 150 are formed over the substrate 110 and are at least partially disposed over the fin structures 104. The portions of the fin structures 104 underlying the dummy gate structures 150 may be referred to as the channel region. The dummy gate structures 150 may also define source/drain (S/D) regions of the fin structures 104, for example, the regions of the fin structures 104 adjacent and on opposing sides of the channel regions.

Dummy gate formation operation first forms a dummy gate dielectric layer 152 over the fin structures 104. Subsequently, a dummy gate electrode layer 154 and a hard mask which may include multiple layers 156 and 158 (e.g., a nitride layer 156 and an oxide layer 158) are formed over the dummy gate dielectric layer 152. The hard mask is then patterned, followed by patterning the dummy gate electrode layer 152 by using the patterned hard mask as an etch mask. In some embodiments, after patterning the dummy gate electrode layer 154, the dummy gate dielectric layer 152 is removed from the S/D regions of the fins 104. The etch process may include a wet etch, a dry etch, and/or a combination thereof. The etch process is chosen to selectively etch the dummy gate dielectric layer 152 without substantially etching the fin structures 104, the dummy gate electrode layer 154, the nitride mask layer 156 and the oxide mask layer 158.

Figure 4:
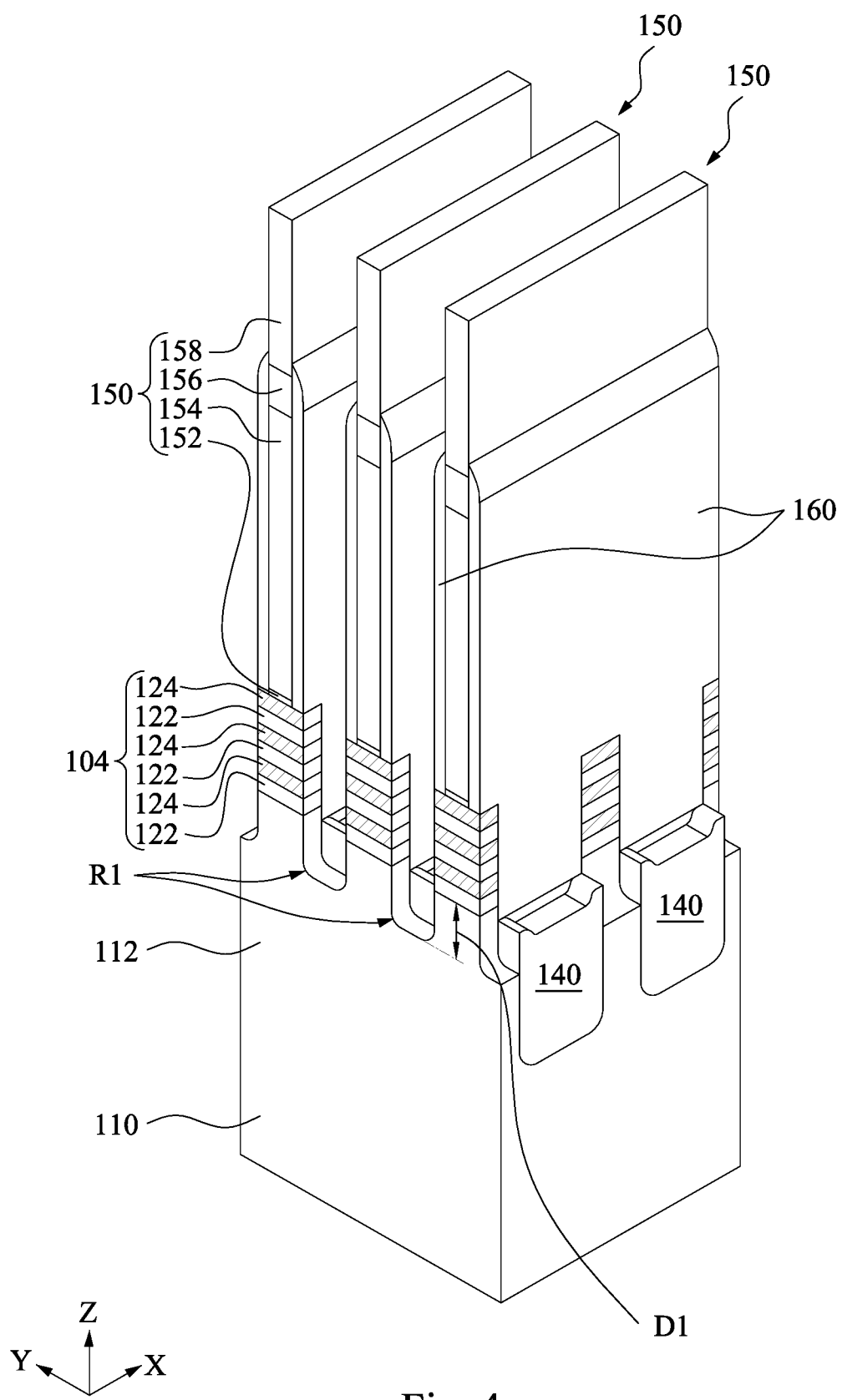

Reference is made to FIG. 4. After formation of the dummy gate structures 150 is completed, spacer structures 160 are formed on sidewalls of the dummy gate structures 150 to surround the dummy gate structures 150. In some embodiments of the gate spacer formation operations, a spacer material layer is deposited on the substrate 110. The spacer material layer may be a conformal layer that is subsequently etched back to form the spacer structures 160. In some embodiments, the spacer material layer includes multiple layers, such as a first spacer layer and a second spacer layer formed over the first spacer layer. The first and second spacer layers each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers may be formed by depositing in sequence two different dielectric materials over the dummy gate structures 150 using processes such as, an ALD process, a PEALD (plasma enhanced ALD) process, a PECVD process, a subatmospheric CVD (SACVD) process, or other suitable process. An anisotropic etching process is then performed on the deposited spacer layers to expose portions of the fin structures 104 not covered by the dummy gate structures 150 (e.g., in the source/drain regions of the fin structures 104). Portions of the spacer layers directly above the dummy gate structures 150 may be removed by this anisotropic etching process. Portions of the spacer layers on sidewalls of the dummy gate structures 150 may remain, forming gate sidewall spacers, which are denoted as the spacer structures 160, for the sake of simplicity. In some embodiments, the spacer structure 160 may be used to offset subsequently formed doped regions, such as source/drain regions. The spacer structure 160 may further be used for designing or modifying the source/drain region profile.

After the formation of the spacer structures 160 is completed, the exposed portions of the fin structures 104 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICP) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch.

During the SSD etching process, the base portions 112 and/or the isolation structures 140 are recessed as well. For example, recesses R1 are formed in the base portions 112, and a depth D1 of the recesses R1 is in a range from about 15 nm to about 60 nm.

Figure 5:
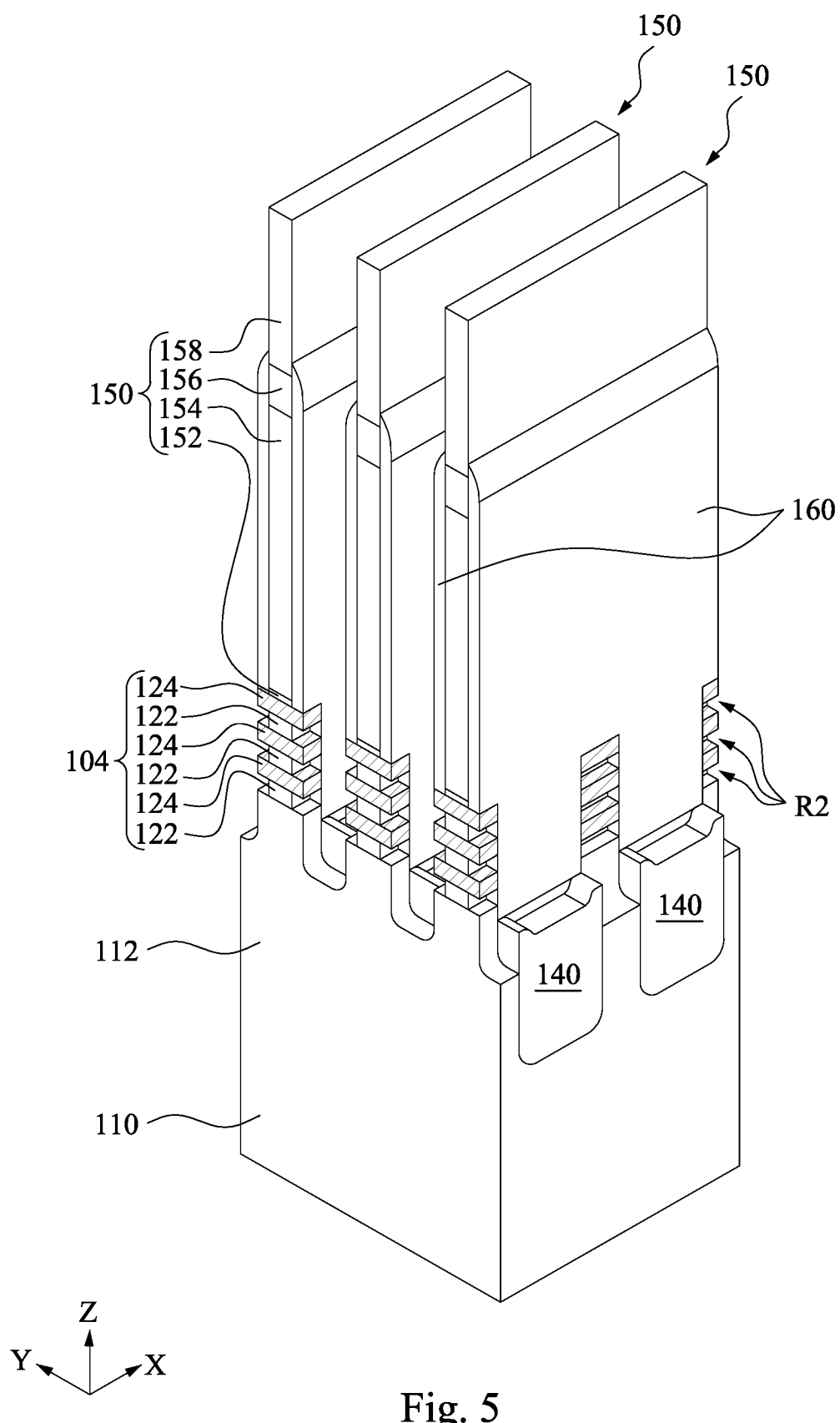

Reference is made to FIG. 5. The semiconductor layers 122 are laterally or horizontally recessed by using suitable etch techniques, resulting in lateral recesses R2 each vertically between corresponding semiconductor layers 124. This operation may be performed by using a selective etching process. By way of example and not limitation, the semiconductor layers 122 are SiGe and the semiconductor layers 124 are silicon allowing for the selective etching of the semiconductor layers 122. In some embodiments, the selective wet etching includes an APM etch (e.g., ammonia hydroxide-hydrogen peroxide-water mixture) that etches SiGe at a faster etch rate than it etches Si. As a result, the semiconductor layers 124 laterally extend past opposite end surfaces of the semiconductor layers 122.

Figure 6:
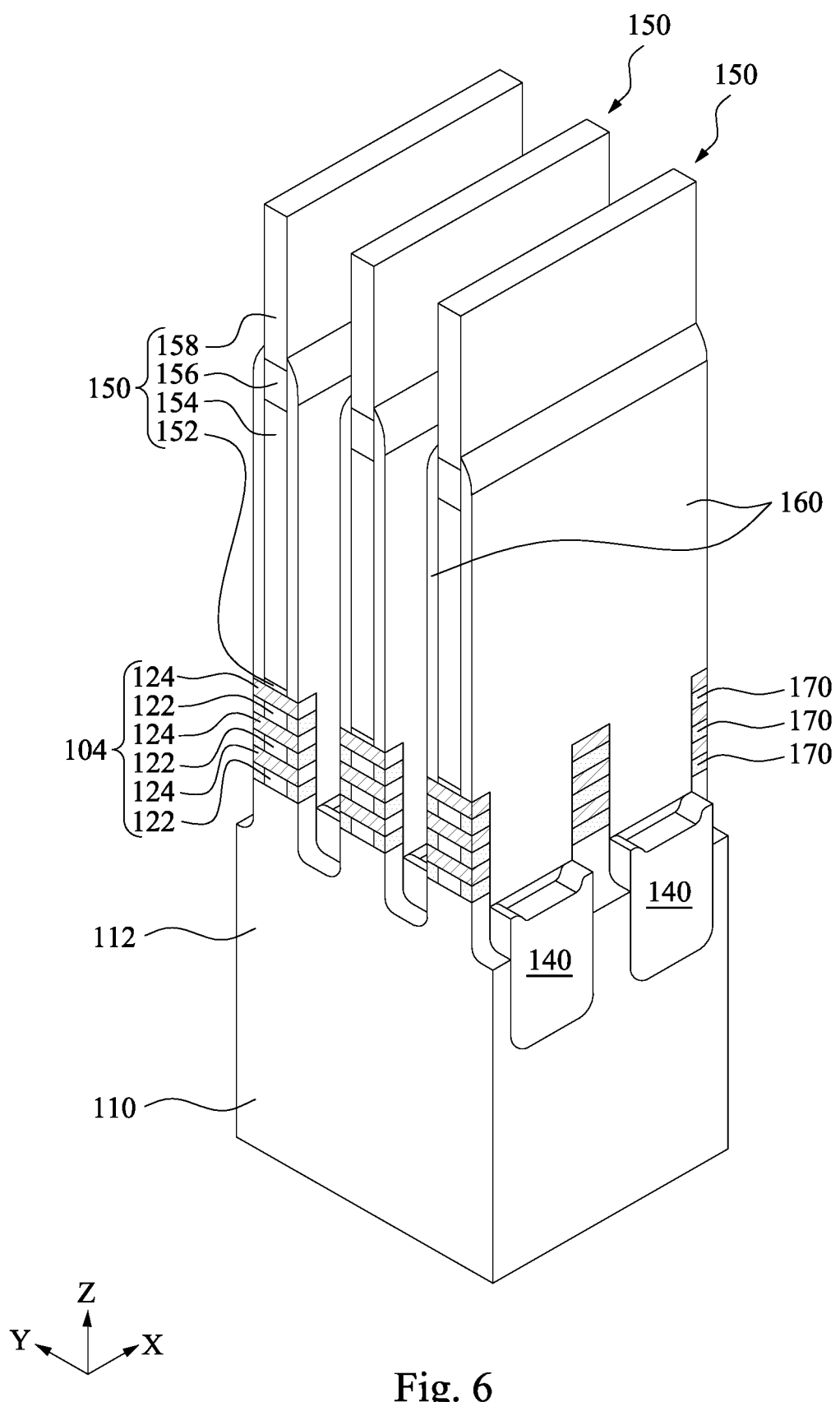

Reference is made to FIG. 6. Inner spacers 170 are respectively formed on sidewalls of the semiconductor layers 122. For example, a dielectric material layer is formed over the structure of FIG. 5, and one or more etching operations are performed to remove portions of the dielectric material layer outside the recesses R2 to form the inner spacers 170. In some embodiments, the inner spacers 170 includes a silicon nitride-based material, such as SiN, SiON, SiOCN or SiCN and combinations thereof. In some embodiments, the inner spacers 170 are silicon nitride. The inner spacers 170 may fully fill the recesses R2 as shown in FIG. 6. The dielectric material layer can be formed using CVD, including PECVD, PEALD, ALD, or other suitable processes. The etching operations include one or more wet and/or dry etching operations. In some embodiments, the etching is an isotropic etching in some embodiments.

Figure 7:
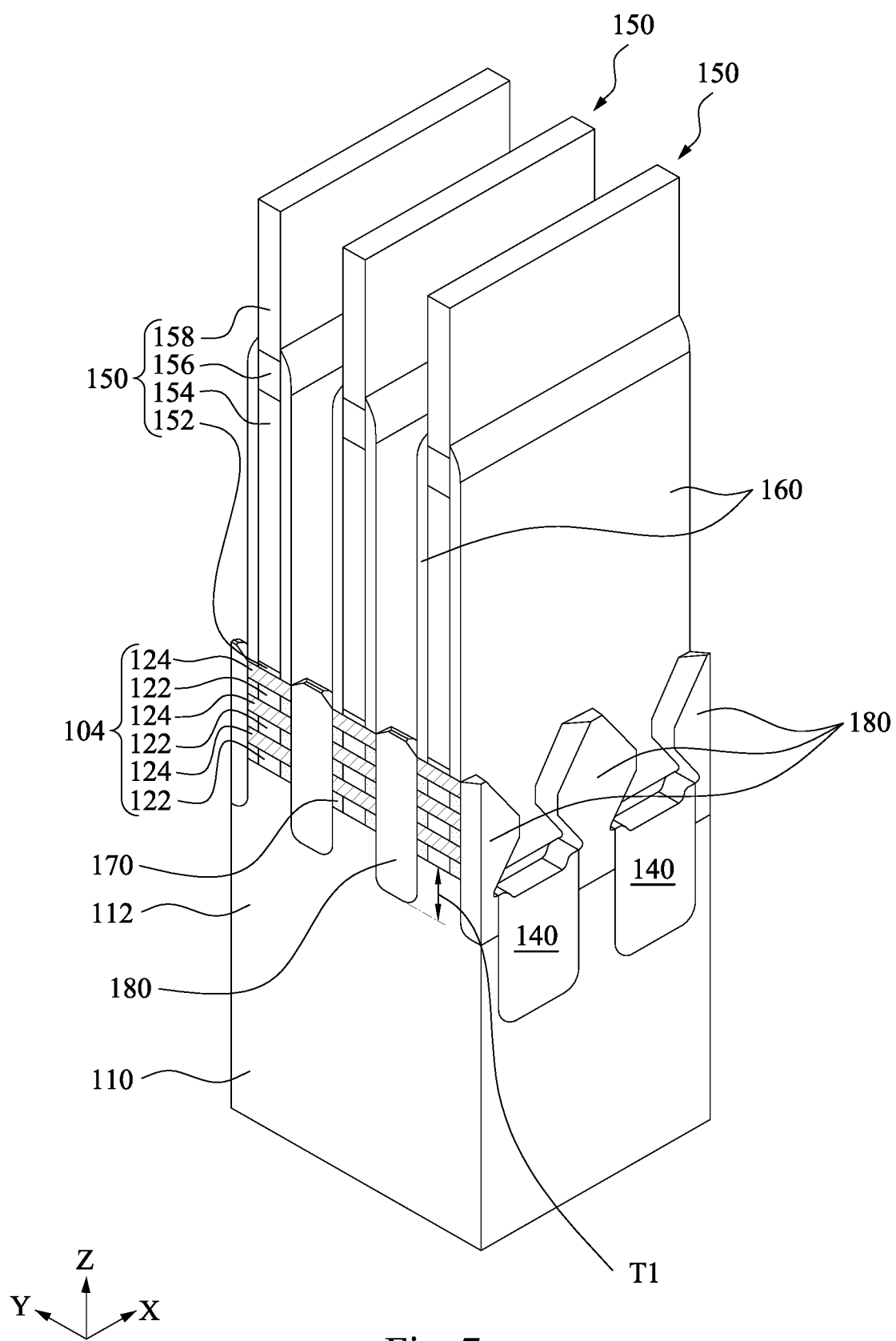

Reference is made to FIG. 7. Source/drain epitaxial structures 180 are formed in the source/drain recesses R1 in the base portions 112 and on opposite sides of the semiconductor layers 124 by using one or more epitaxy or epitaxial (epi) processes that provides one or more epitaxial materials on the base portions 112. During the epitaxial growth process, the spacer structures 160 limit the one or more epitaxial materials to source/drain regions in the base portions 112. In some embodiments, the lattice constants of the source/drain epitaxial structures 180 are different from the lattice constant of the semiconductor layers 124, so that the channel region in the semiconductor layers 124 can be strained or stressed by the source/drain epitaxial structures 180 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor layers 124.

In some embodiments, the source/drain epitaxial structures 180 include Ge, Si, GaAs, AlGaAs, SiGe, GaAsP, SiP, SiAs, or other suitable material. The source/drain epitaxial structures 180 may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 180 are not in-situ doped, an implantation process (i.e., a junction implant process) is performed to dope the source/drain epitaxial structures 180. In some exemplary embodiments, the source/drain epitaxial structures 180 in an n-type transistor include SiP, while those in a p-type include SiGeB, GeSnB, and/or SiGeSnB. In embodiments with different device types, a mask, such as a photoresist, may be formed over n-type device regions, while exposing p-type device regions, and p-type epitaxial structures may be formed on the exposed semiconductor layers 124 and the base portions 112 in the p-type device regions. The mask may then be removed. Subsequently, a mask, such as a photoresist, may be formed over the p-type device region while exposing the n-type device regions, and n-type epitaxial structures may be formed on the exposed semiconductor layers 124 and the base portions 112 in the n-type device region. The mask may then be removed.

Once the source/drain epitaxial structures 180 are formed, an annealing process can be performed to activate the p-type dopants or n-type dopants in the source/drain epitaxial structures 180. The annealing process may be, for example, a rapid thermal anneal (RTA), a laser anneal, a millisecond thermal annealing (MSA) process or the like.

Figure 8:
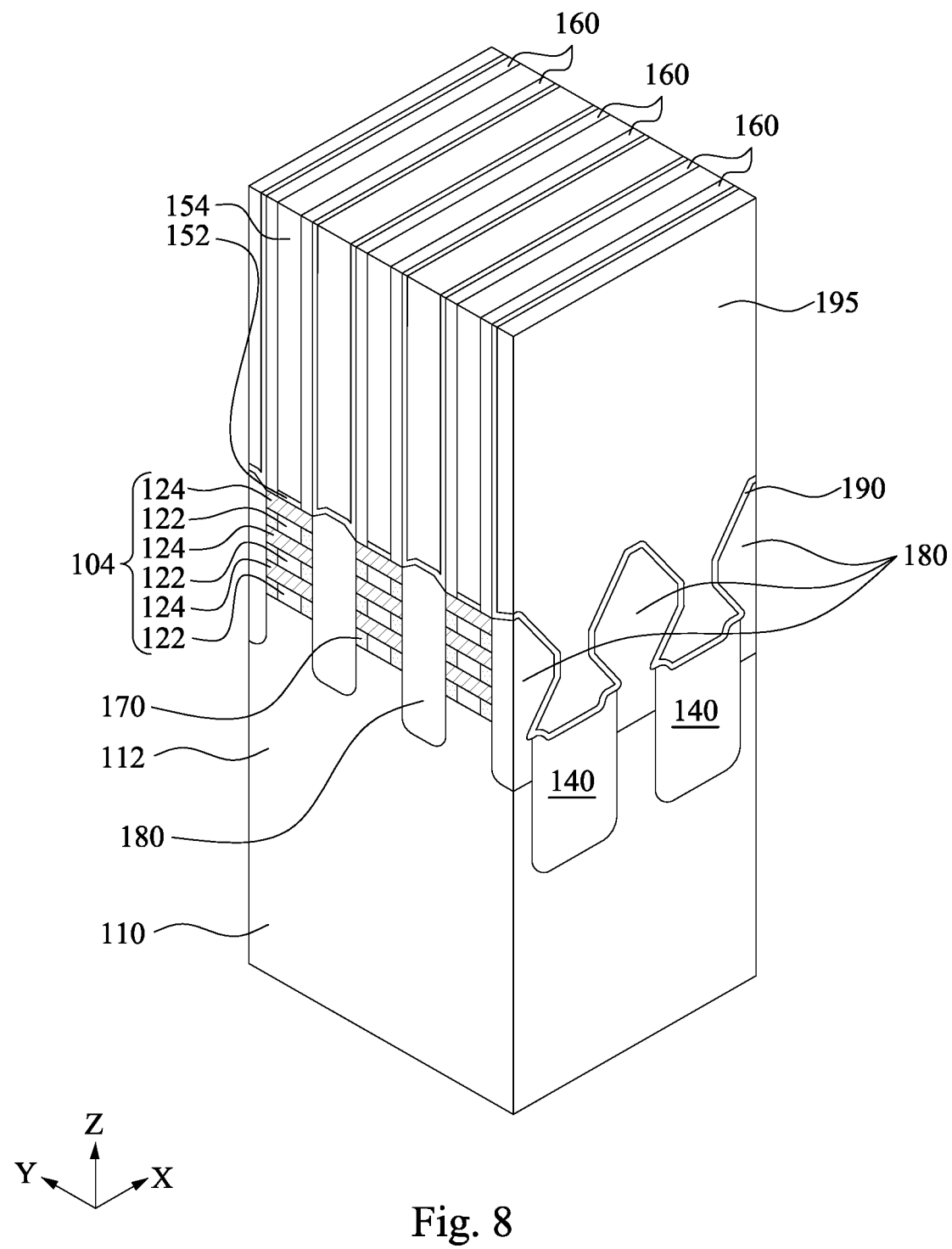

Reference is made to FIG. 8. A contact etch stop layer (CESL) 190 is conformally formed over the structure of FIG. 7. In some embodiments, the CESL 190 can be a stressed layer or layers. In some embodiments, the CESL 190 has a tensile stress and is formed of SiN, SiCN, combinations thereof, of the like. In some other embodiments, the CESL 190 includes materials such as oxynitrides. In yet some other embodiments, the CESL 190 may have a composite structure including a plurality of layers, such as a silicon nitride layer overlying a silicon oxide layer. The CESL 190 can be formed using plasma enhanced CVD (PECVD), however, other suitable methods, such as low-pressure CVD (LPCVD), atomic layer deposition (ALD), and the like, can also be used.

An interlayer dielectric (ILD) layer 195 is then formed on the CESL 190. The ILD layer 195 may be formed by chemical vapor deposition (CVD), high-density plasma CVD, spin-on, sputtering, or other suitable methods. In some embodiments, the ILD layer 195 includes silicon oxide. In some other embodiments, the ILD layer 195 may include silicon oxy-nitride, silicon nitride, SiOCN, compounds including Si, O, C and/or H (e.g., silicon oxide, SiCOH and SiOC), a low-k material, or organic materials (e.g., polymers). After the ILD layer 195 is formed, a planarization operation, such as CMP, is performed, so that the pad layer 156 and the mask layer 158 (see FIG. 7) are removed and the dummy gate electrode layer 154 is exposed.

Figure 9:
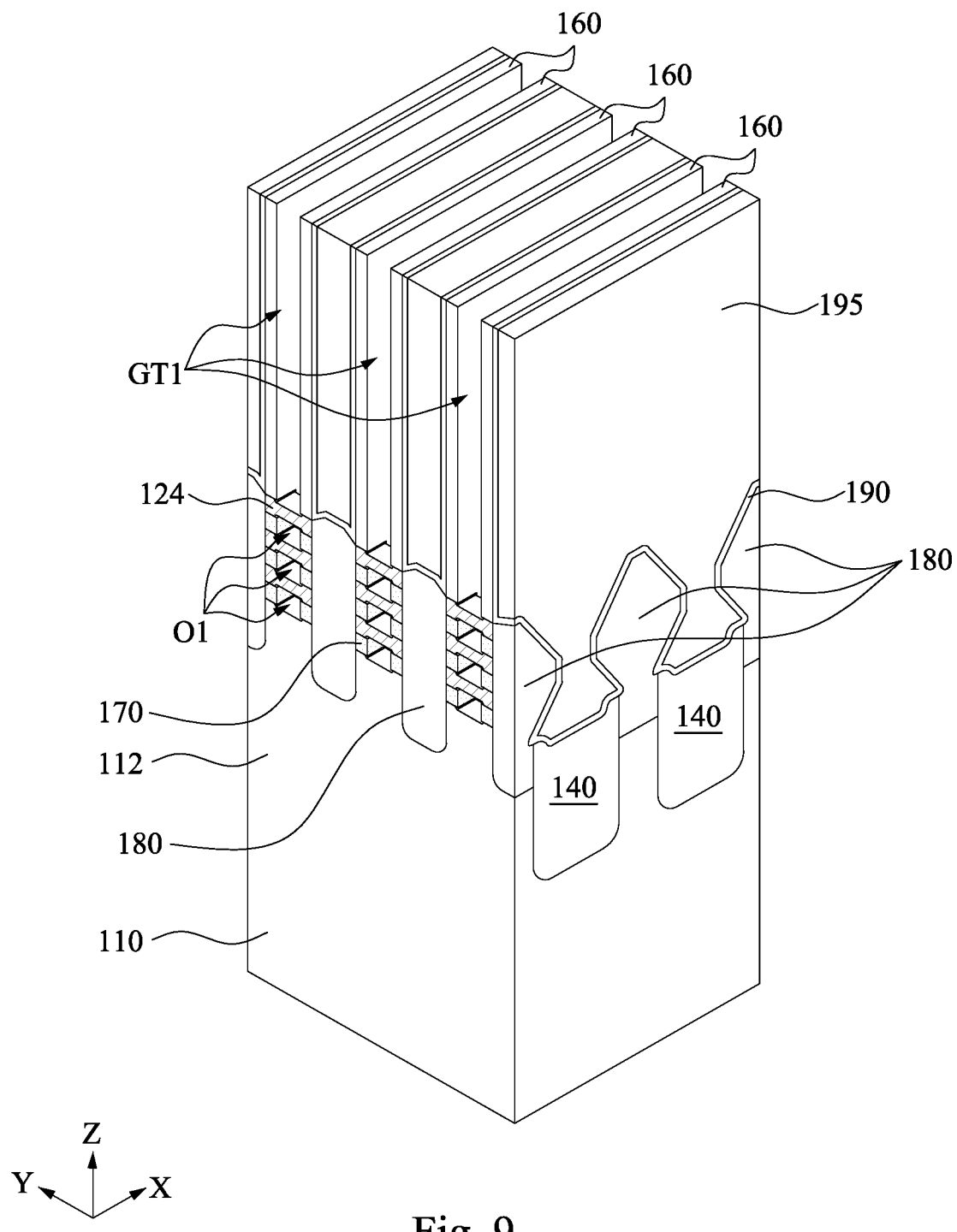

Reference is made to FIG. 9. The dummy gate electrode layers 154 and the dummy gate dielectric layers 152 (see FIG. 8) are then removed, thereby exposing the semiconductor layers 122 and 124. The ILD layer 195 protects the source/drain epitaxial structures 180 during the removal of the dummy gate electrode layers 154 and the dummy gate dielectric layers 152. In some embodiments, the dummy gate electrode layers 154 and the dummy gate dielectric layers 152 are removed by using a selective etching process (e.g., selective dry etching, selective wet etching, or combinations thereof) that etches the materials in dummy gate electrode layers 154 and the dummy gate dielectric layers 152 at a faster etch rate than it etches other materials (e.g., the spacer structures 160 and/or ILD layer 195), thus resulting in gate trenches GT1 between corresponding spacer structures 160, with the semiconductor layers 122 and 124 exposed in the gate trenches GT1. Subsequently, the semiconductor layers 122 in the gate trenches GT1 are removed by using another selective etching process that etches the semiconductor layers 122 at a faster etch rate than it etches the semiconductor layers 124, thus forming openings O1 between neighboring semiconductor layers (i.e., channel layers) 124. In this way, the semiconductor layers 124 become nanosheets suspended over the substrate 110 and between the source/drain epitaxial structures 180. This operation is also called a channel release process. In some embodiments, the semiconductor layers 124 can be interchangeably referred to as nanostructure (nanowires, nanoslabs and nanorings, nanosheet, etc., depending on their geometry). For example, in some other embodiments the semiconductor layers 124 may be trimmed to have a substantial rounded shape (i.e., cylindrical) due to the selective etching process for completely removing the semiconductor layers 122. In that case, the resultant semiconductor layers 124 can be called nanowires.

Figure 10:
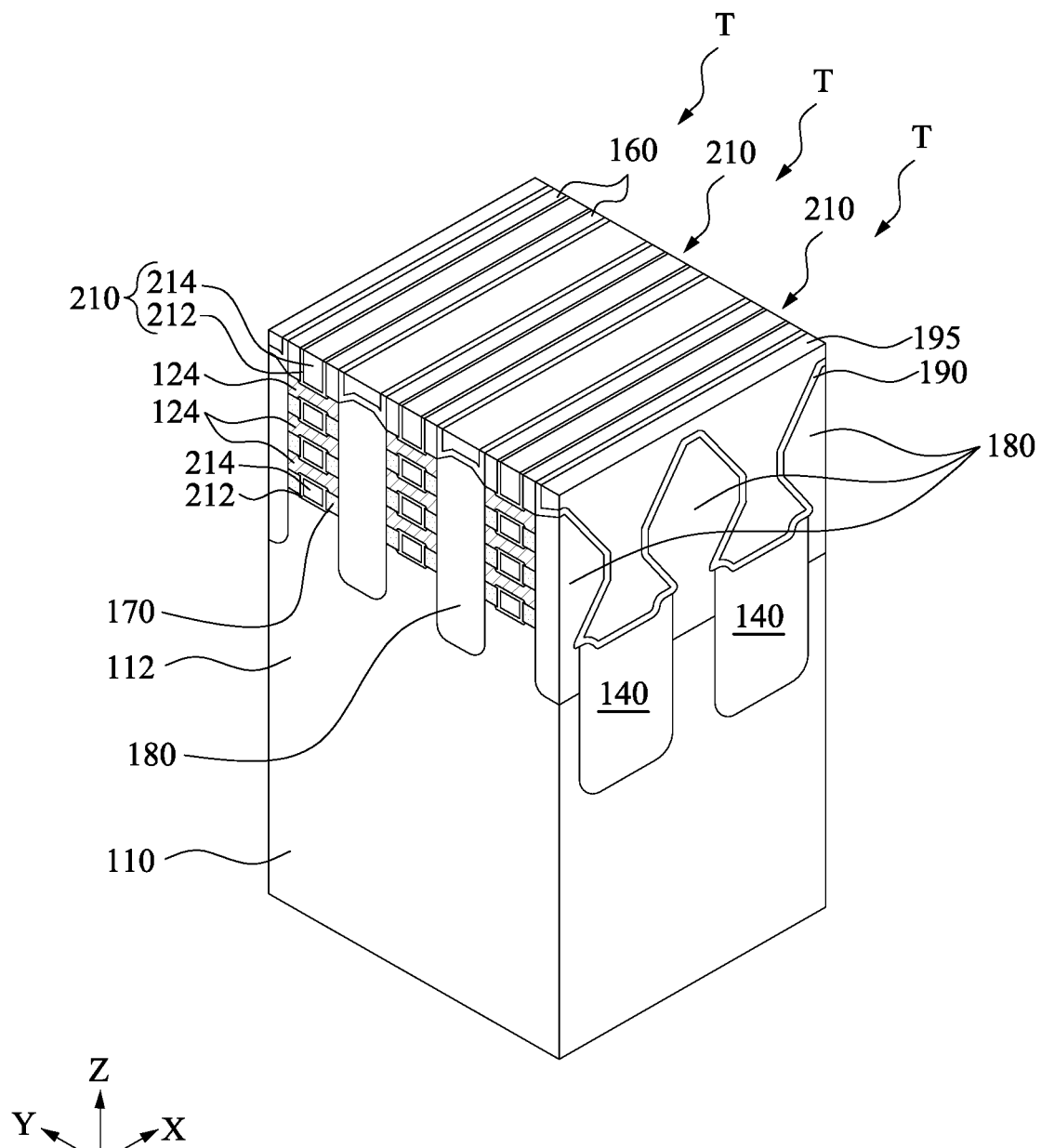

Reference is made to FIG. 10. Thereafter, replacement gate structures 210 are respectively formed in the gate trenches GT1. The gate structures 210 may be the final gates of FinFETs. The final gate structures each may be a high-k/metal gate structure, however other compositions are possible. The gate structure 210 encircles (wraps) the semiconductor layers 124, in which the semiconductor layers 124 are referred to as channels of the semiconductor device. Stated differently, the semiconductor layers 124 are embedded in the gate structures 210. The spacer structures 160 are disposed on opposite sides of the gate structures 210. Each of the gate structures 210 includes a gate dielectric layer 212 and a gate electrode 214. The gate electrode 214 includes one or more work function metal layer (s) and a filling metal. The gate dielectric layer 212 is conformally formed. Furthermore, the gate dielectric layer 212 surrounds the semiconductor layers 124, and spaces between the semiconductor layers 124 are still left after the deposition of the gate dielectric layer 212. In some embodiments, the gate dielectric layer 212 includes a high-k material (k is greater than 7) such as hafnium oxide (HfO$_2$), zirconium oxide (ZrO$_2$), lanthanum oxide (La$_2$O$_3$), hafnium aluminum oxide (HfAlO$_2$), hafnium silicon oxide (HfSiO$_2$), aluminum oxide (Al$_2$O$_3$), or other suitable materials. In some embodiments, gate dielectric layer 212 may be formed by performing an ALD process or other suitable process.

In some embodiments, interfacial layers of the gate structures 210 are optionally formed to surround exposed surfaces of the semiconductor layers 124 and exposed surfaces of the base portions 112 of the substrate 110. In various embodiments, the interfacial layer may include a dielectric material such as silicon oxide (SiO$_2$) or silicon oxynitride (SiON), and may be formed by chemical oxidation, thermal oxidation, atomic layer deposition (ALD), chemical vapor deposition (CVD), and/or other suitable methods.

The work function metal layer of the gate electrode 214 is conformally formed on the gate dielectric layer 212, and the work function metal layer surrounds the semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process. The filling metal of the gate electrode 214 fills the remained space between the spacer structures 160 and between the inner spacers 170. That is, the work function metal layer(s) is in contact with and between the gate dielectric layer 212 and the filling metal. The filling metal may include material such as tungsten or aluminum. After the deposition of the gate dielectric layer 212 and the gate electrode 214, a planarization process, such as a CMP process, may be then performed to remove excess portions of the gate dielectric layer 212 and the gate electrode 214 to form the gate structure 210. In some embodiments, the CMP process also removes top portions of the spacer structures 160 and top portions of the ILD layer 195 and CESL 190, such that a height of the device is reduced. After the formation of the gate structures 210, transistors T are formed over the substrate 110.

Figure 11:
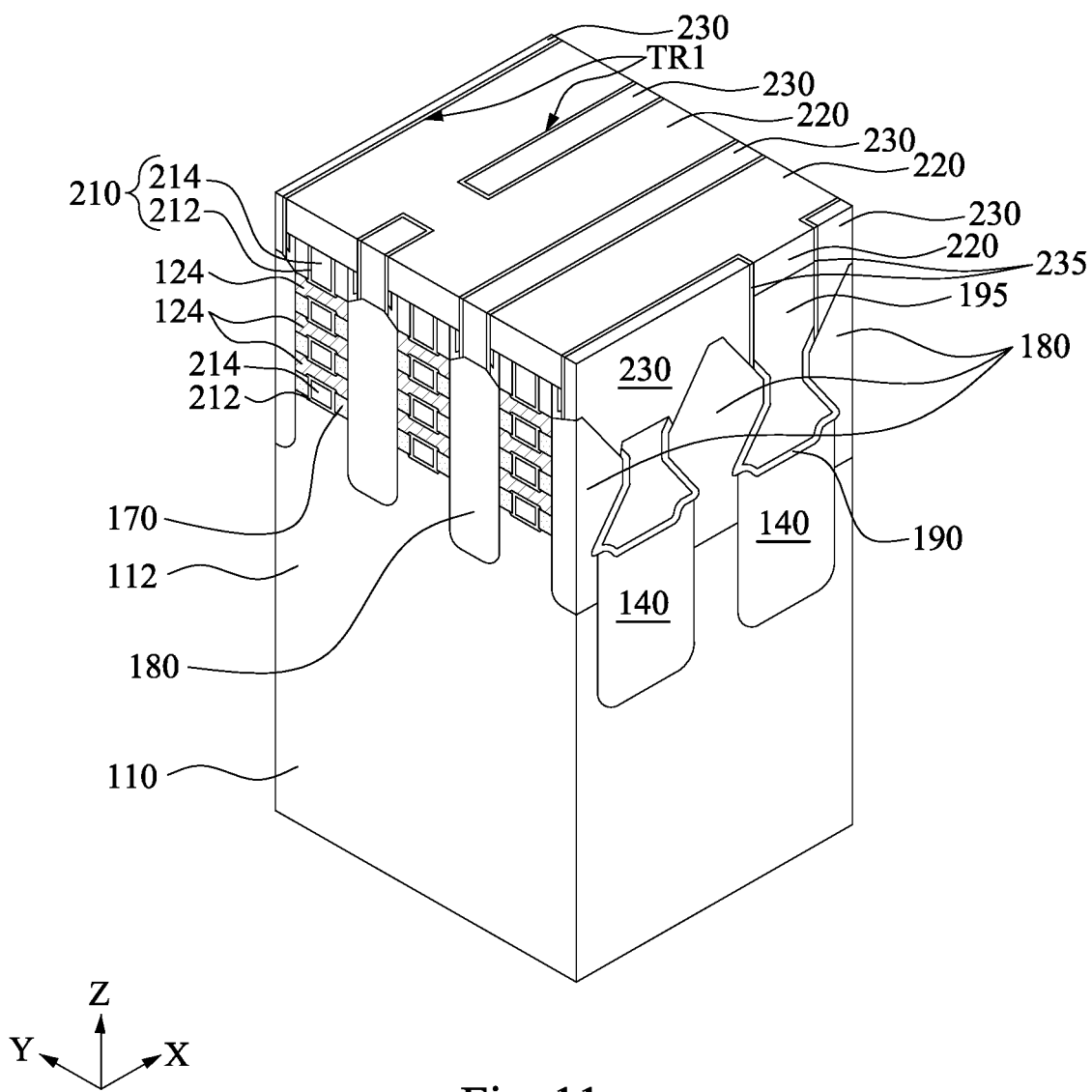

Reference is made to FIG. 11. Another ILD layer 220 is formed over the structure illustrated in FIG. 10. In some embodiments, the ILD layer 220 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and the like. In certain embodiments, the ILD layer 220 is formed of silicon oxide ($SiO_x$). The ILD layer 220 may be deposited by a PECVD process or other suitable deposition technique.

The ILD layers 195 and 220 are then patterned to form contact trenches TR1 on opposite sides of the gate structures 210, and then the CESL 190 is patterned to expose the source/drain epitaxial structures 180. In some embodiments, multiple etching processes are performed to pattern the ILD layers 195 and 220 and the CESL 190. The etching processes include dry etching process, wet etching process, or combinations thereof.

Contact liner layers 235 are formed on inner sidewalls of the contact trenches TR1. The formation of the contact liner layers 235 may include blanket forming spacer layers and then performing etching operations to remove the horizontal portions of the spacer layers. The remaining vertical portions of the spacer layers form the contact liner layers 235. The contact liner layers 235 include one or more dielectric materials, such as silicon oxide, silicon nitride, silicon oxynitride, SiCN, $SiC_xO_yN_z$, high-k dielectric materials, or combinations thereof. The contact liner layers 235 can be formed using a deposition method, such as plasma enhanced chemical vapor deposition (PECVD), plasma enhanced atomic layer deposition (PEALD), or the like. In some embodiments, a thickness of the contact liner layers 235 is in a range from about 1 nm to about 3 nm.

In some embodiments, front-side metal alloy layers are respectively formed above the source/drain epitaxial structures 180. The front-side metal alloy layers, which may be silicide layers, are respectively formed in the trenches and over the exposed source/drain epitaxial structures 180 by a self-aligned silicide (salicide) process. The silicide process converts the surface portions of the exposed source/drain epitaxial structures 180 into the silicide contacts. Silicide processing involves deposition of a metal that undergoes a silicidation reaction with silicon (Si). In order to form silicide contacts on the exposed source/drain epitaxial structures 180, a metal material is blanket deposited on the exposed source/drain epitaxial structures 180. After heating the wafer to a temperature at which the metal reacts with the silicon of the exposed source/drain epitaxial structures 180 to form contacts, unreacted metal is removed. The silicide contacts remain over the exposed source/drain epitaxial structures 180, while unreacted metal is removed from other areas. The silicide layer may include a material selected from titanium silicide, nickel silicide, cobalt silicide, platinum silicide, nickel platinum silicide, erbium silicide, palladium silicide, combinations thereof, or other suitable materials. In some embodiments, the front-side metal alloy layers may include germanium.

Front-side contacts 230 are then formed in the contact trenches TR1 and above the front-side metal alloy layers. As such, the front-side contacts 230 are electrically connected to the source/drain epitaxial structures 180. In some embodiments, the front-side contacts 230 may be made of metal, such as W, Co, Ru, Mo, Al, Cu, or other suitable materials. After the deposition of the front-side contacts 230, a planarization process, such as a chemical mechanical planarization (CMP) process, may be then performed. In some embodiments, barrier layers may be formed in the contact trenches TR1 before the formation of the front-side contacts 230. The barrier layers may be made of Ti, TiN, Ta, TaN, Ru, Co, or combinations thereof. In some embodiments, the front side contacts 230 each has a vertical thickness T1 (labeled in FIG. 12B) in a range from about 10 nm to about 50 nm.

Figure 12A:
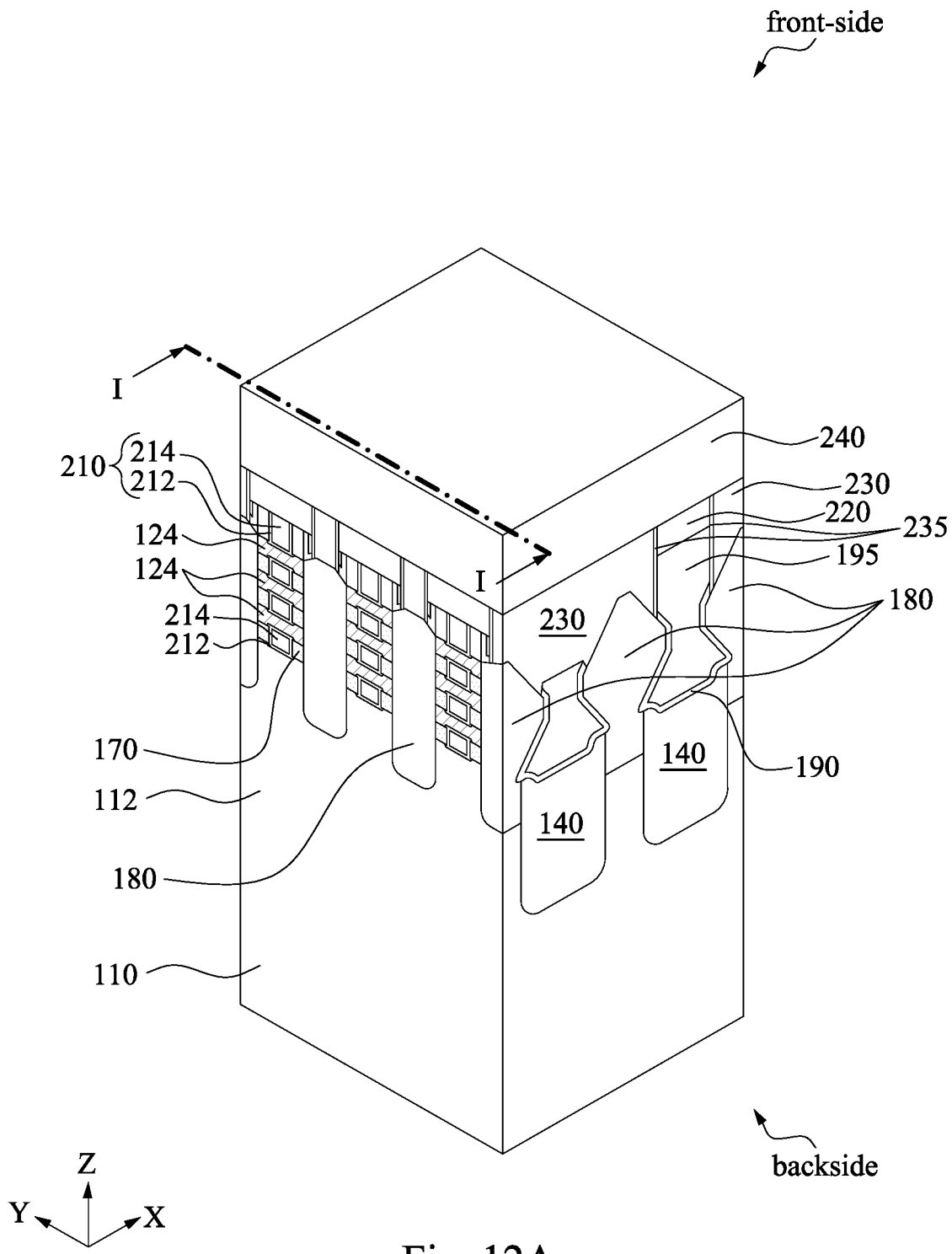
Figure 12B:
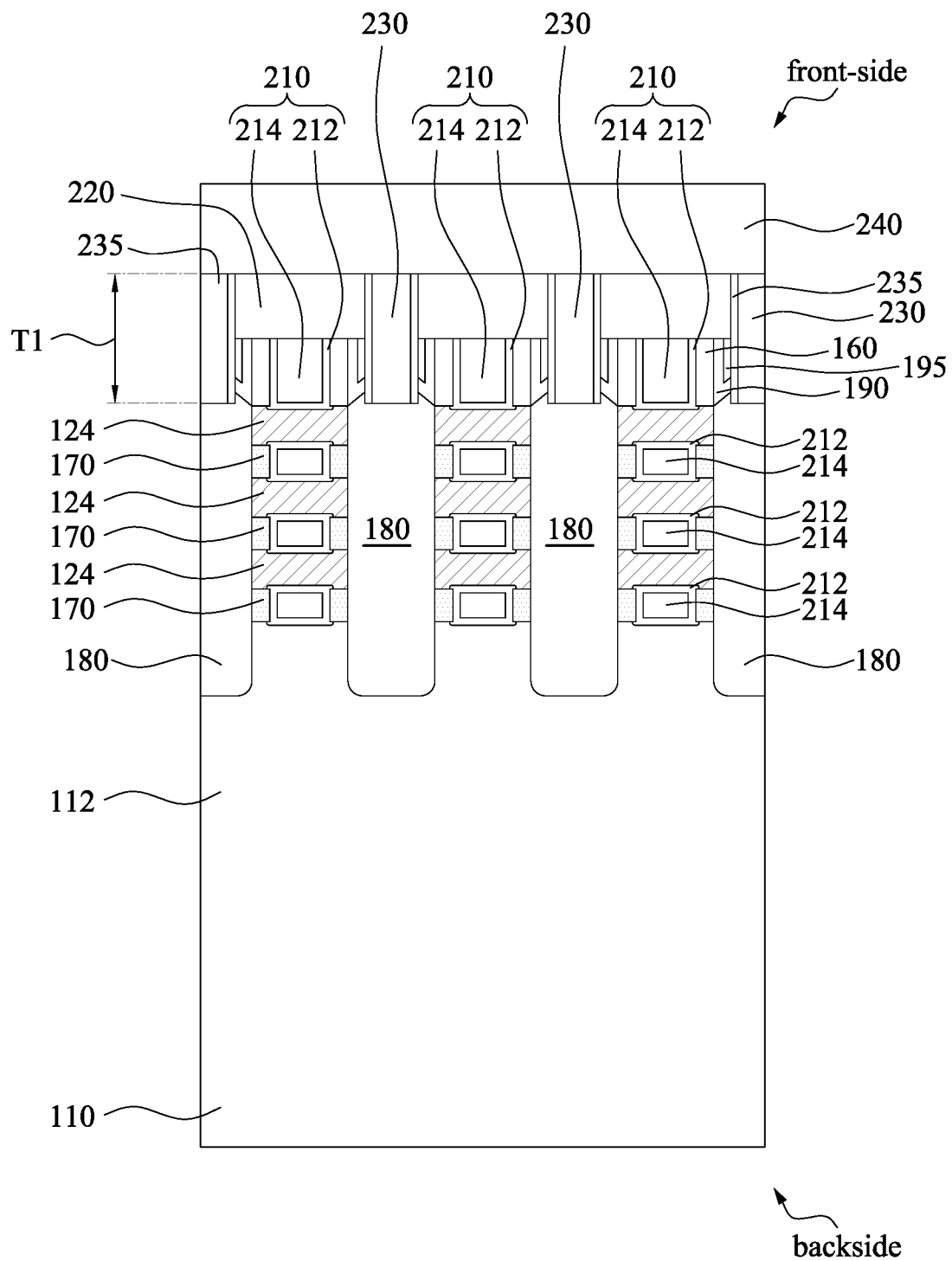

Reference is made to FIGS. 12A and 12B. A front-side multilayer interconnection (MLI) structure 240 is formed over the substrate 110. For clarity, the "front-side" and the "backside" of the structure/elements are labeled in figures. The front-side MLI structure 240 may include a plurality of front-side metallization layers. The number of front-side metallization layers may vary according to design specifications of the semiconductor device. The front-side metallization layers each includes a first front-side inter-metal dielectric (IMD) layer and a second front-side IMD layer. The second front-side IMD layers are formed over the corresponding first front-side IMD layers. The front-side metallization layers include one or more horizontal interconnects, such as front-side metal lines, respectively extending horizontally or laterally in the second front-side IMD layers and vertical interconnects, such as front-side conductive vias, respectively extending vertically in the first front-side IMD layers.

The front-side metal lines and front-side metal vias can be formed using, for example, a single damascene process, a dual damascene process, the like, or combinations thereof. In some embodiments, the front-side IMD layers may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias may include metal materials such as copper, aluminum, tungsten, combinations thereof, or the like. In some embodiments, the front-side metal lines and vias may further include one or more barrier/adhesion layers (not shown) to protect the respective front-side IMD layers from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 13A:
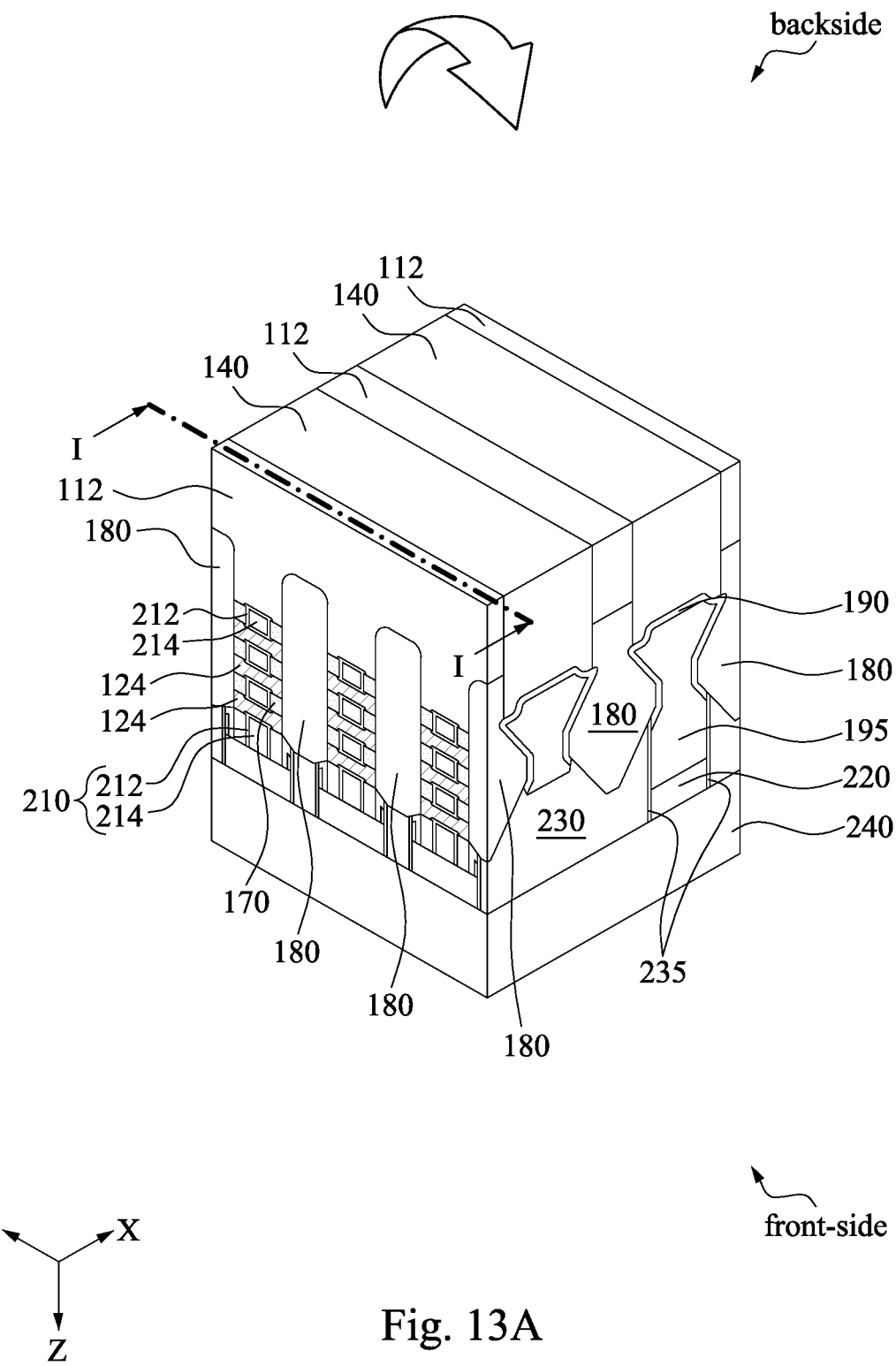
Figure 13B:
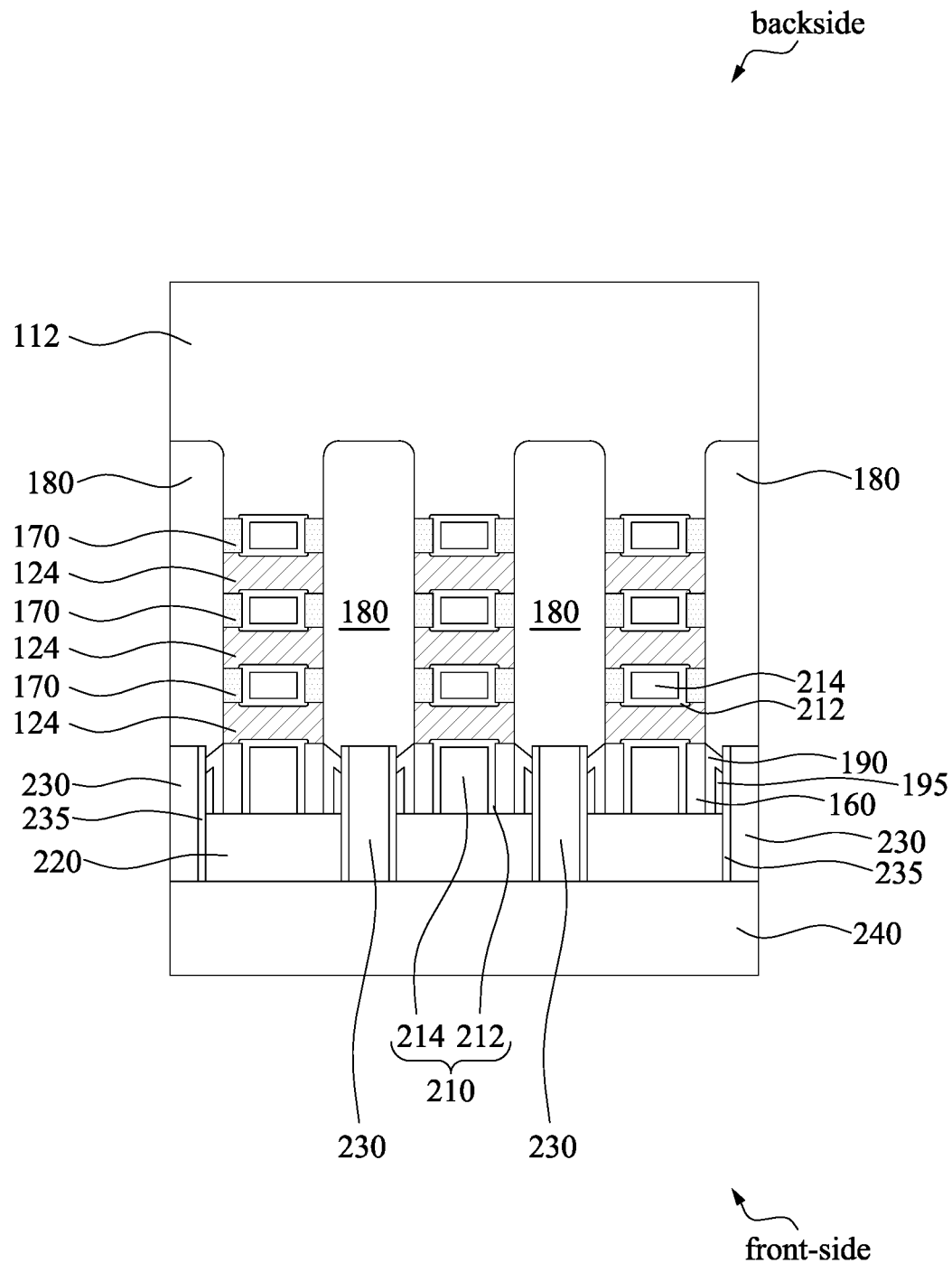

Reference is made to FIGS. 13A and 13B. The structure illustrated in FIG. 12A is "flipped" upside down, and the substrate 110 is thinned to expose the isolation structures 140 and the base portions 112. In some embodiments, the substrate 110 is thinned down from the backside thereof until the isolation structures 140 are exposed.

Figure 14A:
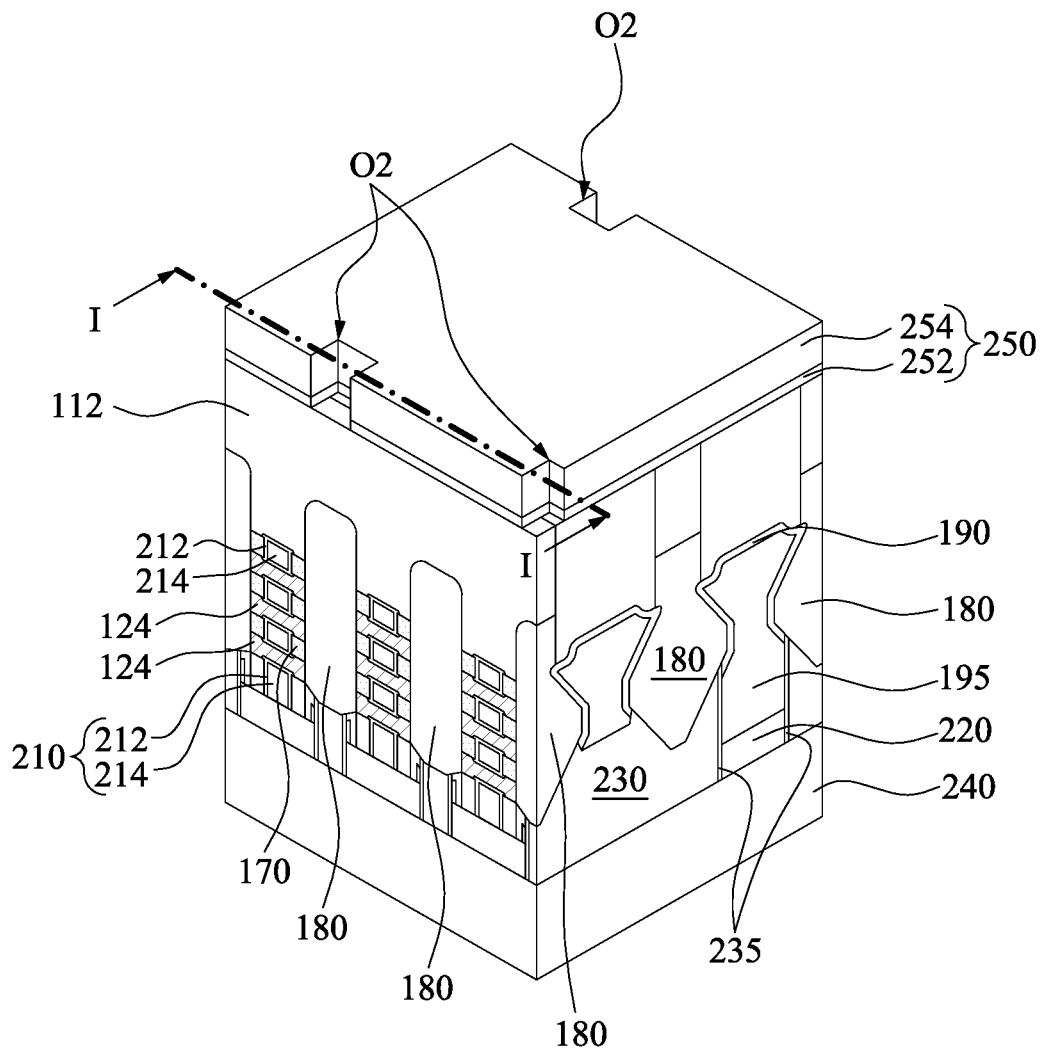
Figure 14B:
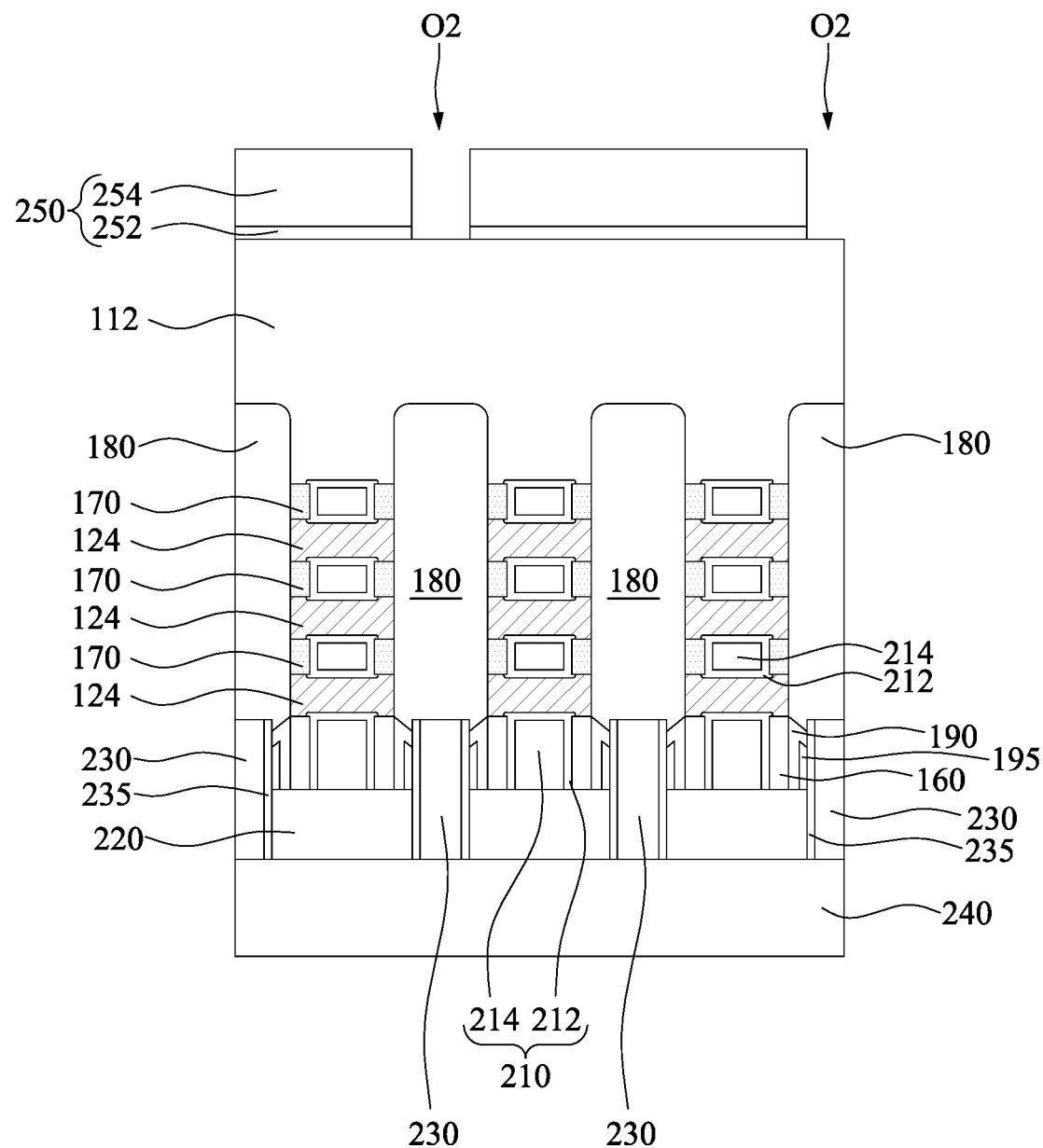

Reference is made to FIGS. 14A and 14B. A hard mask stack 250 is formed over the structure illustrated in FIG. 13A. That is, the hard mask stack 250 covers the isolation structures 140 and the base portions 112. In some embodiments, the hard mask stack 250 includes a first dielectric layer 252 and a second dielectric layer 254 over the first dielectric layer 252. The first dielectric layer 252 and the second dielectric layer 254 may be made of different materials such that the first dielectric layer 252 can be an etch stop layer for patterning the second dielectric layer 254. For example, the first dielectric layer 252 is a nitride layer (e.g., silicon nitride) and the second dielectric layer 254 is an oxide layer (e.g., silicon oxide). The first dielectric layer 252 and the second dielectric layer 254 may be formed by a PECVD process and/or other suitable deposition processes.

Subsequently, the first dielectric layer 252 and the second dielectric layer 254 are patterned to form via openings O2 extending through the second dielectric layer 254 and the first dielectric layer 252 by using one or more etching process(es). In some embodiments, before the one or more etching process(es), a photolithography process is performed to define expected top-view patterns of the via openings O2. For example, the photolithography process may include spin-on coating a photoresist layer over the second dielectric layer 254, performing post-exposure bake processes, and developing the photoresist layer to form a patterned mask with the top-view patterns of the via openings O2. In some embodiments, patterning the photoresist to form the patterned mask may be performed using an electron beam (e-beam) lithography process or an extreme ultraviolet (EUV) lithography process. In some embodiments, the one or more etching process(es) is an anisotropic etching process, such as a plasma etching. After the one or more etching process(es), the via openings O2 expose portions of the base portions 112 (and portions of the isolation structures 140).

Figure 15A:
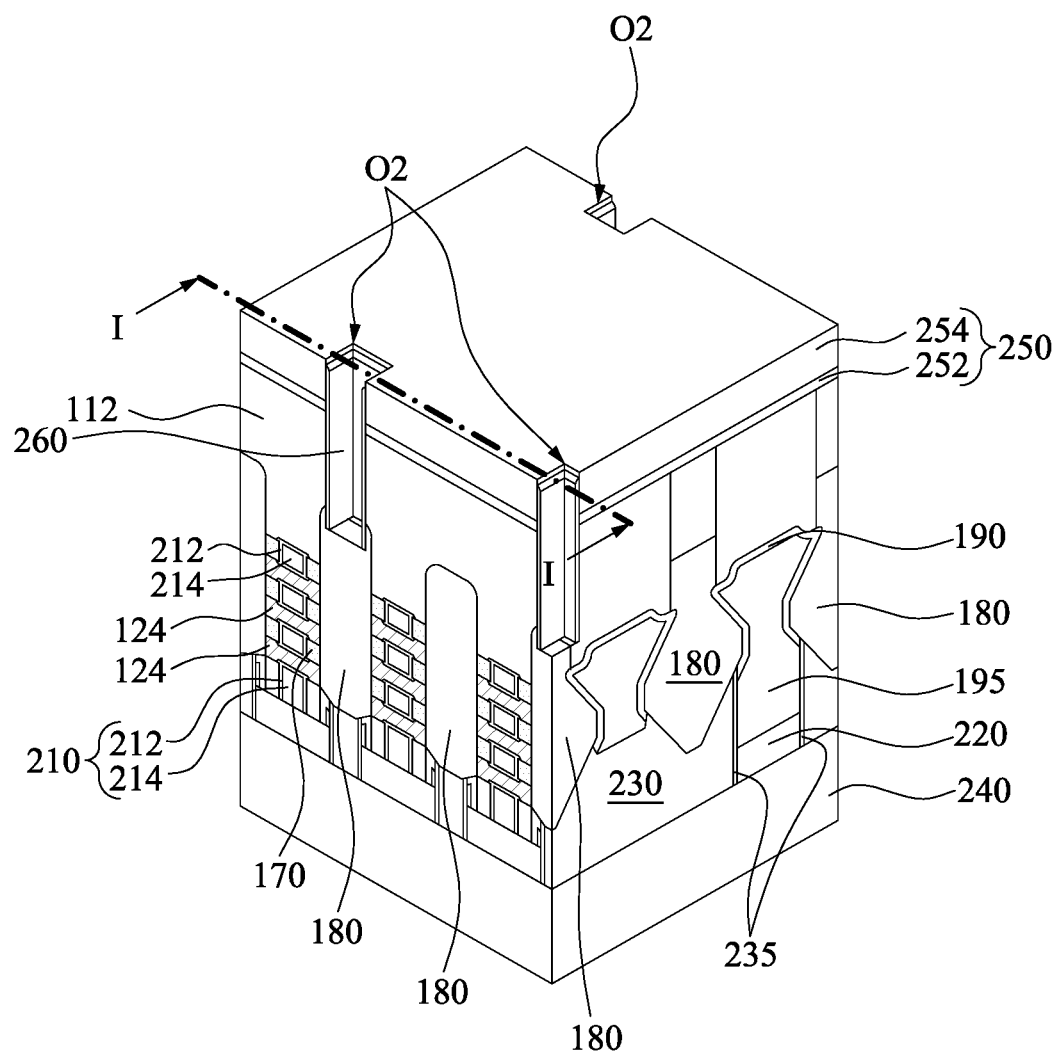
Figure 15B:
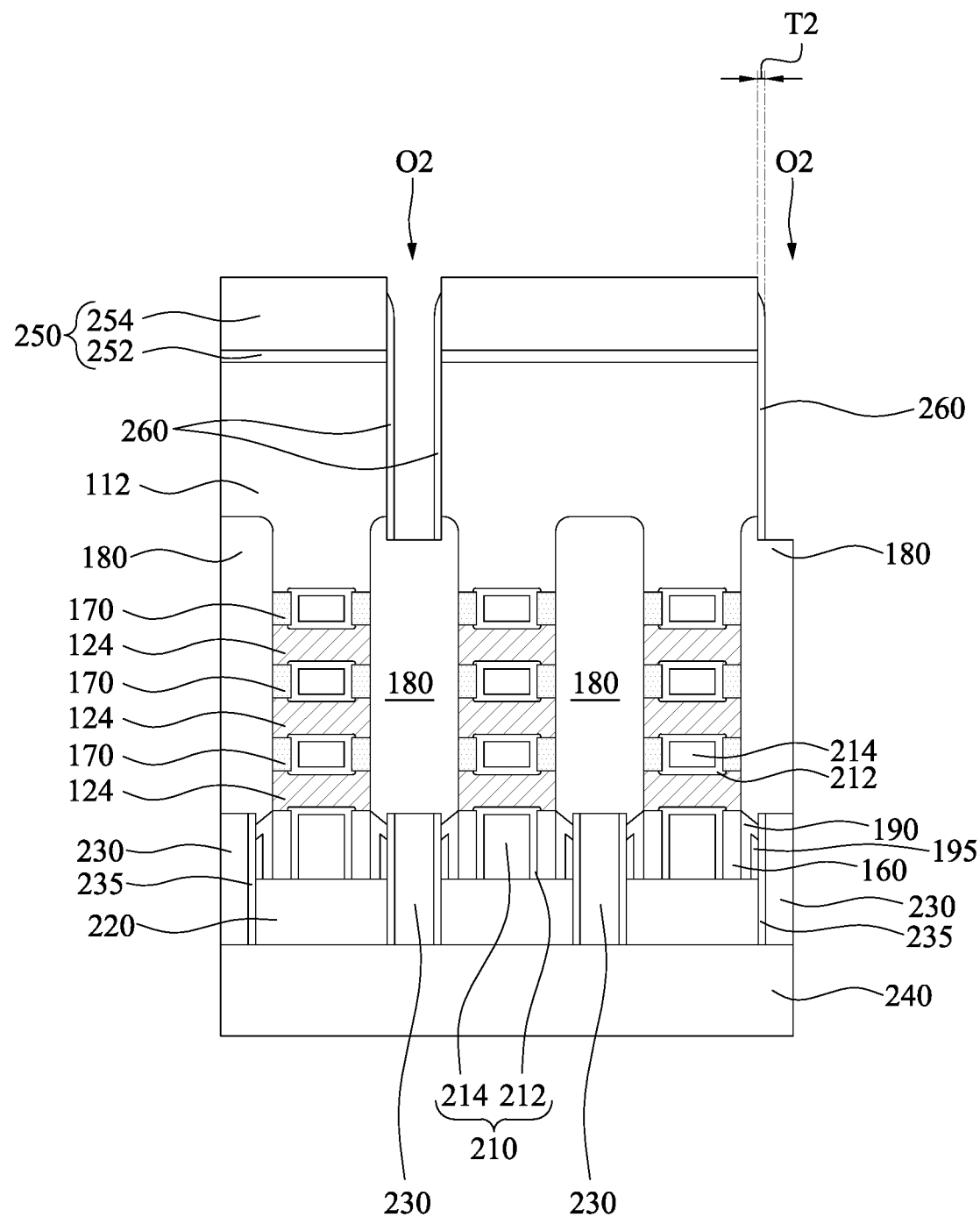

Reference is made to FIGS. 15A and 15B. The photoresist used to pattern the second dielectric layer 254 and the first dielectric layer 252 is removed, and another etching process is performed to extend the via openings O2 into the base portions 112 until the source/drain epitaxial structures 180 are exposed. In some embodiments, the source/drain epitaxial structures 180 are etched as well as shown in FIGS. 15A and 15B. Since the source/drain epitaxial structures 180 has a deep depth in the base portion 112, even though the source/drain epitaxial structures 180 are partially etched during this etching process, the via openings O2 are still far from the inner spacers 170 and the gate structures 210. As such, the inner spacers 170 and the gate structures 210 are not damaged during this etching process, and the short problem between the gate structures 210 and the following formed backside vias 270 (see FIGS. 16A and 16B) can be improved.

Via liner layers 260 are formed on inner sidewalls of the via openings O2. The formation of the via liner layers 260 may include blanket forming spacer layers and then performing etching operations to remove the horizontal portions of the spacer layers. The remaining vertical portions of the spacer layers form the via spacers 260. The via liner layers 260 include one or more dielectric materials, such as silicon oxide, silicon nitride, silicon oxynitride, SiCN, $SiC_xO_yN_z$, high-k dielectric materials, or combinations thereof. The via liner layers 260 can be formed using a deposition method, such as plasma enhanced chemical vapor deposition (PECVD), plasma enhanced atomic layer deposition (PEALD), or the like. In some embodiments, a thickness T2 of the via liner layers 260 is in a range from about 1.5 nm to about 5 nm.

Figure 16A:
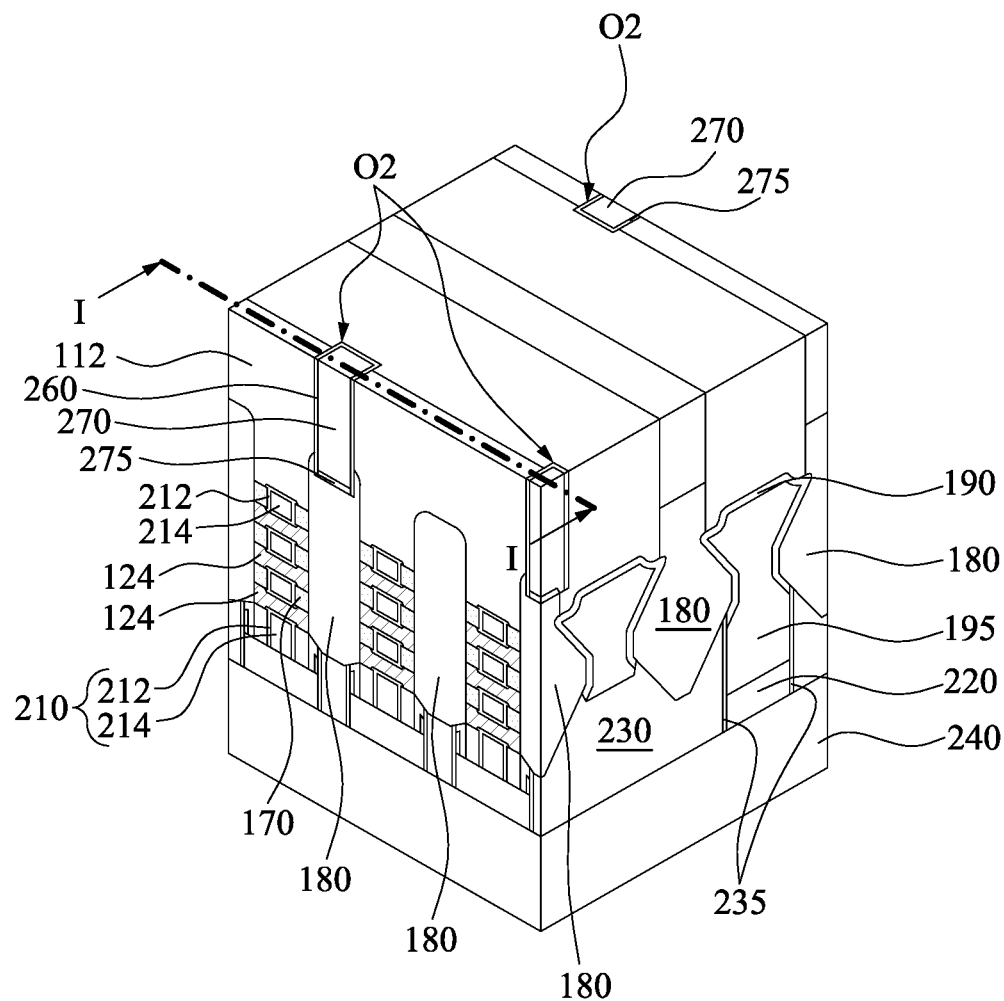
Figure 16A:
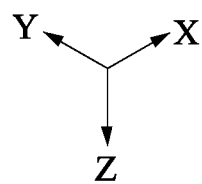
Figure 16B:
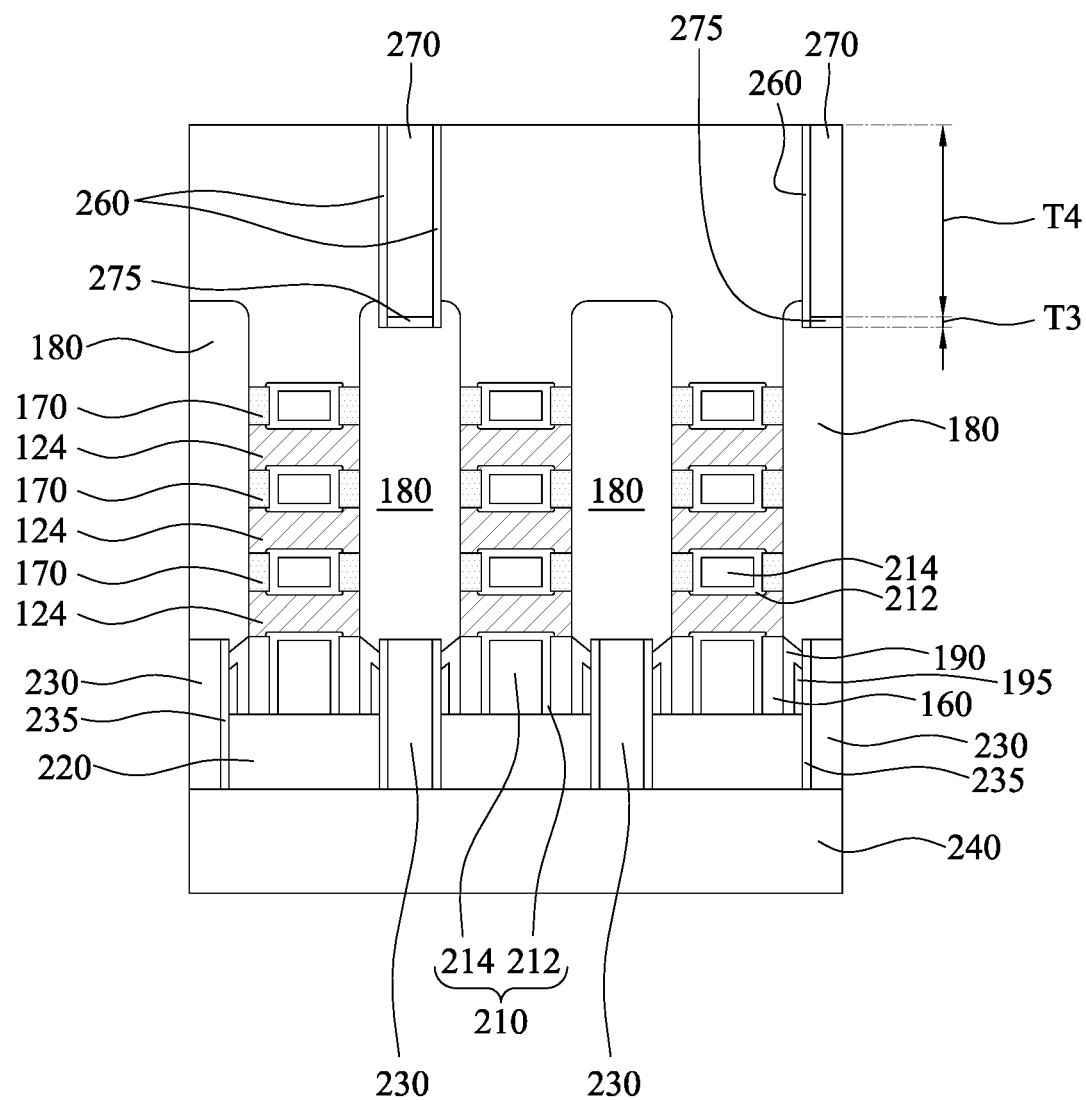

Reference is made to FIGS. 16A and 16B. Backside metal alloy layers 275 are formed in the via openings O2 and cover the source/drain epitaxial structures 180. Materials, configurations, dimensions, processes and/or operations regarding the backside metal alloy layers 275 are similar to or the same as the front-side metal alloy layers described in FIG. 11. In some embodiments, a thickness T3 of the backside metal alloy layers 275 is in a range from about 1.5 nm to about 10 nm.

Subsequently, backside vias 270 are formed in the via openings O2 and above the back-side metal alloy layers 275. As such, the backside vias 270 are electrically connected to the corresponding source/drain epitaxial structures 180. In some embodiments, the backside vias 270 may be made of metal, such as Co, W, Ru, Al, Mo, Ti, Cu, combinations thereof, or other suitable materials. After the deposition of the backside vias 270, a planarization process, such as a chemical mechanical planarization (CMP) process, may be then performed to remove the hard mask stack 250 (see FIGS. 15A and 15B) and portions of the via liner layers 260 and the backside vias 270 therein. In some embodiments, barrier layers may be formed in the via openings O2 before the formation of the backside vias 270. The barrier layers may be made of TiN, TaN, or combinations thereof. In some embodiments, a vertical thickness T4 of the backside vias 270 is in a range from about 10 nm to about 30 nm.

Figure 17A:
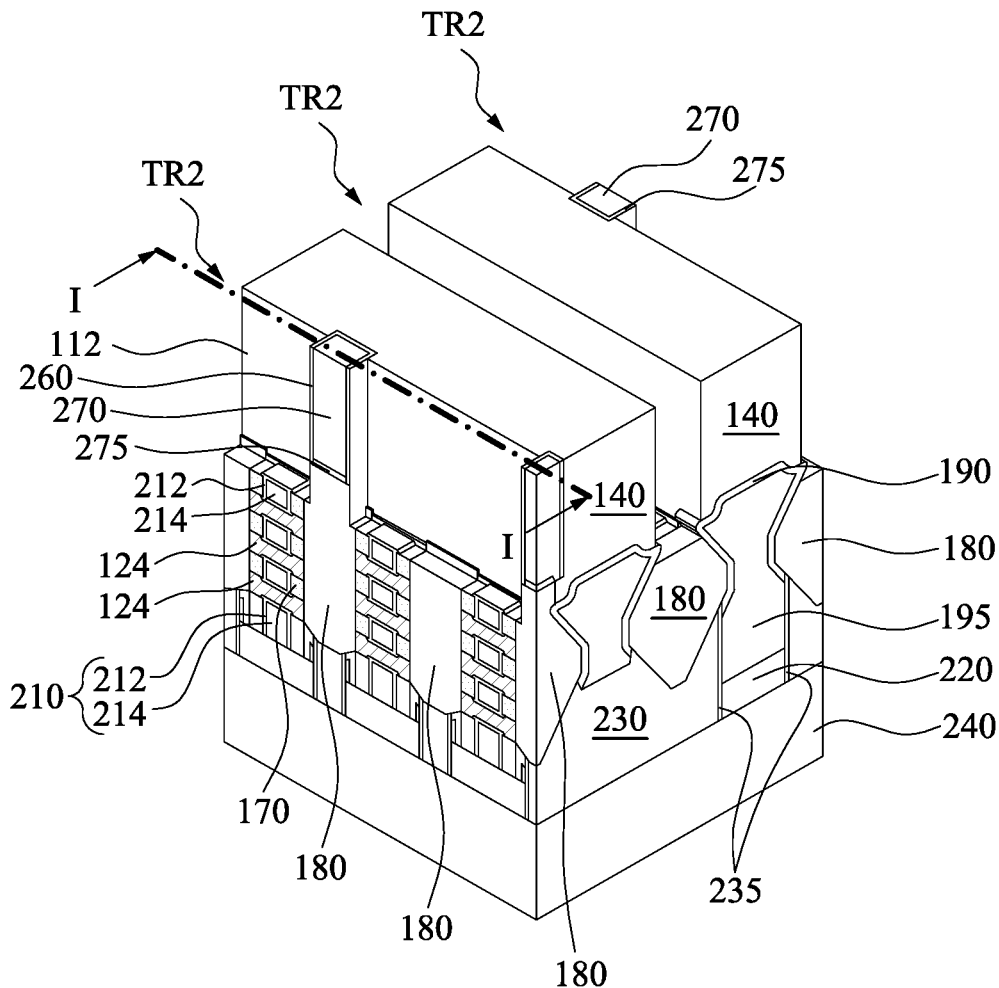
Figure 17B:
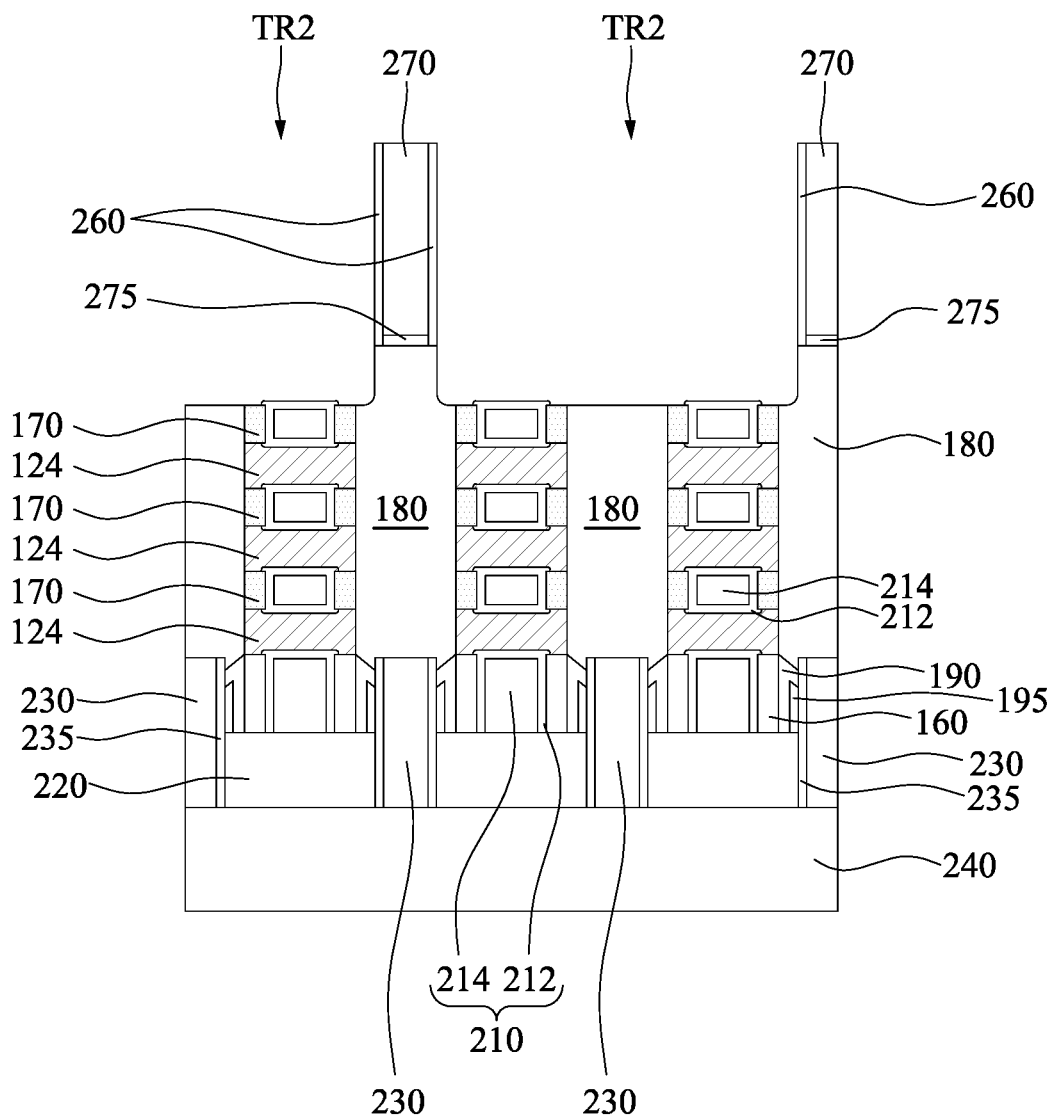

Reference is made to FIGS. 17A and 17B. The base portions 112 (see FIGS. 16A and 16B) are then removed to form trenches TR2 by using a selective etching process that etches the base portions 112 (e.g., Si) and the source/drain epitaxial structures 180 (e.g., SiGe) at a faster etch rate that it etches the backside vias 270 (e.g., metal) and the isolation structure 140 as well as the via liner layers 275 (e.g., dielectric materials). In some embodiments, the selective etching process for selectively removing the base portions 112 and the source/drain epitaxial structures 180 may be a wet etching process using a wet etching solution such as tetramethylammonium hydroxide (TMAH), potassium hydroxide (KOH), $NH_4OH$, the like or combinations thereof. After the removal process, the trenches TR2 expose the gate structures 210, the inner spacers 170, and the etched source/drain epitaxial structures 180.

Figure 18A:
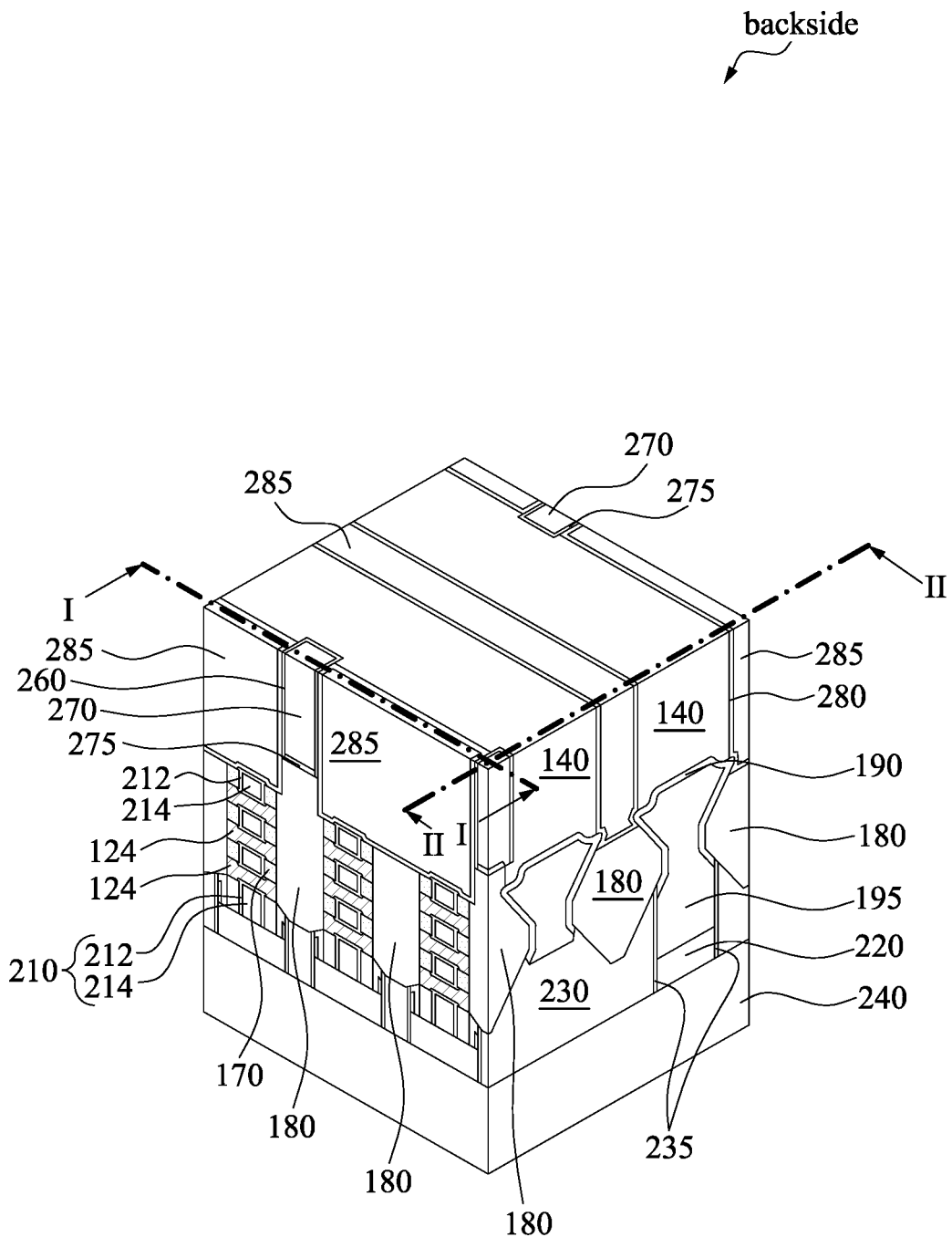
Figure 18B:
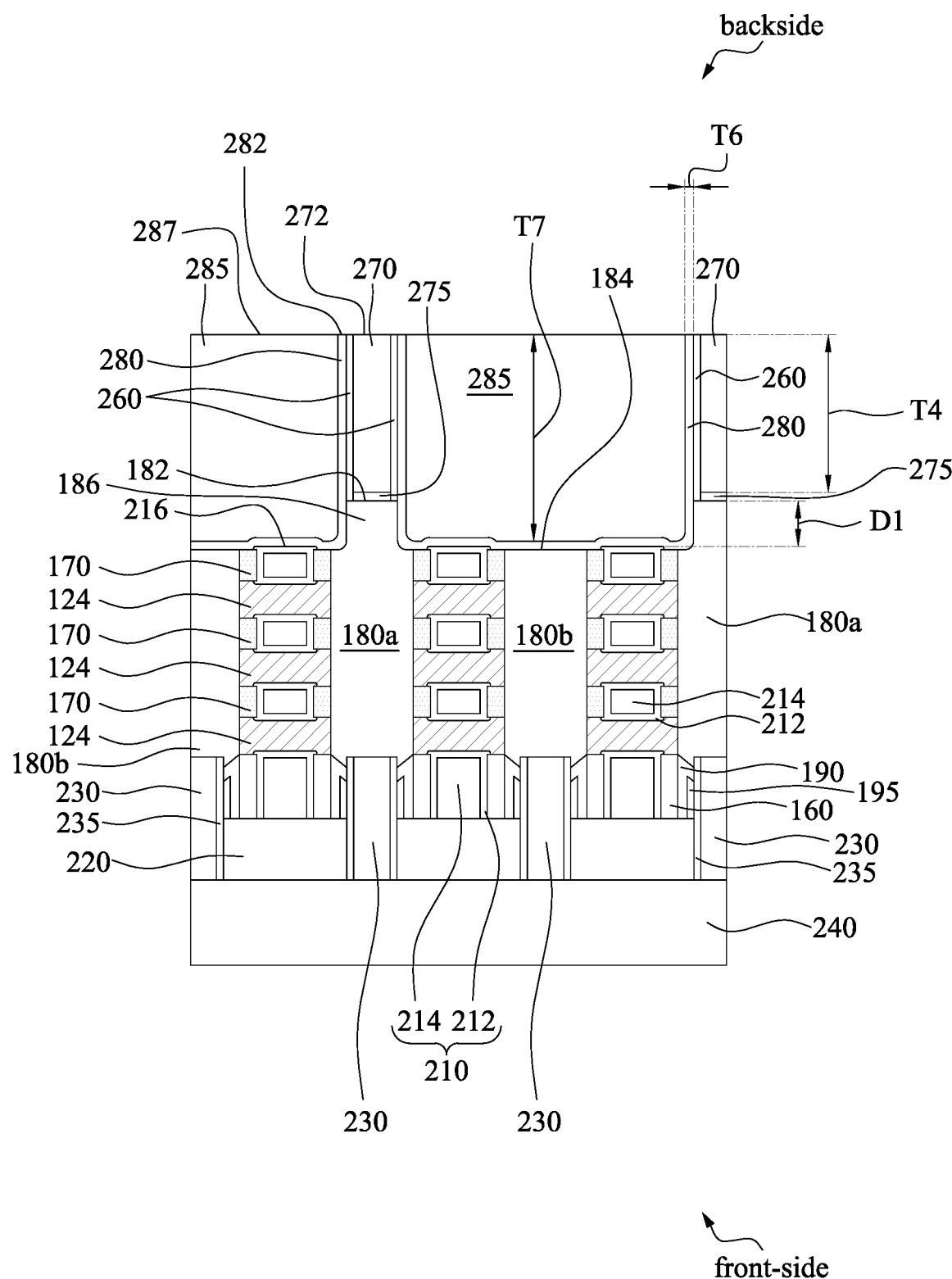
Figure 18C:
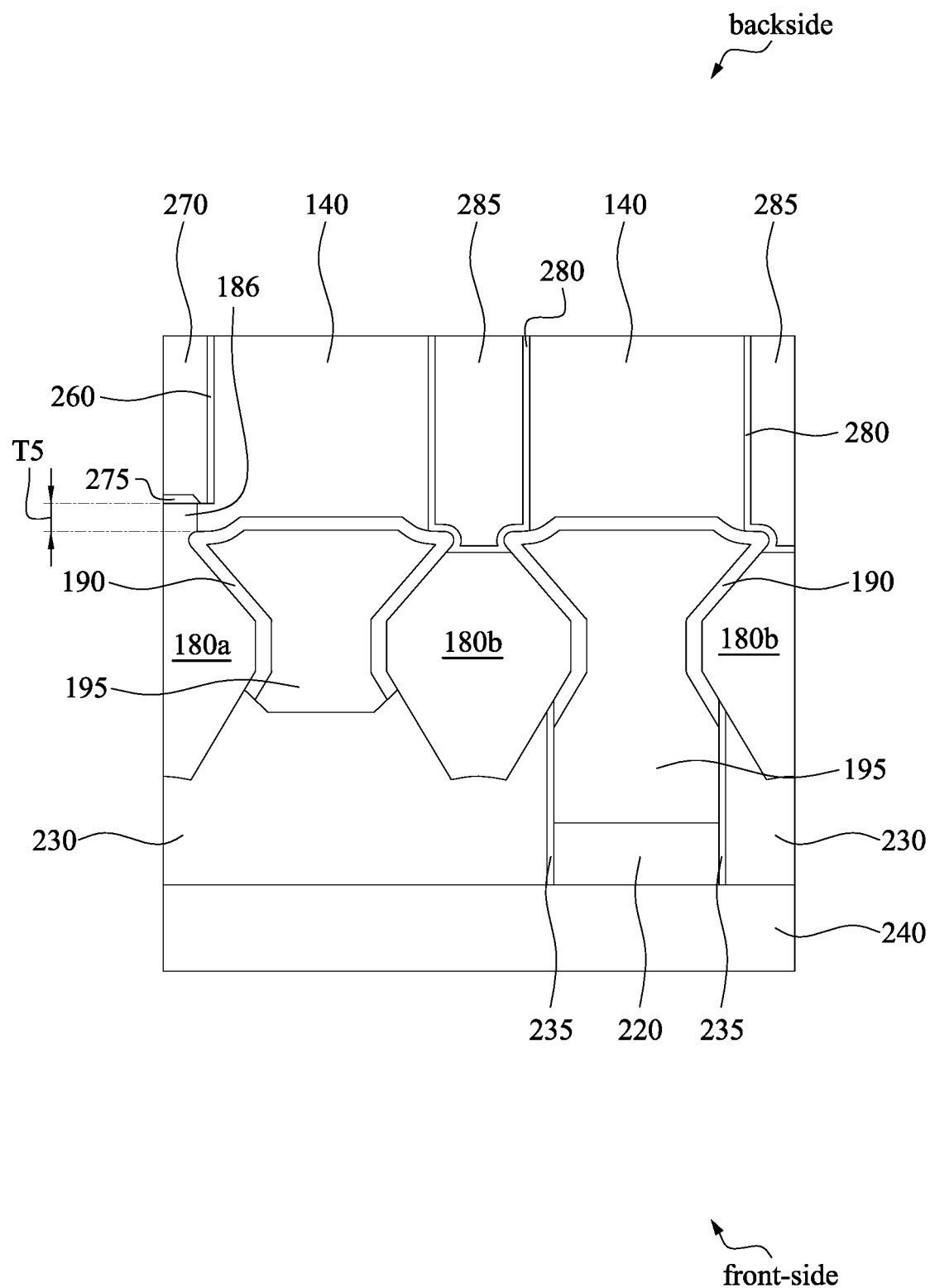

Reference is made to FIGS. 18A, 18B, and 18C. A backside etch stop layer 280 is conformally formed in the trenches TR2. Materials, configurations, dimensions, processes and/or operations regarding the backside etch stop layer 280 are similar to or the same as the CESL 190 of FIG. 8. In some embodiments, a thickness T5 of the backside etch stop layer 280 is in a range from about 0.5 nm to about 4 nm.

A backside ILD layer 285 is then formed on the backside etch stop layer 280 and fills the trenches TR2. Materials, configurations, dimensions, processes and/or operations regarding the backside ILD layer 285 are similar to or the same as the ILD layer 195 of FIG. 8.

In FIGS. 18A-18C, the semiconductor device includes the semiconductor layers (channel layers) 124, the gate structures 210, the source/drain epitaxial structures 180, and the backside vias 270. The gate structures 210 are across (or surround or warp around) the semiconductor layers 124. In some embodiments, the semiconductor device includes a plurality of semiconductor layers 124 arranged one above another in a spaced apart manner, and the gate structure surrounds each of the plurality of semiconductor layers 124. The source/drain epitaxial structures 180 on opposite sides of the gate structures 210 and are connected to the semiconductor layers 124. The backside vias 270 are connected to backsides of some of the source/drain epitaxial structures 180. For clarity, in FIGS. 18B and 18C, some of the source/drain epitaxial structures 180 that are connected to the backside vias 270 are labeled as 180a, and the rest of the source/drain epitaxial structures 180 that are not connected to the backside vias 270 are labeled as 180b.

As shown in FIG. 18B, the backside surface 182 of the source/drain epitaxial structure 180a is closer to the backside surface 272 of the backside via 270 than the backside surface 216 of the gate structure 210 is to the backside surface 272 of the backside via 270. State differently, the backside surface 182 of the source/drain epitaxial structure 180a is at a height between a height of the backside surface 272 of the backside via 270 and a height of the backside surface 216 of the gate structure 210. In some embodiments, a vertical distance D1 between the backside surface 182 of the source/drain epitaxial structure 180a and the backside surface 216 of the gate structure 210 is in a range of about 5 nm to about 50 nm. The long vertical distance D1 enlarges the isolation distance between the backside via 270 and the gate structure 210 and thus improves the short problem therebetween. That is, the backside via 270 is spaced apart from the gate structure 210 by the vertical distance D1.

Further, the backside surface 182 of the source/drain epitaxial structure 180a is also closer to the backside surface 272 of the backside via 270 than the backside surface 184 of the source/drain epitaxial structure 180b to the backside surface 272 of the backside via 270. That is, the source/drain epitaxial structure 180a is longer than the source/drain epitaxial structure 180b in FIG. 18B, or the source/drain epitaxial structure 180b is shorter than the source/drain epitaxial structure 180a in FIG. 18B. Stated differently, each of the source/drain epitaxial structures 180a has a portion protruding from the backside surface 216 of the gate structure 210 while there is no portion of the source/drain epitaxial structure 180b protruding from the backside surface 216 of the gate structure 210.

As shown in FIG. 18C, the source/drain epitaxial structure 180a has a portion 186 embedded in the isolation structures 140. That is, the portion 186 is in contact with the isolation structures 140. However, the source/drain epitaxial structures 180b are spaced apart from the isolation structures 140. In some embodiments, the portion 186 of the source/drain epitaxial structure 180a has a vertical thickness T5 in a range from about 5 nm to 15 nm. Further, the backside via 270 may be in contact with the isolation structure 140 as shown in FIG. 18C.

The semiconductor device further includes the via liner layers 260 directly on the source/drain epitaxial structures 180a and surrounding the backside vias 270, respectively. As shown in FIG. 18B, the via liner layers 260 are spaced apart from the inner spacers 170. Further, the source/drain epitaxial structures 180a may cover the entire sidewalls of some of the inner spacers 170 closest to the backside vias 270. In FIGS. 18B and 18C, the backside metal alloy layers 275 are between the backside via 270 and the corresponding source/drain epitaxial structure 180.

The semiconductor device further includes the backside etch stop layer 280 and the backside ILD layer 285. The backside etch stop layer 280 and the backside ILD layer 285 provide good electrical isolation between the gate structures 210 and portion 186 of the source/drain epitaxial structures 180a. In FIG. 18B, the backside etch stop layer 280 lines the sidewalls of the via liner layers 260, the sidewalls of the bottom portion 186 of the source/drain epitaxial structures 180a, the backside surface of the inner spacers 170, the backside surfaces 216 of the gate structures 210, and the backside surfaces of the source/drain epitaxial structures 180b. That is, the backside etch stop layer 280 is in contact with the via liner layers 260, the bottom portion 186, the inner spacers 170, the gate structures 210, and the source/drain epitaxial structures 180b but is spaced apart from the backside surface 186 of the source/drain epitaxial structures 180a. Further, the backside surface 272 of the backside via 270, a backside surface 182 of the backside etch stop layer 280, and a backside surface 187 of the backside ILD layer 285 are substantially coplanar. In FIG. 18C, the backside etch stop layer 280 further lines the sidewalls of the isolation structures 140 and the outer surfaces of the CESL 190. That is, the backside etch stop layer 280 is further in contact with the isolation structures 140 and the CESL 190. The backside ILD layer 285 is disposed over the backside etch stop layer 280 (on a backside of the gate structures 210) and surrounds the backside via 270. As shown in FIG. 18B, a vertical thickness T7 of the backside ILD layer 285 is greater than the vertical thickness T4 of the backside via 270.

The semiconductor device further includes the isolation structures 140. The isolation structures 140 and the backside ILD layers 285 may be arranged alternately as shown in FIG. 18A. Further, portions of the backside vias 270 are protrude into the isolation structures 140 in a top view (FIG. 18A) such that a portion of the isolation structure 140 is in contact with the backside via 270 in a cross-sectional view (FIG. 18C). The backside metal alloy layer 275 may be also in contact with the isolation structure 140.

FIGS. 19-23 illustrate a method for manufacturing a semiconductor device (or an integrated circuit structure) at various stages in accordance with some embodiments of the present disclosure. Throughout the various views and illustrative embodiments, like reference numbers are used to designate like elements. The present embodiment may repeat reference numerals and/or letters used in FIGS. 1-18C. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 19-23.

Figure 19:
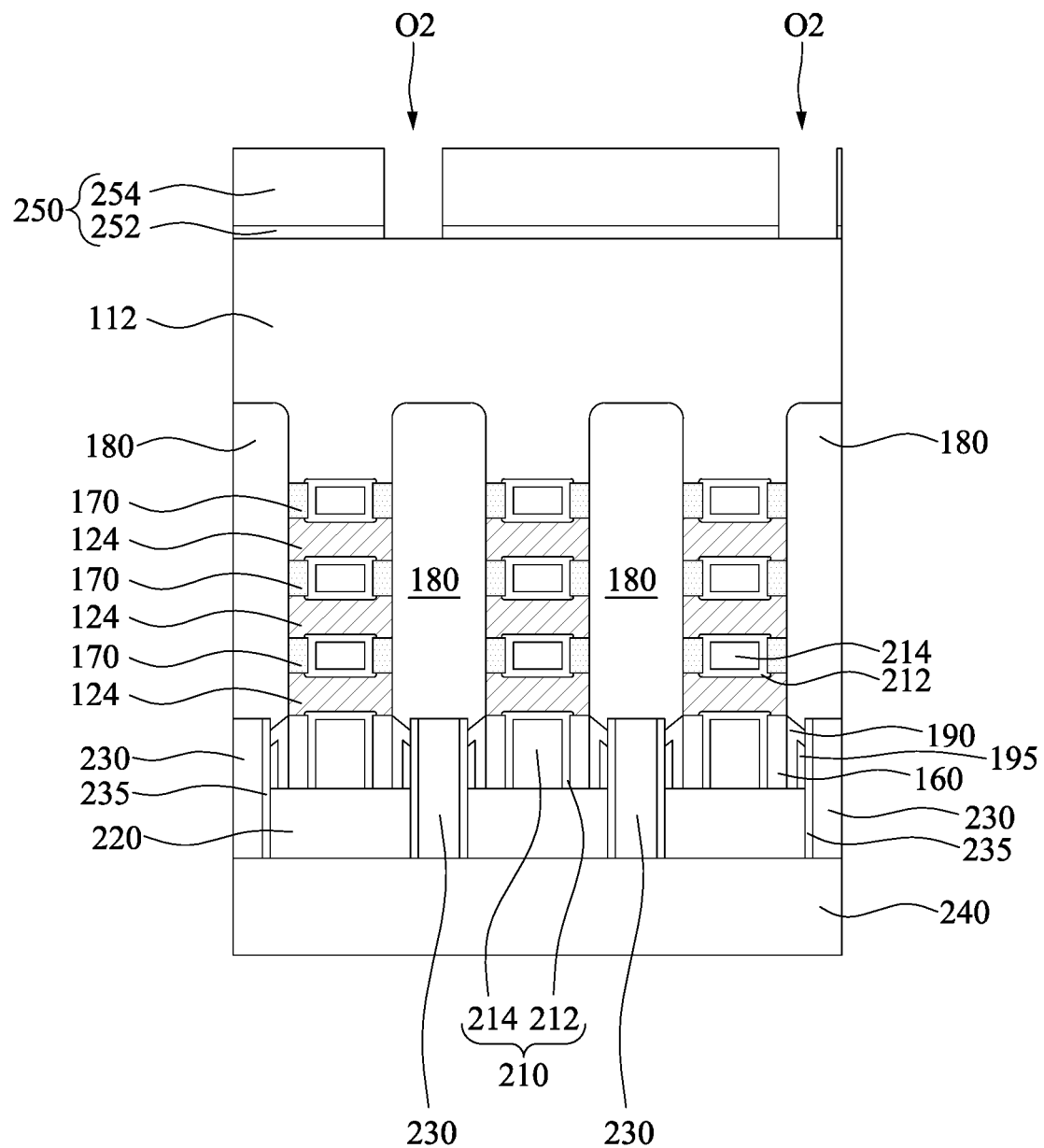
FIGS. 19-23 illustrate a method for manufacturing a semiconductor device (or an integrated circuit structure) at various stages in accordance with some embodiments of the present disclosure.

As shown in FIG. 14B, the via openings O2 are directly above the corresponding source/drain epitaxial structures 180. That is, the via openings O2 are aligned with the corresponding source/drain epitaxial structures 180. However, in some other embodiments, as shown in FIG. 19 for example, the via openings O2 may be misaligned with the corresponding source/drain epitaxial structures 180. The misalignment between the via openings O2 and the corresponding source/drain epitaxial structures 180 may be due to the overlay issue during the patterning process.

Figure 20:
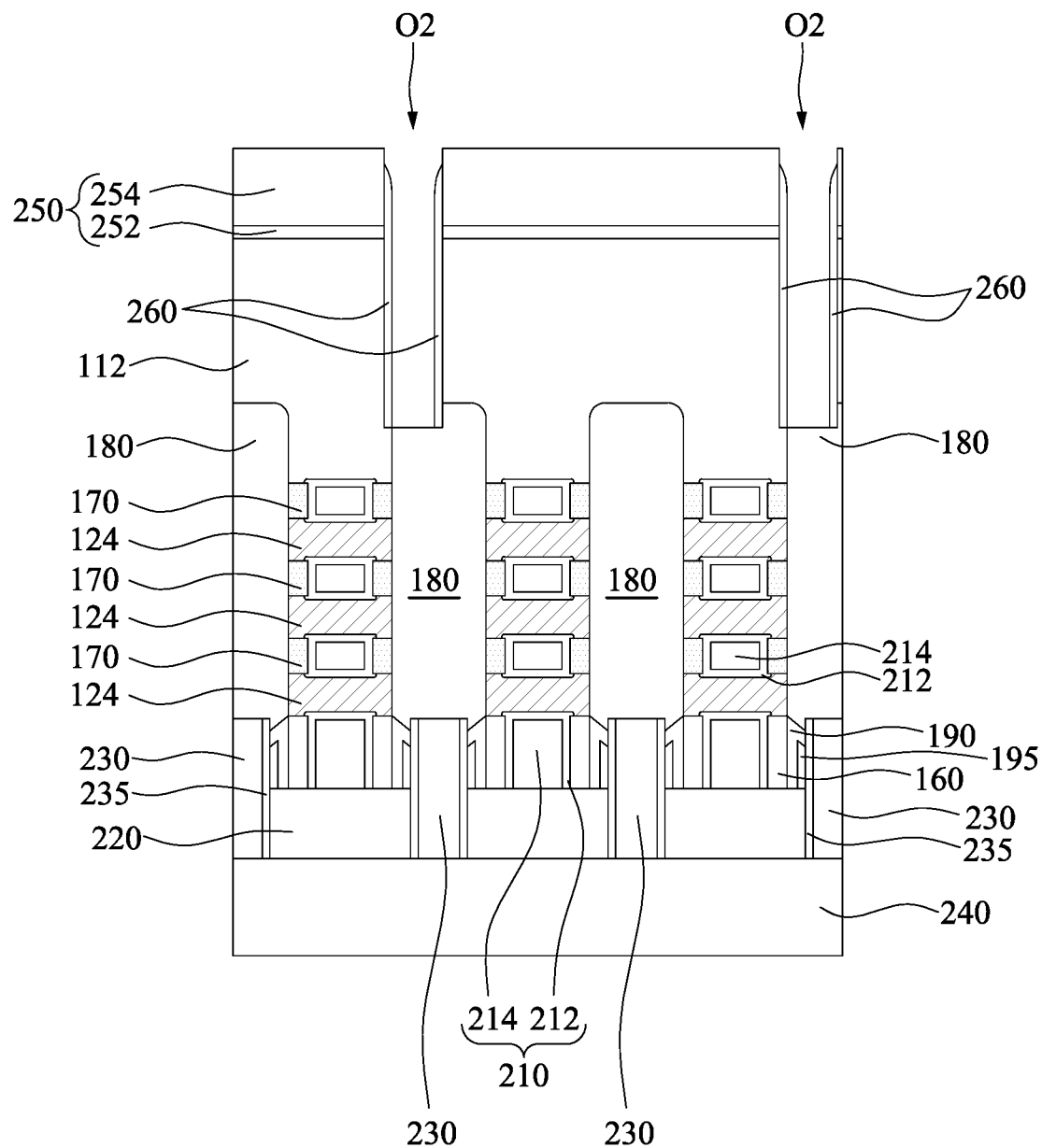

Reference is made to FIG. 20, the via openings O2 are deepened to expose the corresponding source/drain epitaxial structures 180. Subsequently, via liner layers 260 are formed on the inner sidewalls of the via openings O2. Materials, configurations, dimensions, processes and/or operations regarding the via liner layers 260 are similar to or the same as the via liner layers 260 of FIGS. 15A and 15B.

Figure 21:
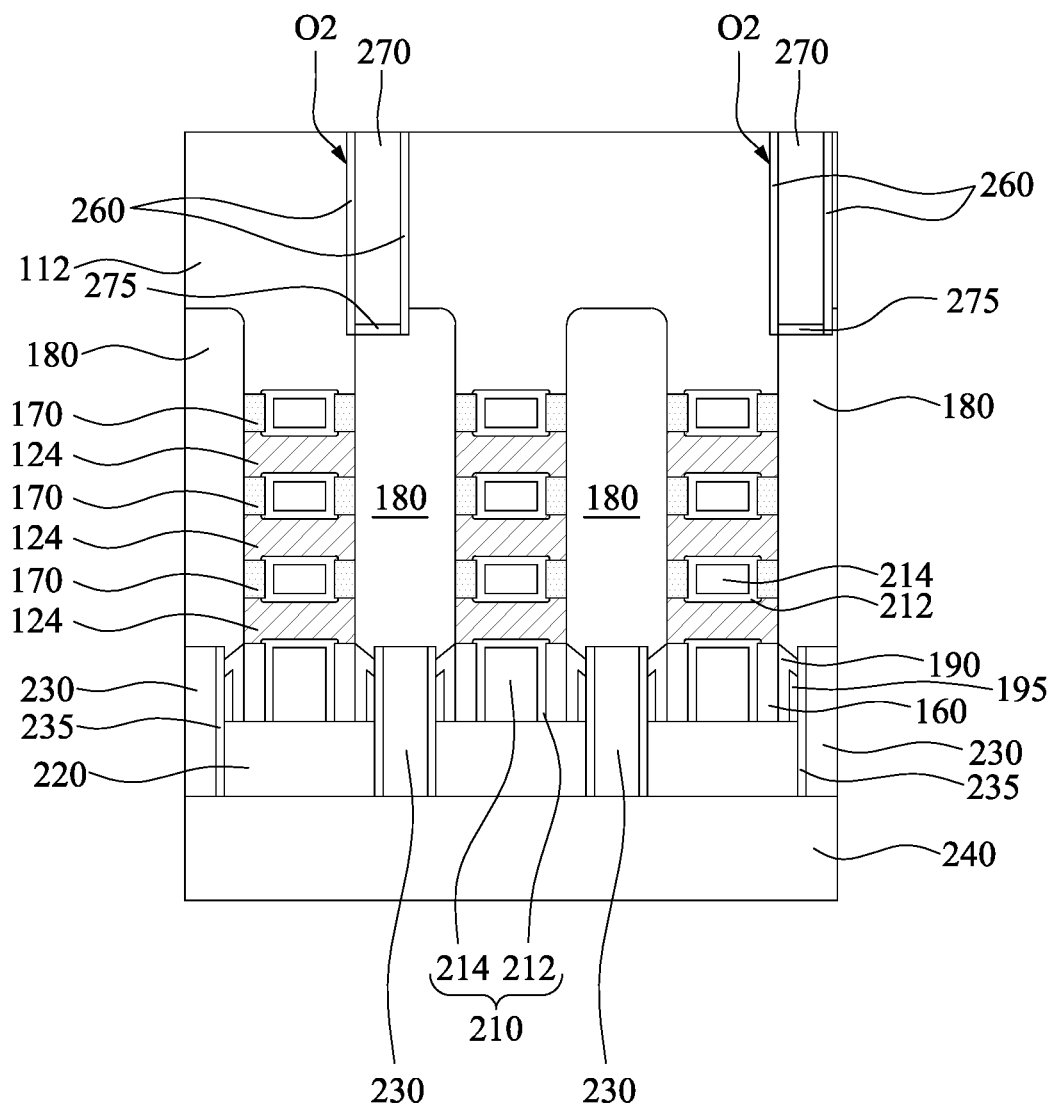

Reference is made to FIG. 21. Backside metal alloy layers 275 are formed in the via openings O2 and cover the source/drain epitaxial structures 180. Materials, configurations, dimensions, processes and/or operations regarding the backside metal alloy layers 275 are similar to or the same as the front-side metal alloy layers described in FIG. 11.

Subsequently, backside vias 270 are formed in the via openings O2 and above the backside metal alloy layers 275. After the deposition of the backside vias 270, a planarization process, such as a chemical mechanical planarization (CMP) process, may be then performed to remove the hard mask stack 250 (see FIG. 20) and portions of the via liner layers 260 and the backside vias 270 therein. Materials, configurations, dimensions, processes and/or operations regarding the backside vias 270 are similar to or the same as the backside vias 270 described in FIGS. 16A and 16B.

Figure 22:
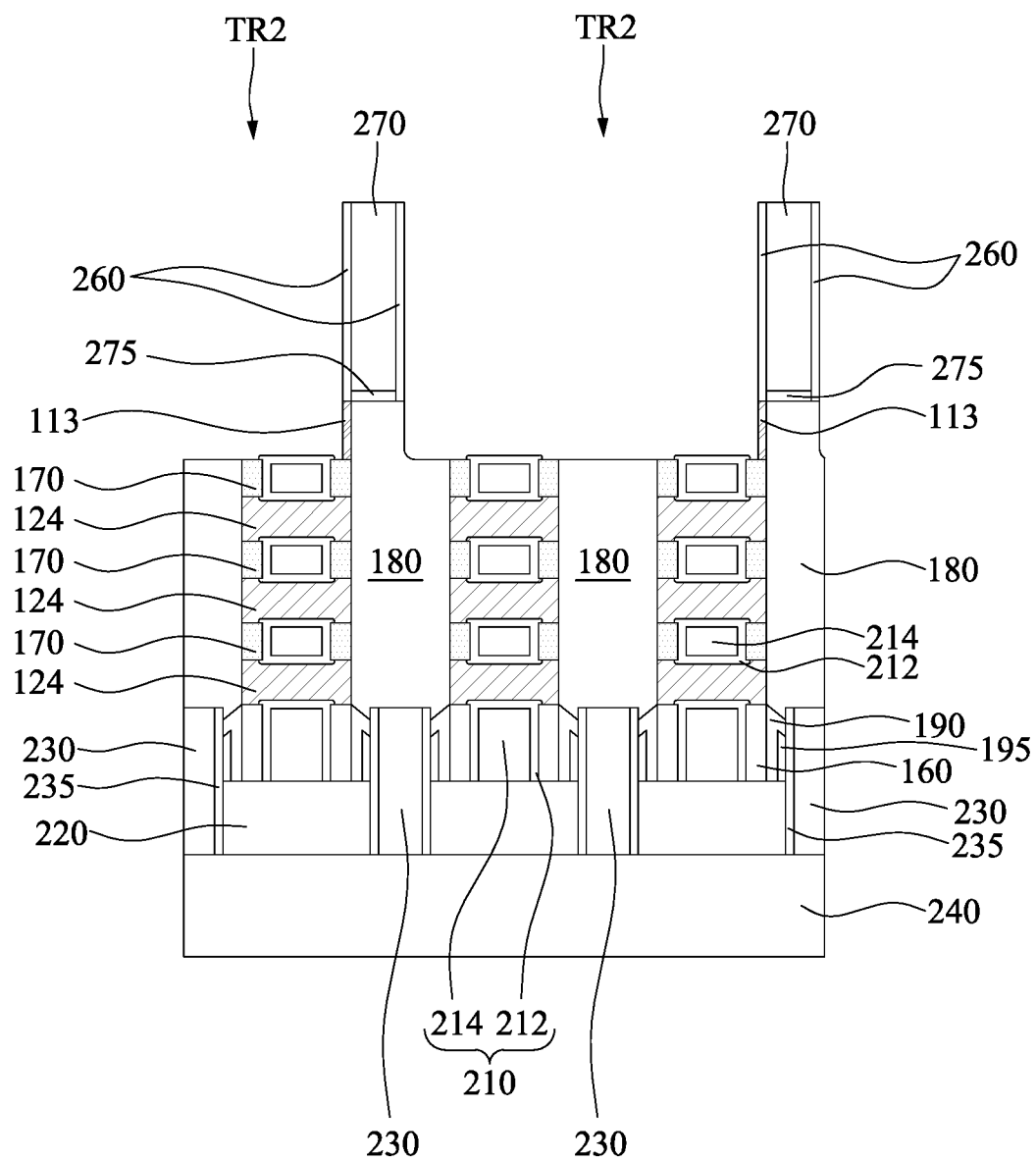

Reference is made to FIG. 22. The base portions 112 (see FIG. 21) are then removed to form trenches TR2. As shown in FIGS. 21 and 22, since parts of the base portions 112 are directly under the via liner layers 260 (and/or directly under the backside vias 270), these parts of the base portions 112 may not be removed and then remain directly under the via liner layers 260 (and/or directly under the backside vias 270). Therefore, these parts of the base portions 112 may be referred to as semiconductive residues (or substrate residues) 113 in some embodiments.

Figure 23:
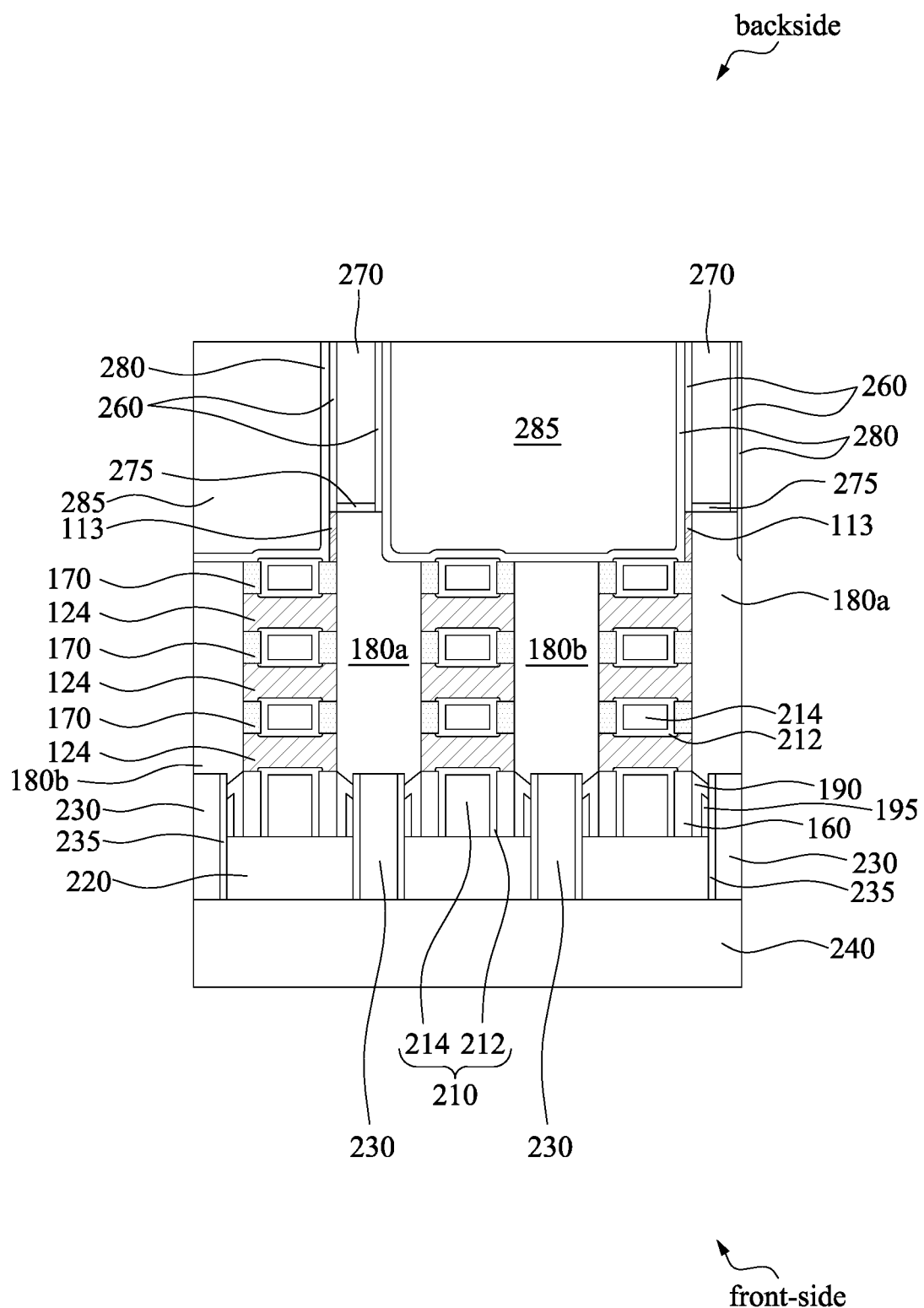

Reference is made to FIG. 23. A backside etch stop layer 280 is conformally formed in the trenches TR2. Materials, configurations, dimensions, processes and/or operations regarding the backside etch stop layer 280 are similar to or the same as the CESL 190 of FIG. 8. A backside ILD layer 285 is then formed on the backside etch stop layer 280 and fills the trenches TR2. Materials, configurations, dimensions, processes and/or operations regarding the backside ILD layer 285 are similar to or the same as the ILD layer 195 of FIG. 8.

The semiconductor device in FIG. 23 is similar to the semiconductor device in FIG. 18B except the semiconductive residues 113. The semiconductive residues 113 is disposed between the via liner layer 260 (or the backside via 270) and the inner spacer 170. Specifically, at least one of the semiconductive residues 113 is surrounded by the via liner layer 260 (or the backside via 270), the source/drain epitaxial structure 180a, the inner spacer 170, and the backside etch stop layer 280. For example, at least one of the semiconductive residues 113 is in contact with the via liner layer 260 (or the backside via 270), the source/drain epitaxial structure 180a, the inner spacer 170, and the backside etch stop layer 280 but is spaced apart from the gate structure 210. Further, the semiconductive residue 113 is directly between the via liner layer 260 and the inner spacer 170.

FIGS. 24-37 illustrate a method for manufacturing a semiconductor device (or an integrated circuit structure) at various stages in accordance with some embodiments of the present disclosure. Throughout the various views and illustrative embodiments, like reference numbers are used to designate like elements. The present embodiment may repeat reference numerals and/or letters used in FIGS. 1-18C. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 24-37.

Figure 24:
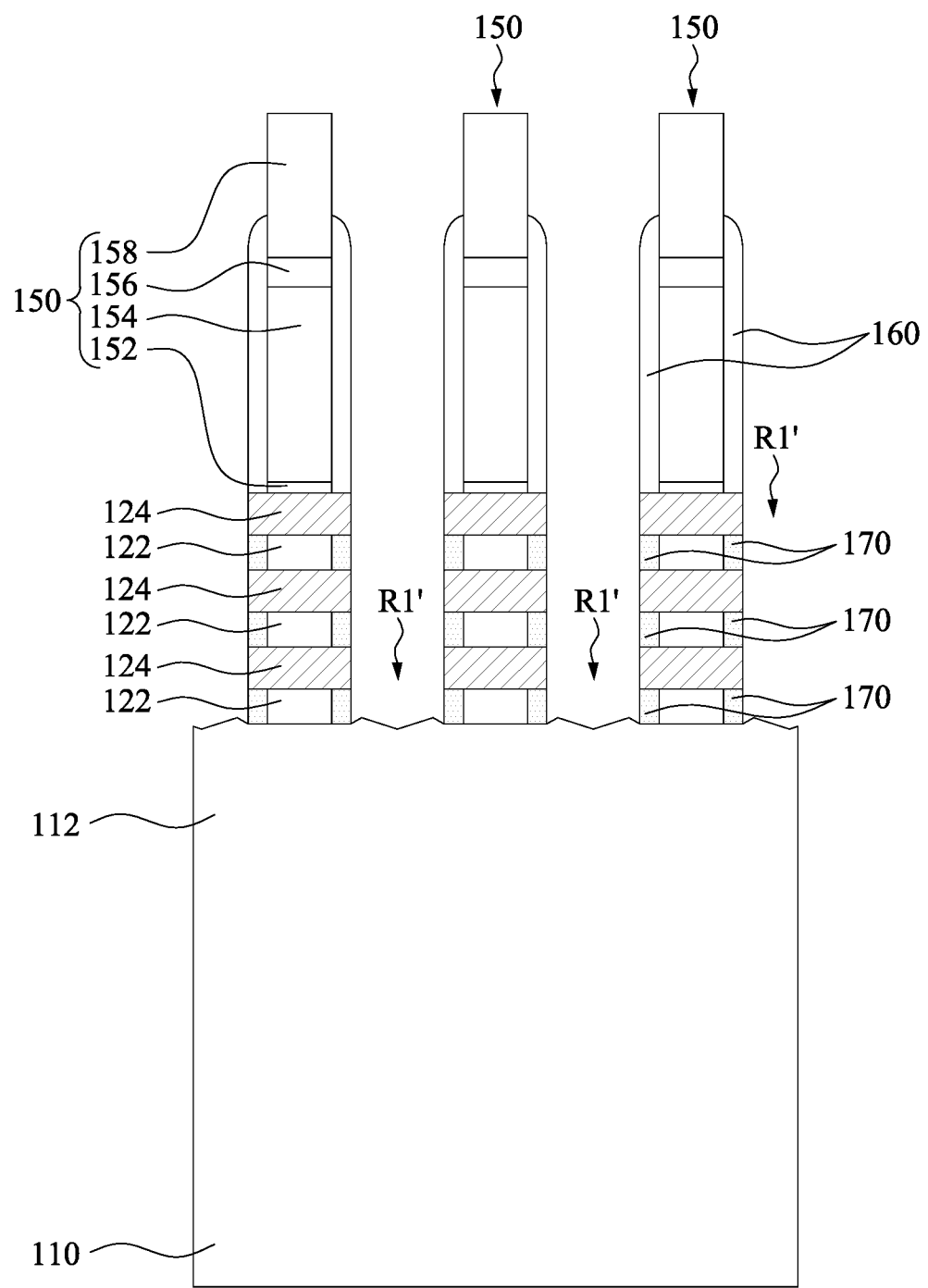
FIGS. 24-37 illustrate a method for manufacturing a semiconductor device (or an integrated circuit structure) at various stages in accordance with some embodiments of the present disclosure.

Reference is made to FIG. 24. Similar to FIG. 6, inner spacers 170 are formed on opposite sides of the semiconductor layers 122. In some embodiments, during the SSD etching process (see FIG. 4), by controlling the etching parameters (e.g., duration time, etching gas flow, bias power, etc.), the base portions 112 are slightly recessed and form recesses R1' which are shallower than the recesses R1 in FIG. 4.

Figure 25:
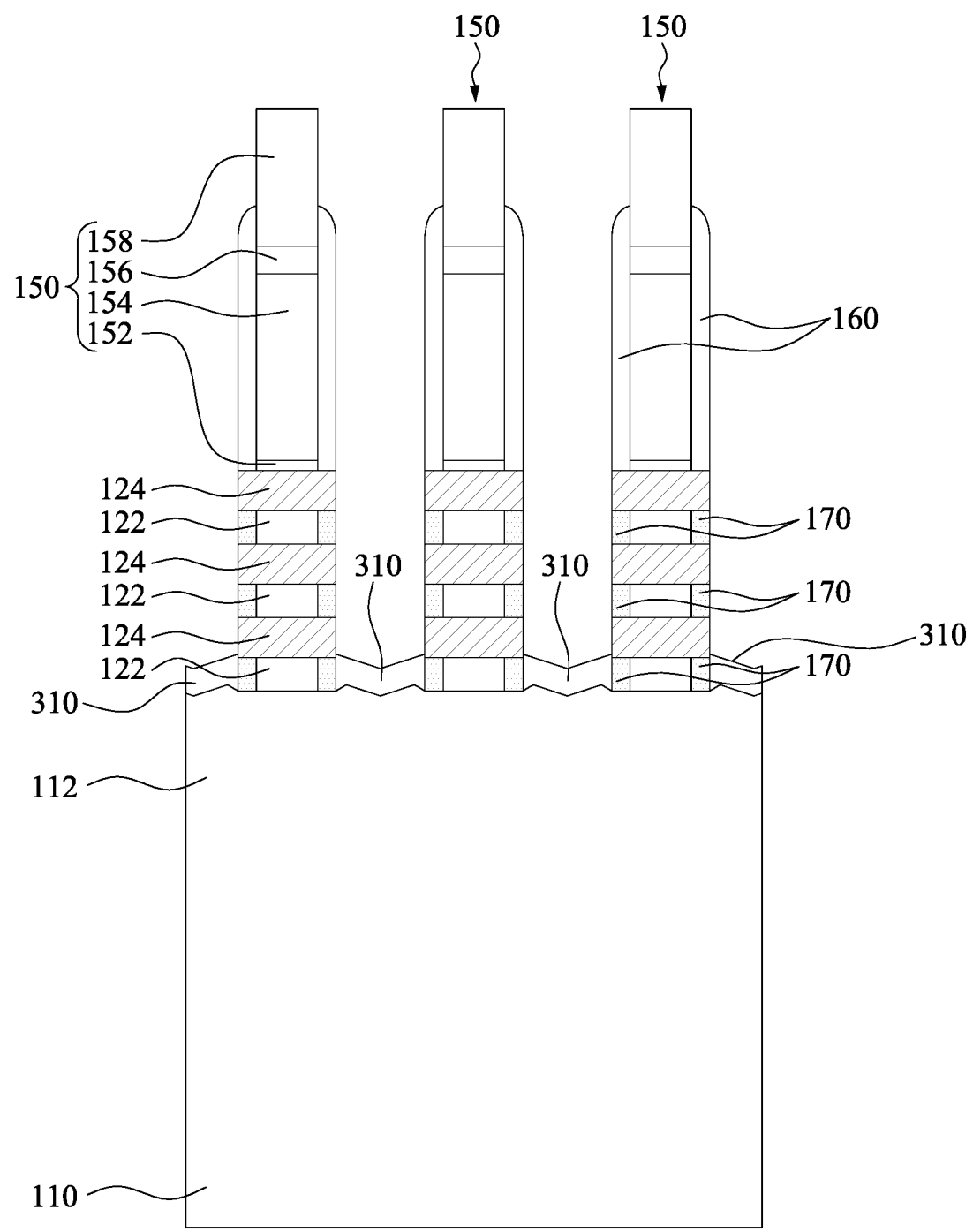

Reference is made to FIG. 25. Optionally, isolation layers 310 are formed in the recesses R1'. In some embodiments, the isolation layers 310 is made of dielectric materials, such as silicon carbide (SiC), silicon oxycarbonitride (SiOCN), silicon oxycarbide (SiOC), silicon carbonitride (SiCN), h silicon oxide (SiO), high-k dielectric materials, combinations or multiple layers thereof, or the like, formed by any suitable method, such as CVD, ALD, PVD, PECVD, or the like. As shown in FIG. 25, the isolation layers 310 are substantially spaced apart from the semiconductor layers 124, such that the isolation layers 310 do not block the sidewalls of the semiconductor layers 124.

Figure 26:
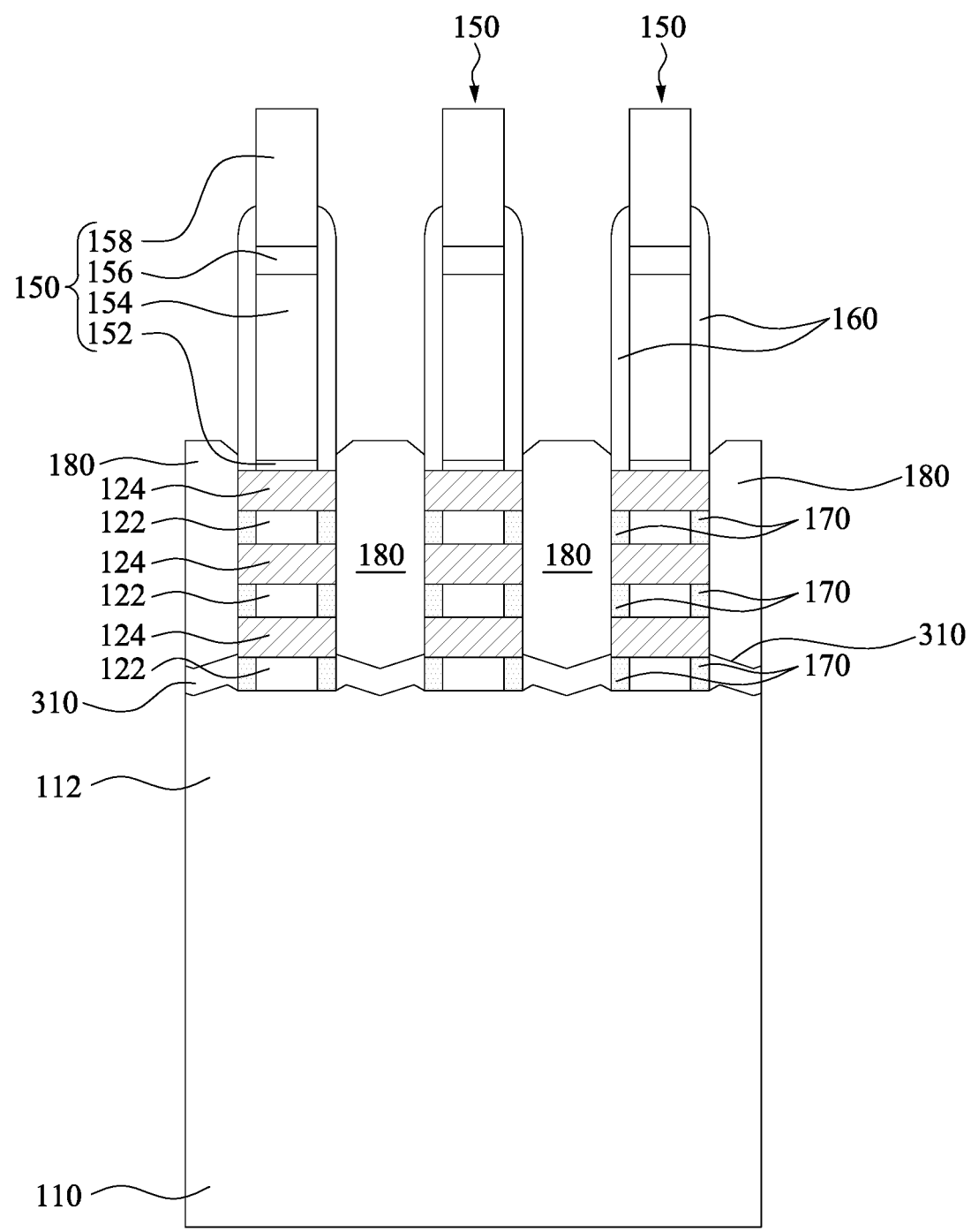

Reference is made to FIG. 26. Source/drain epitaxial structures 180 are formed on the isolation layers 310. Materials, configurations, dimensions, processes and/or operations regarding the source/drain epitaxial structures 180 are similar to or the same as the source/drain epitaxial structures 180 of FIG. 7.

Figure 27:
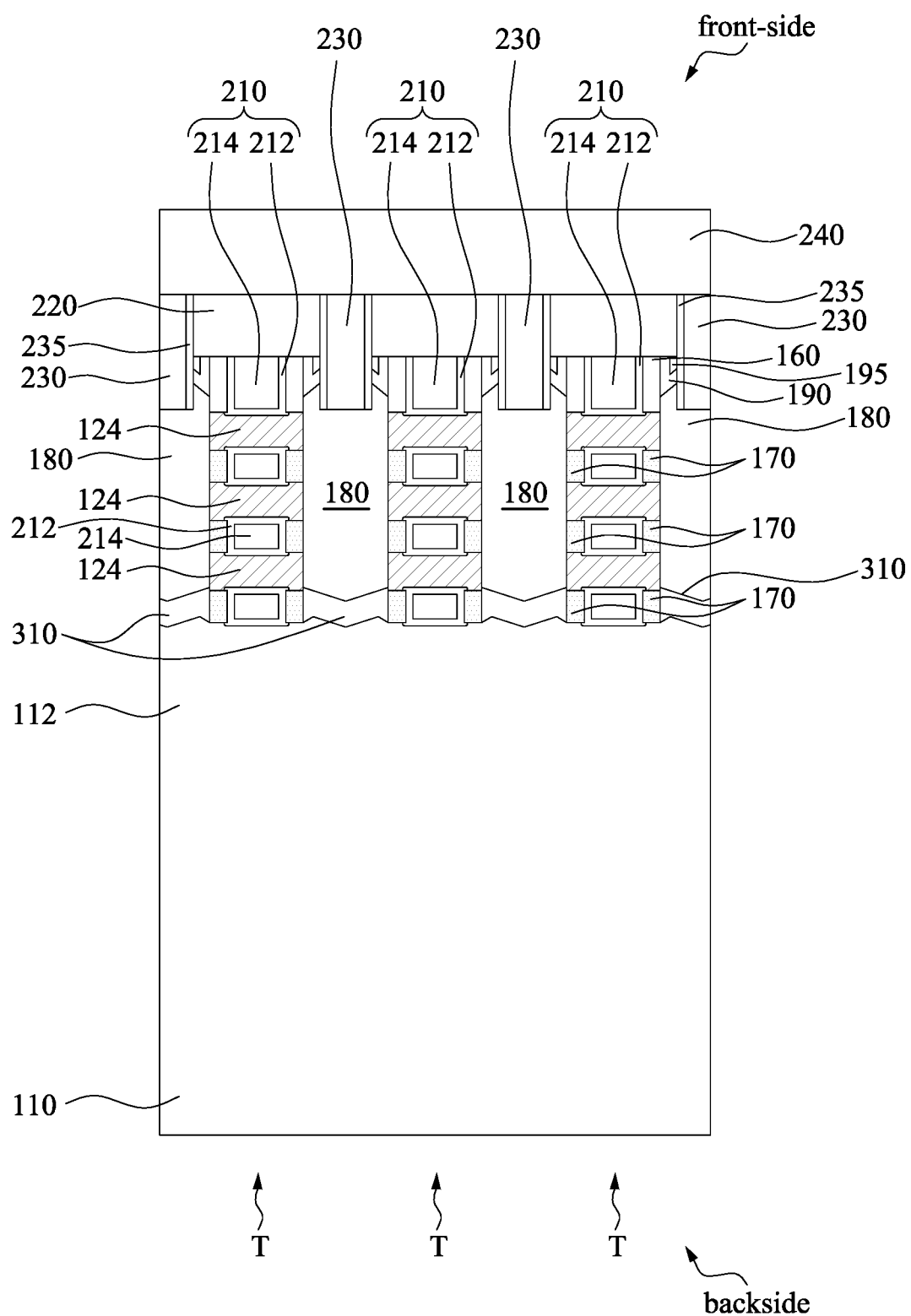

Reference is made to FIG. 27. The structure in FIG. 26 undergoes the processes illustrated in FIGS. 8-12B. That is, the CESL 190 and the ILD layers 195 are formed to cover the source/drain epitaxial structures 180, as shown in FIG. 8. The dummy gate structures 150 and the semiconductor layers 122 are then removed as shown in FIG. 9. The gate structures 210 are formed in the gate trenches as shown in FIG. 10. The ILD layer 220 is formed to cover the gate structures 210, and the contact liner layers 235 and the front-side contacts 230 are formed in the ILD layers 220 and 190, as shown in FIG. 11. The front-side MLI structure 240 is then formed over the ILD layer 220 and the front-side contacts 230. Transistors T are formed on the front-side of the substrate 110.

Figure 28:
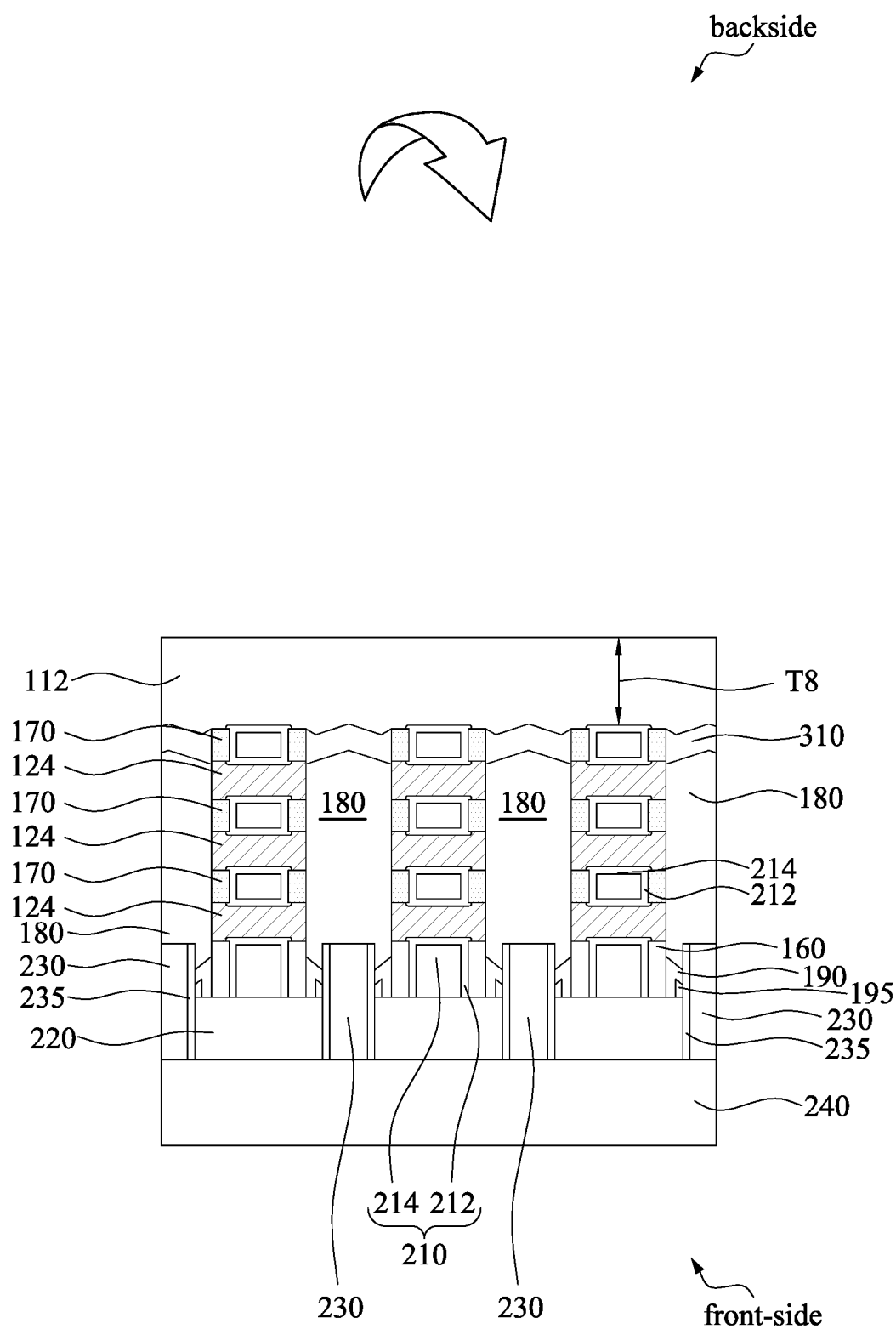

Reference is made to FIG. 28. Similar to FIGS. 13A and 13B, the structure illustrated in FIG. 27 is "flipped" upside down, and the substrate 110 is thinned to expose the isolation structures 140 (not shown in FIG. 28) and the base portions 112. In some embodiments, the substrate 110 is thinned down from the backside thereof until the isolation structures 140 are exposed. In some embodiments, the thickness T8 of the thinned base portions 112 is in a range from about 10 nm to about 50 nm.

Figure 29:
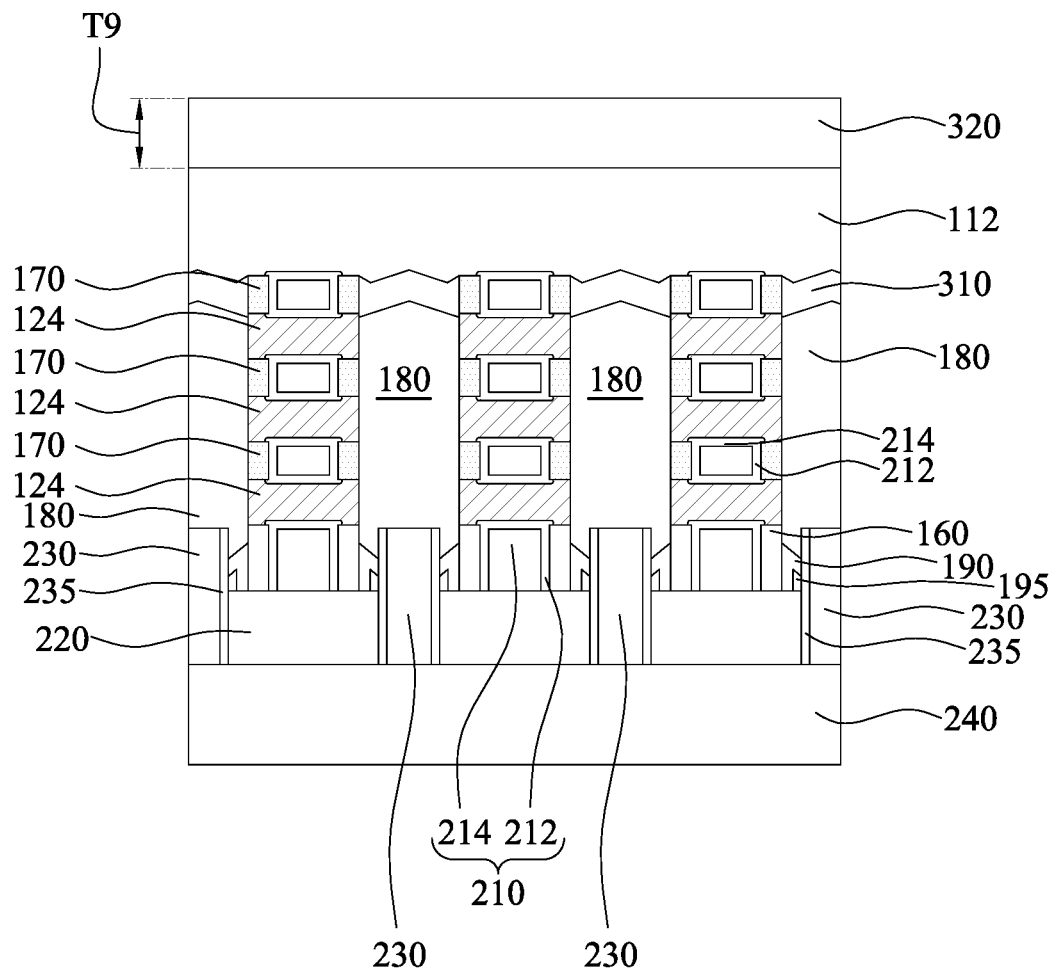

Reference is made to FIG. 29. A middle contact etch stop layer (MCESL) 320 is then formed over the base portions 112 and the isolation structures. The MCESL 320 may be formed by a PECVD process and/or other suitable deposition processes. In some embodiments, the MCESL 320 is a silicon nitride layer and/or other suitable materials. In some other embodiments, the MCESL 320 is made of SiC, LaO, AlO, AlON, ZrO, HfO, Si, ZnO, ZrN, ZrAlO, TiO, TaO, YO, TaCN, ZrSiO, SiOCN, SiOC, SiCN, HfSiO, SiO, or combinations thereof. In some embodiments, the thickness T9 of the MCESL 320 is in a range from about 5 nm to about 20 nm.

Figure 30:
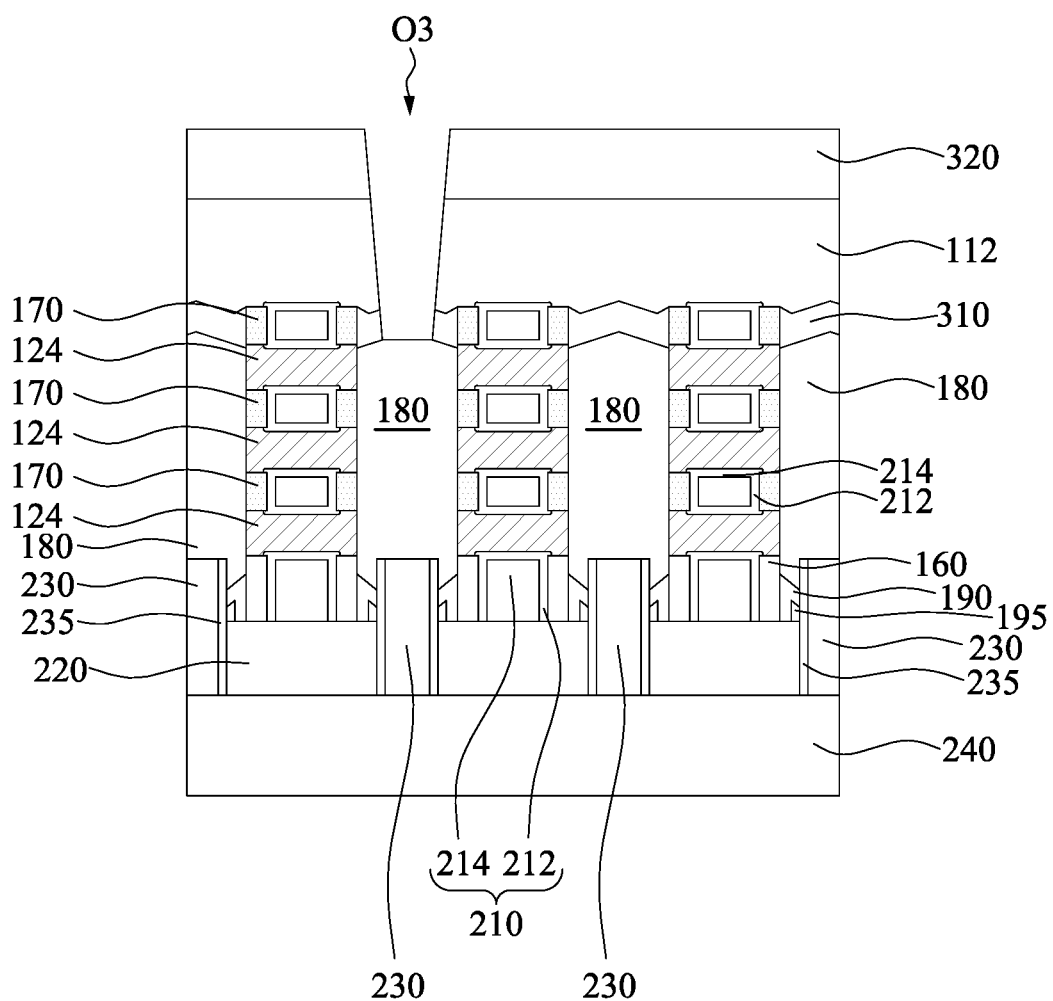

Reference is made to FIG. 30. The MCESL 320, the base portions 112, and the isolation layers 310 (if exist) are patterned to form at least one via opening O3 extending through the MCESL 320, the base portions 112, and the isolation layers 310 (if exist) by using one or more etching process(es). In some embodiments, before the one or more etching process(es), a photolithography process is performed to define expected top-view patterns of the via opening O3. For example, the photolithography process may include spin-on coating a photoresist layer over the MCESL 320, performing post-exposure bake processes, and developing the photoresist layer to form a patterned mask with the top-view patterns of the via opening O3. In some embodiments, patterning the photoresist to form the patterned mask may be performed using an electron beam (e-beam) lithography process or an extreme ultraviolet (EUV) lithography process. In some embodiments, the one or more etching process(es) is an anisotropic etching process, such as a plasma etching. After the one or more etching process(es), the via opening O3 exposes the corresponding source/drain epitaxial structure 180.

Figure 31:
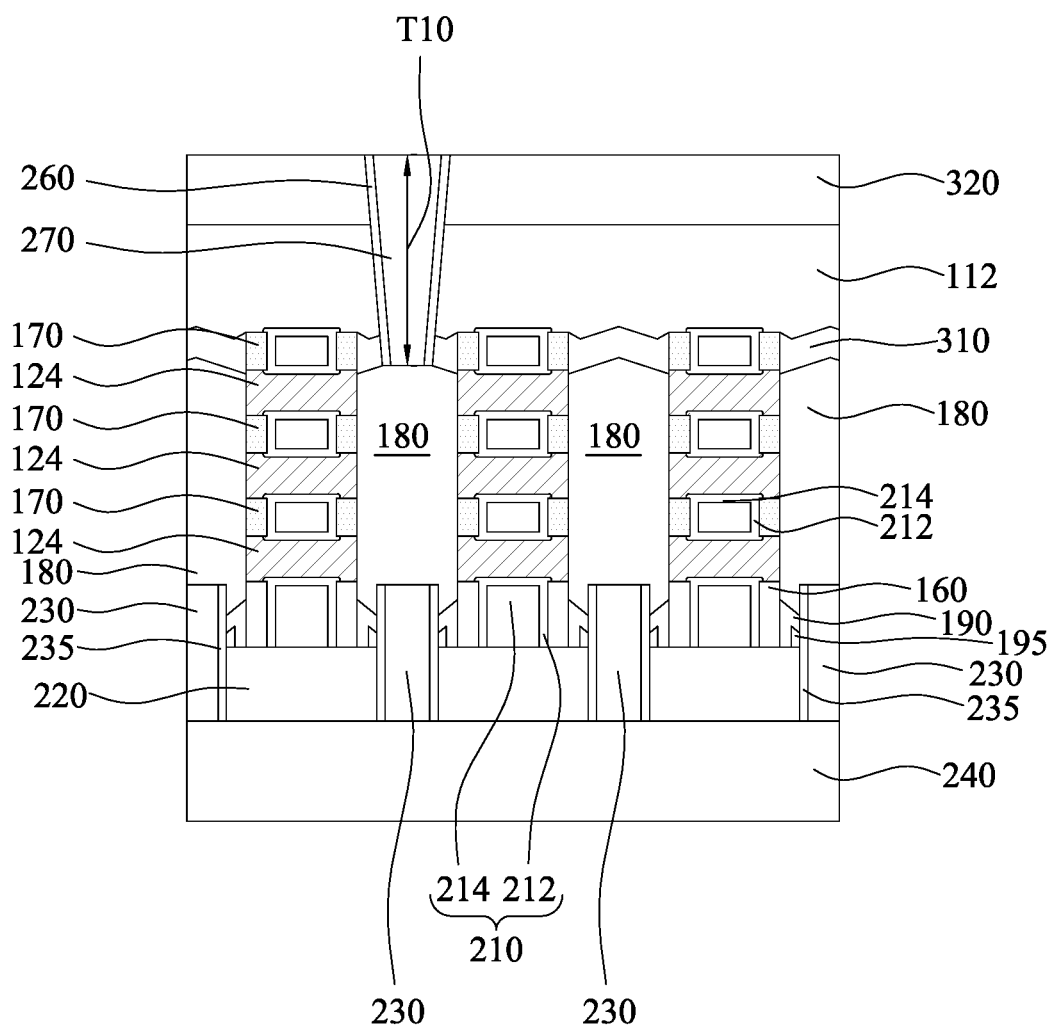

Reference is made to FIG. 31. Via liner layers 260 are formed on inner sidewalls of the via opening O3, and a backside via 270 is formed in the via opening O3 and above the corresponding source/drain epitaxial structures 180. The via liner layers 260 are in contact with the base portion 112 and the etch stop layer 320. In some embodiments, the via liner layers 260 is made of SiC, LaO, AlO, AlON, ZrO, HfO, SiN, Si, ZnO, ZrN, ZrAlO, TiO, TaO, YO, TaCN, ZrSiO, SiOCN, SiOC, SiCN, HfSiO, SiO, or combinations thereof. In some embodiments, a backside metal alloy layer can be formed over the corresponding source/drain epitaxial structures 180 prior to forming the backside via 270. In some embodiments, a vertical thickness T10 of the backside via 270 is in a range from about 15 nm to about 70 nm. In some embodiments, a barrier layer (if exist) of the backside via 270 has a thickness in a range from about 0.3 nm to about 5 nm. Configurations, dimensions, processes and/or operations regarding the via liner layers 260 are similar to or the same as the via liner layers 260 of FIGS. 15A and 15B. Materials, configurations, dimensions, processes and/or operations regarding the backside via 270 are similar to or the same as the backside via 270 of FIGS. 16A and 16B.

Figure 32:
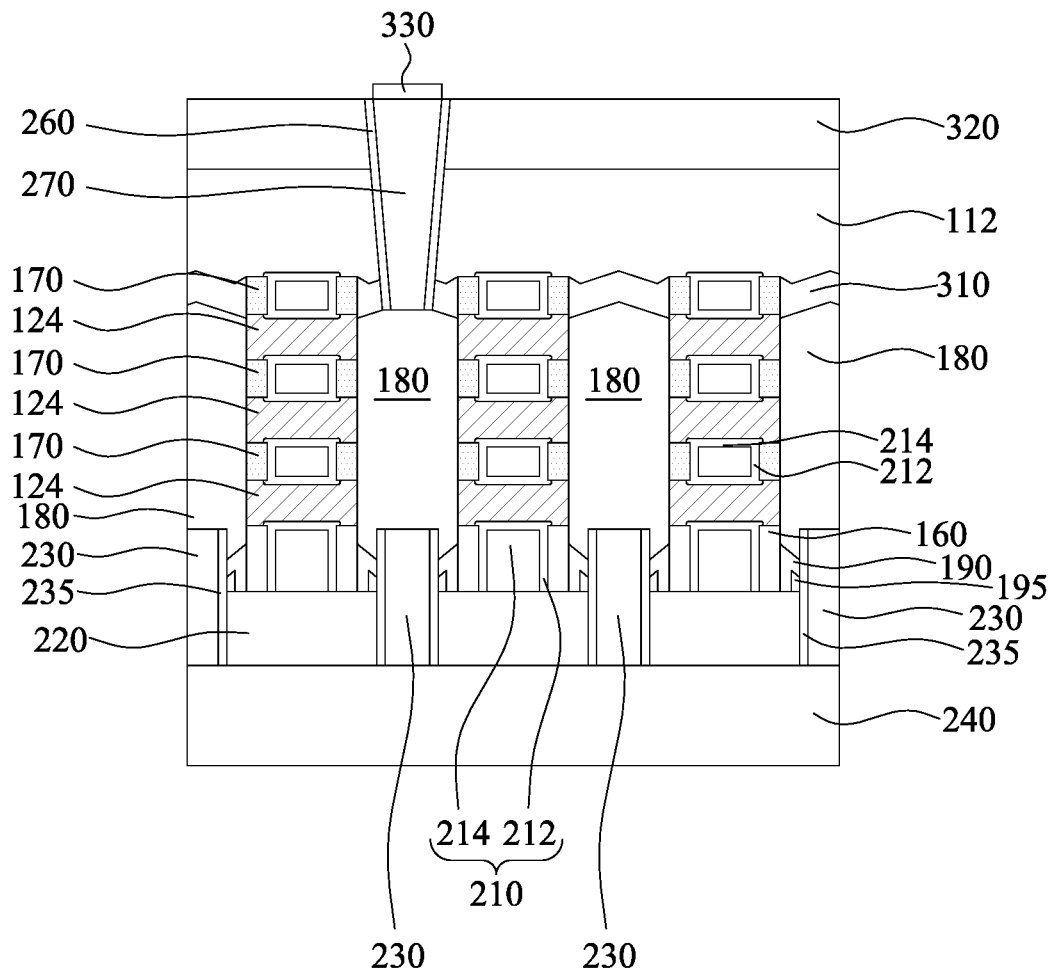

Reference is made to FIG. 32. A blocking layer 330 is formed over metals (e.g., the backside via 270 in this case). That is, the blocking layer 330 is deposited over the backside via 270 and spaced apart from the MCESL 320. In some embodiments, the blocking layer 330 is amphiphilic like molecules such as organic polymer, benzotriazole (BTA), or self-assemble monolayer (SAM).

In some embodiments, the blocking layer 330 is made of BTA. The structure of FIG. 31 can be disposed in a depositing chamber, and (vapored or liquid) BTA as well as reaction gases are introduced into the depositing chamber. Due to the material properties, BTA molecules have a tendency not to adhere to the surface of dielectric materials (e.g., the MCESL 320 and the vis liner layers 260) and have a tendency to adhere to the surfaces of metals (e.g., the backside via 270 in this case). As such, the blocking layer 330 is formed over the backside via 270.

In some embodiments, the blocking layer 330 is made of SAM. The SAM includes silane-type inhibitor or thiol-type inhibitor. In some embodiments, the silane-type inhibitor may be Octadecyltrichlorosilane ($CH_3(CH_2)_{17}SiCl_3$), Trichloro (1H, 1H, 2H, 2H-perfluorooctyl)silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si—NC_4H_8$), Hexamethyldisilazane ($[(CH_3)_3Si]_2NH$), or Bis(dimethylamino) dimethylsilane ($[(CH_3)_2N]_2Si(CH_3)_2$). In some embodiments, the thiol-type inhibitor are alkanethiol, propanethiol, butanethiol, hexanethiol, heptanethiol, Octadecanethiol, nonanethiol, or dodecanethiol. In some embodiments, thiol-type inhibitor are selectively formed on a metal layer, and not formed on a dielectric layer.

In some embodiments where the blocking layer 330 is a self-assemble monolayer (SAM), the molecules of the blocking layer 330 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the blocking layer 330 includes alkanethiols (X—$(CH_2)_n$—SH), the head group can be bound to a surface of a metal material. As such, the blocking layer 330 can be selectively formed (grown) on a metal layer and not on a dielectric layer.

Figure 33:
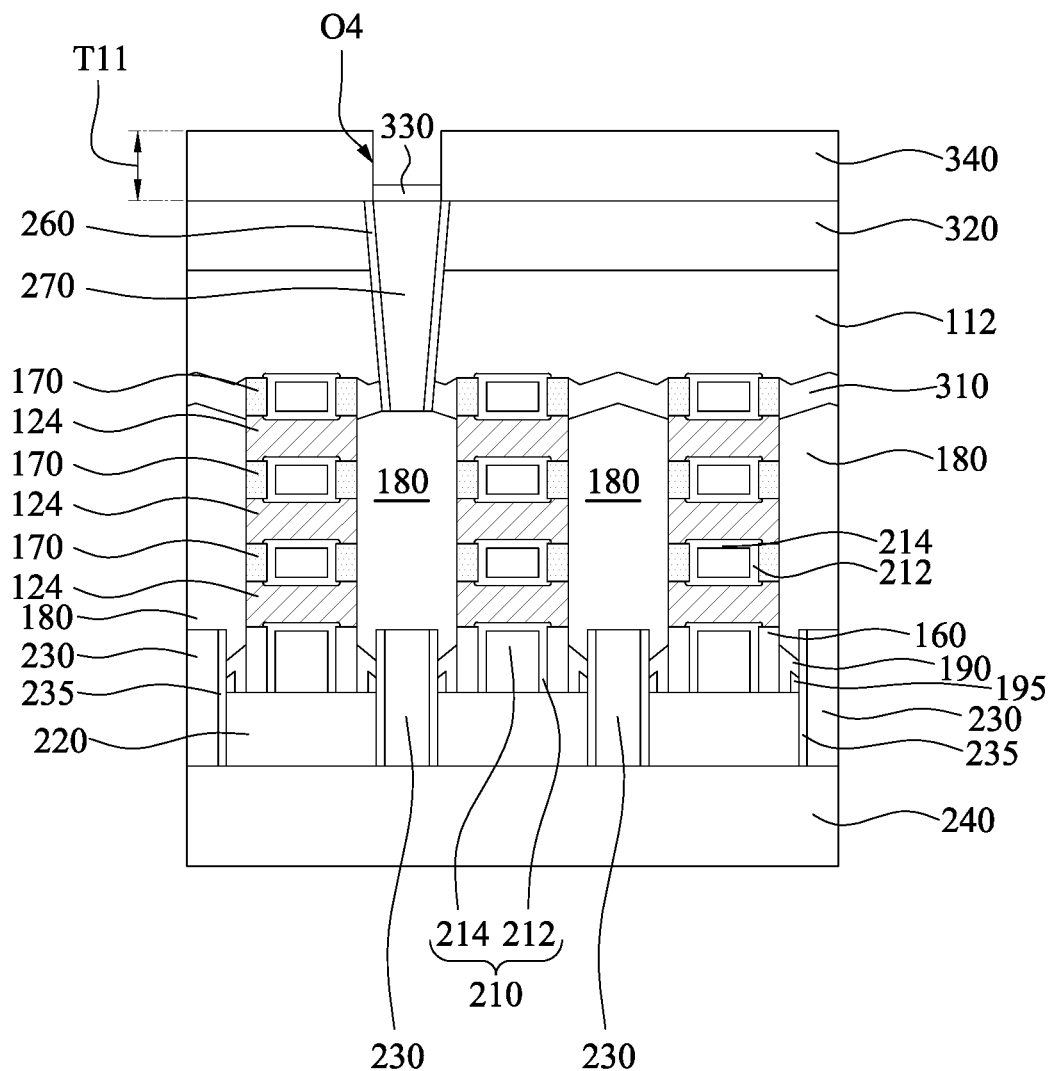

Reference is made to FIG. 33. A selectively deposition process (e.g., an ALD process) is employed to form a selectively-growth dielectric layer 340 over the dielectric materials (e.g., the MCESL 320 and the via liner layers 260). Due to the material properties, precursors of the ALD process have a tendency not to adhere to the surface of the blocking layer 330. Thus, during the ALD process, the selectively-growth dielectric layer 340 are formed over the MCESL 320 and the via liner layers 260 but leaving the top surfaces of the blocking layer 330 uncovered. That is, the selectively-growth dielectric layer 340 is in contact with the MCESL 320 and the via liner layers 260 but spaced apart from the backside via 270.

In some embodiments, the selectively-growth dielectric layer 340 is made of SiC, LaO, AlO, AlON, ZrO, HfO, SiN, Si, ZnO, ZrN, ZrAlO, TiO, TaO, YO, TaCN, ZrSiO, SiOCN, SiOC, SiCN, HfSiO, SiO, or combinations thereof. Further, a thickness T11 of the selectively-growth dielectric layer 340 is in a range from about 2 nm to about 30 nm. Also, due to the selectively deposition process, an opening O4 is formed in the selectively-growth dielectric layer 340 and exposes the blocking layer 330.

Figure 34:
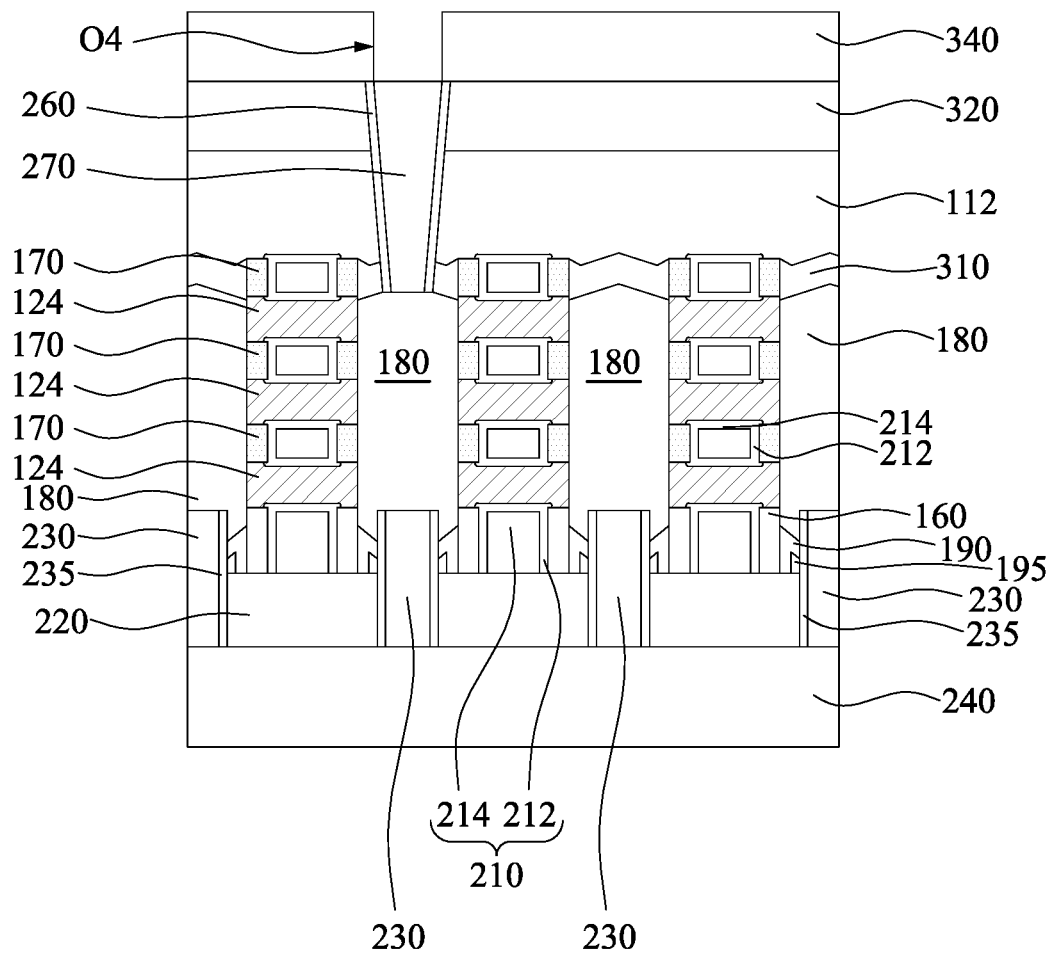

Reference is made to FIG. 34. After the formation of the selectively-growth dielectric layer 340, the blocking layer 330 (see FIG. 33) is removed from the opening O4 to expose the top surface of the backside via 270. In some embodiments, the blocking layer 330 is removed by etching (e.g., plasma dry etching, chemical etching, wet etching using high temperature sulfuric peroxide mix (SPM)), ashing, or combinations thereof.

Figure 35:
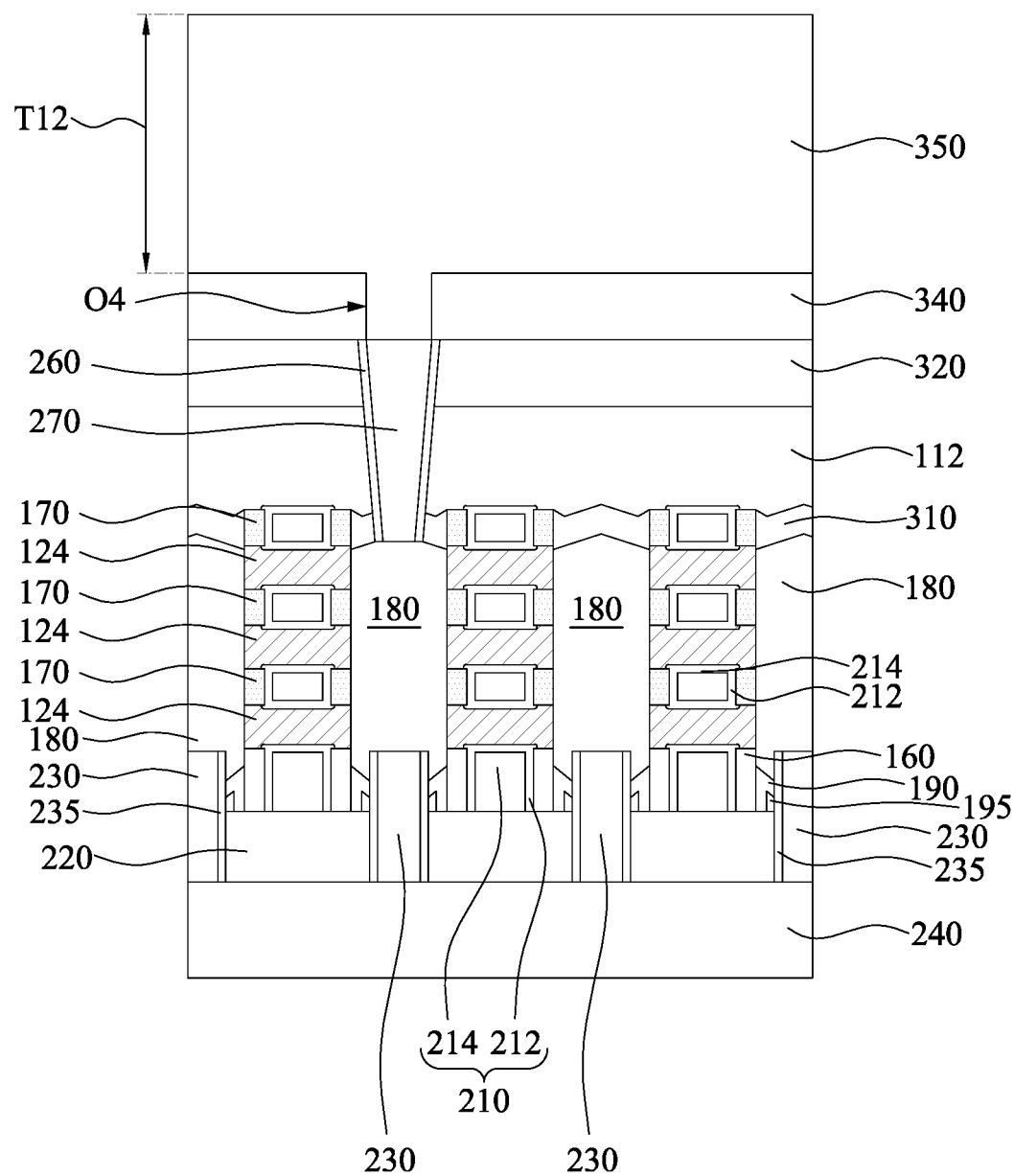

Reference is made to FIG. 35. After the removal of the blocking layer 330, a backside ILD layer 350 is formed over the selectively-growth dielectric layer 340 and fills the opening O4. In some embodiments, the backside ILD layer 350 is made of SiC, LaO, AlO, AlON, ZrO, HfO, SiN, Si, ZnO, ZrN, ZrAlO, TiO, TaO, YO, TaCN, ZrSiO, SiOCN, SiOC, SiCN, HfSiO, SiO, or combinations thereof. However, the backside ILD layer 350 and the selectively-growth dielectric layer 340 include different materials. The materials of the backside ILD layer 350 and the selectively-growth dielectric layer 340 may be chosen based on providing differing etch selectivity properties. For example, the backside ILD layer 350 is an oxygen-rich layer and the selectively-growth dielectric layer 340 is a nitrogen-rich layer, or vice versa. In some embodiments, a thickness T12 of the backside ILD layer 350 is in a range from about 5 nm to about 30 nm.

Figure 36:
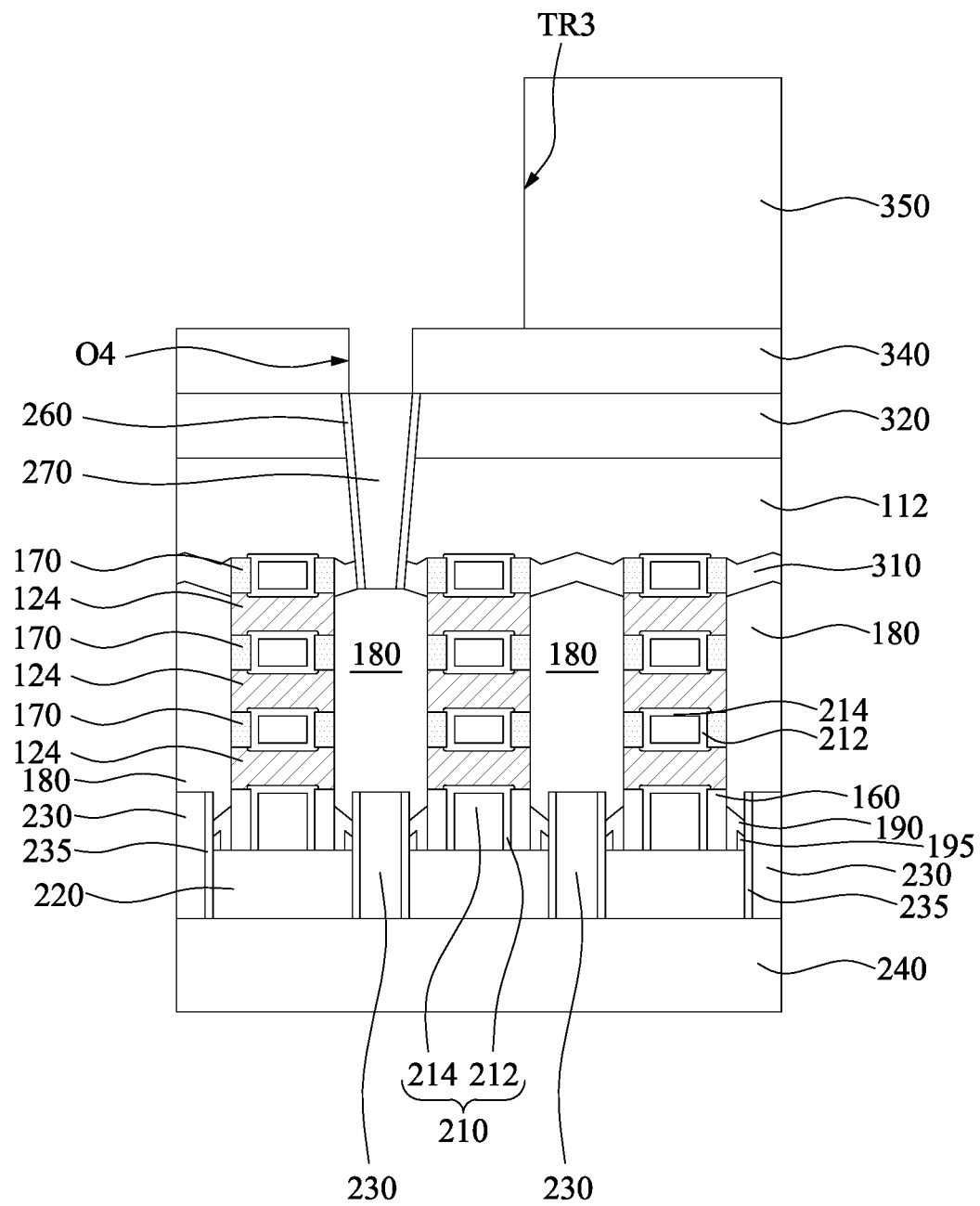

Reference is made to FIG. 36. The backside ILD layer 350 is patterned to form a trench TR3 therein. Due to the etching selectivity between the backside ILD layer 350 and the selectively-growth dielectric layer 340, a portion of the backside ILD layer 350 in the opening O4 is also removed while the selectively-growth dielectric layer 340 is not or barely etched. Therefore, the top surface of the backside via 270 is exposed by the opening O4 again.

Figure 37:
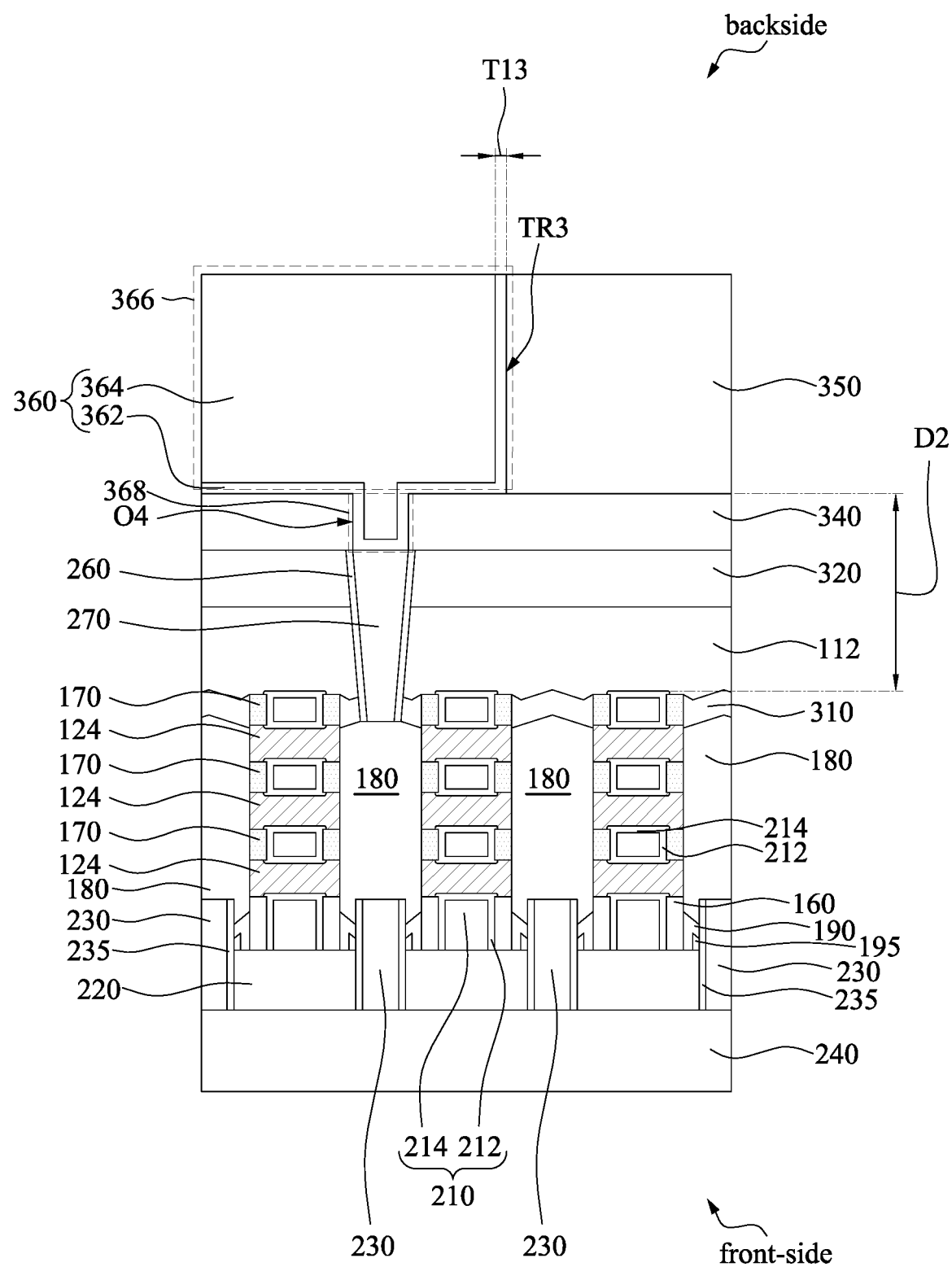

Reference is made to FIG. 37. A barrier layer 362 is conformally formed in the remained trench TR3 and the opening O4, such that the barrier layer 362 covers and is in contact with the backside via 270, the selectively-growth dielectric layer 340, and the backside ILD layer 350. In some embodiments, the barrier layer 362 is a metal-containing layer including Co, W, Ru, Al, Mo, Ti, TiN, TiSi, CoSi, NiSi, Cu, Ta, TaN, Ni, TiSiN, or combinations thereof. The barrier layer 362 may be formed using methods such as physical vapor deposition (PVD), sputtering, chemical vapor deposition (CVD), atomic layer deposition (ALD), and the like. The barrier layer 362 includes a single layer or multiple (e.g., double or triple) layers. In some embodiments, a thickness T13 of the barrier layer 362 is in a range from about 1 nm to about 10 nm. Subsequently, a conductive feature 364 is formed on the barrier layer 362 and fills in the trench TR3 and the opening O4. The conductive feature 364 is a metal-containing layer including Cu, W, Ru, Co, Al, Mo, Ti, TiN, TiSi, CoSi, NiSi, Ta, TaN, Ni, TiSiN, or combinations thereof.

In some embodiments, a barrier film and a filling material are sequentially deposited in the trench TR3 and the opening O4 and a planarization process, e.g., a chemical mechanical polishing (CMP) process, is performed after the formation of the barrier film and the filling material to remove the excess portions of the barrier film and the filling material outside the trench TR3 and the opening O4, thus forming the barrier layer 362 and the conductive feature 364 and exposing the backside ILD layer 350. The barrier layer 362 and the conductive feature 364 are together referred to as a backside conductive line 360 of a backside interconnection structure. The backside conductive line 360 may also referred to a backside MO of the backside interconnection structure.

In FIG. 37, the semiconductor device includes the semiconductor layers (channel layers) 124, the gate structures 210, the source/drain epitaxial structures 180, the backside via 270, and the backside conductive line 360. The gate structures 210 are across (or surround or warp around) the semiconductor layers 124. The source/drain epitaxial structures 180 are connected to the semiconductor layers 124. The backside via 270 is connected to some of the source/drain epitaxial structures 180. The backside conductive line 360 is electrically connected to the source/drain epitaxial structures 180 through the backside via 270.

The backside conductive line 360 includes a line portion 366 and a connecting portion 368 between the line portion 366 and the backside via 270. The connecting portion 368 is embedded in the selectively-growth dielectric layer 340, and the line portion 366 is on the selectively-growth dielectric layer 340. Since the formation of the selectively-growth dielectric layer 340, an aspect ratio of the backside via 270 can be reduced while a distance D2 between the line portion 366 and the gate structure 210 is enlarged to increase the TDDB therebetween. Also, the low aspect ratio of the backside via 270 increases the metal gap filling window and simplifies the formation process of the backside via 270.

In some embodiments, the selectively-growth dielectric layer 340 (and/or the MCESL 320) is a high-k dielectric layer, such that the TDDB between the line portion 366 and the gate structure 210 is further increased. In some embodiments, the thickness T11 of the selectively-growth dielectric layer 340 is greater than the thickness T9 of the MCESL 320 to further lower the aspect ratio of the backside via 270.

As shown in FIG. 37, the selectively-growth dielectric layer 340 is in contact with the via liner spacers 260 and is spaced apart from the backside via 270. Stated differently, the via liner spacers 260 are spaced apart from the backside conductive line 360.

It is noted that although the semiconductor devices shown above are HGAA, the concepts of the backside processes can be applied to other devices (such as FinFETs and/or planar FETs).

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the long source/drain epitaxial structure provides a long vertical distance between the backside via and the gate structure, thereby increasing the electrical isolation therebetween. Further, the etch stop layer and the ILD layer on the backside also improves the electrical isolation between the source/drain epitaxial structure and the gate structure. Another advantage is that the formation of the selectively-growth dielectric layer reduces an aspect ratio of the backside via while enlarge a distance between the backside conductive line and the gate structure to increase the TDDB therebetween.

According to some embodiments, a device includes a channel layer, a gate structure, a first source/drain epitaxial structure, a second source/drain epitaxial structure, a front-side interconnection structure, and a backside via. The gate structure is across the channel layer. The first source/drain epitaxial structure and the second source/drain epitaxial structure are on opposite sides of the gate structure and are connected to the channel layer. The front-side interconnection structure are on a front-side of the first source/drain epitaxial structure. The backside via is connected to a backside of the first source/drain epitaxial structure. A backside surface of the first source/drain epitaxial structure is at a height between a height of a backside surface of the backside via and a height of a backside surface of the gate structure.

According to some embodiments, a device includes a plurality of channel layers, a gate structure, a first source/drain epitaxial structure, a second source/drain epitaxial structure, an inner spacer, a backside via, and a substrate residue. The plurality of channel layers are arranged one above another in a spaced apart manner. The gate structure surrounds each of the plurality of channel layers. The first source/drain epitaxial structure and the second source/drain epitaxial structure are on opposite sides of the gate structure and are connected to the channel layers. The inner spacer is between the gate structure and the first source/drain epitaxial structure. The backside via is connected to the first source/drain epitaxial structure. The substrate residue is in contact with the first source/drain epitaxial structure and the inner spacer but is spaced apart from the gate structure.

According to some embodiments, a method includes forming a transistor on a front-side of a substrate; thinning the substrate from a backside of the substrate; depositing an etch stop layer over the substrate after thinning the substrate; forming a backside via in the substrate and the etch stop layer such that the backside via is connected to a source/drain epitaxial structure of the transistor; selectively depositing a dielectric layer over the etch stop layer such that the dielectric layer is in contact with the etch stop layer and spaced apart from the backside via; and forming a backside conductive line over the dielectric layer. A portion of the backside conductive line is embedded in the dielectric layer to be electrically connected to the backside via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a transistor on a front-side of a substrate;
   thinning the substrate from a backside of the substrate;
   depositing an etch stop layer over the substrate after thinning the substrate;
   forming a backside via in the substrate and the etch stop layer such that the backside via is connected to a source/drain epitaxial structure of the transistor;
   selectively depositing a dielectric layer over the etch stop layer such that the dielectric layer is in contact with the etch stop layer and spaced apart from the backside via, comprising:
      selectively depositing a blocking layer over the backside via but spaced apart from the etch stop layer;
      providing precursors to the etch stop layer and the blocking layer to form the dielectric layer; and
      removing the blocking layer after providing the precursors; and
   forming a backside conductive line over the dielectric layer, wherein a portion of the backside conductive line is embedded in the dielectric layer to be electrically connected to the backside via.

2. The method of claim 1, further comprising forming a via liner layer in contact with the substrate and the etch stop layer prior to forming the backside via.

3. The method of claim 2, wherein the dielectric layer is further in contact with the via liner layer.

4. The method of claim 1, wherein a vertical thickness of the dielectric layer is greater than a vertical thickness of the etch stop layer.

5. The method of claim 1, further comprising:
   depositing a backside interlayer dielectric (ILD) layer over the dielectric layer, wherein the backside ILD layer and the dielectric layer are made of different materials;
   patterning the backside ILD layer to form a trench exposing the dielectric layer and the backside via; and
   forming the backside conductive line in the trench.

6. The method of claim 1, wherein a vertical thickness of the etch stop layer is in a range from about 5 nm to about 20 nm.

7. A method comprising:
   forming a transistor over a substrate;
   depositing a first dielectric layer over a backside of the substrate;
   forming a backside via in the first dielectric layer and the substrate such that the backside via is electrically connected to the transistor;
   forming a second dielectric layer to cover the first dielectric layer but expose the backside via, comprising:
      forming a blocking layer to cover a backside surface of the backside via, wherein the blocking layer is spaced apart from the first dielectric layer;
      depositing the second dielectric layer to cover the first dielectric layer but not the blocking layer; and
      after depositing the second dielectric layer, removing the blocking layer;
   depositing a third dielectric layer to cover the second dielectric layer and in contact with the backside via; and
   forming a backside conductive line in the third dielectric layer and the second dielectric layer to be electrically connected to the backside via.

8. The method of claim 7, wherein the backside conductive line comprises:
   a line portion in the third dielectric layer; and
   a connecting portion in the second dielectric layer, wherein a size of the connecting portion is smaller than a size of the line portion.

9. The method of claim 8, wherein a width of the connecting portion is substantially the same as a width of the backside via.

10. The method of claim 7, wherein a dielectric constant of the second dielectric layer is higher than a dielectric constant of the third dielectric layer.

11. The method of claim 7, wherein a dielectric constant of the first dielectric layer is higher than a dielectric constant of the third dielectric layer.

12. The method of claim 7, wherein a vertical thickness of the second dielectric layer is in a range from about 2 nm to about 30 nm.

13. The method of claim 7, wherein a vertical thickness of the first dielectric layer is in a range from about 5 nm to about 20 nm.

14. A method comprising:
   forming a transistor over a front-side of a substrate;
   thinning the substrate from a backside of the substrate;
   after thinning the substrate, depositing an etch stop layer on the backside of the substrate;
   forming a backside via in the etch stop layer and the substrate and in contact with the transistor;
   forming a blocking layer to cover a backside surface of the backside via, wherein the blocking layer is spaced apart from the etch stop layer;
   depositing a high-k dielectric layer to cover the etch stop layer but not the blocking layer;
   after depositing the high-k dielectric layer, removing the blocking layer; and
   forming a backside conductive line to be in contact with the backside via and partially surrounded by the high-k dielectric layer.

15. The method of claim 14, wherein the backside conductive line comprises:
   a line portion in contact with a backside surface of the high-k dielectric layer; and
   a connecting portion embedded in the high-k dielectric layer and between the line portion and the backside via.

16. The method of claim 14, wherein the high-k dielectric layer is an oxide layer.

17. The method of claim 14, wherein the blocking layer is made of a self-assemble monolayer.

18. The method of claim 14, wherein a vertical thickness of the high-k dielectric layer is greater than a vertical thickness of the blocking layer.

19. The method of claim 14, further comprising:
forming a liner layer in the etch stop layer and the substrate prior to forming the backside via, wherein the liner layer surrounds the backside via.

20. The method of claim 14, wherein the substrate is thinned until a vertical thickness of the substrate is in a range from about 10 nm to about 50 nm.

* * * * *